(12) United States Patent
Tu et al.

(10) Patent No.: US 11,955,384 B2
(45) Date of Patent: Apr. 9, 2024

(54) STACKED SEMICONDUCTOR DEVICE WITH NANOSTRUCTURE CHANNELS AND MANUFACTURING METHOD THEREOF

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Chien-Te Tu, Taipei (TW); Hsin-Cheng Lin, Taipei (TW); Chee-Wee Liu, Taipei (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 17/673,890

(22) Filed: Feb. 17, 2022

(65) Prior Publication Data

US 2023/0260842 A1 Aug. 17, 2023

(51) Int. Cl.
*H01L 21/822* (2006.01)
*H01L 21/761* (2006.01)
(Continued)

(52) U.S. Cl.
CPC ........ *H01L 21/8221* (2013.01); *H01L 21/761* (2013.01); *H01L 21/823807* (2013.01);
(Continued)

(58) Field of Classification Search
CPC ......... H01L 21/8221; H01L 21/823807; H01L 21/823814; H01L 21/823828;
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

CN 113130489 A * 7/2021

OTHER PUBLICATIONS

Fenouillet-Beranger et al., "3D sequential integration: Opportunities, Breakthrough and Challenges", (CEA-LETI), 2020 IEDM short course, Total 80 pages.
(Continued)

*Primary Examiner* — Robert G Bachner
*Assistant Examiner* — Molly K Reida
(74) *Attorney, Agent, or Firm* — Birch, Stewart, Kolasch & Birch, LLP

(57) ABSTRACT

A device includes a bottom transistor, a top transistor, and an epitaxial isolation structure. The bottom transistor includes a first channel layer, first source/drain epitaxial structures, and a first gate structure. The first source/drain epitaxial structures are on opposite sides of the first channel layer. The first gate structure is around the first channel layer. The top transistor is over the bottom transistor and includes a second channel layer, second source/drain epitaxial structures, and a second gate structure. The second source/drain epitaxial structures are on opposite sides of the second channel layer. The second gate structure is around the second channel layer. The epitaxial isolation structure is between and in contact with one of the first source/drain epitaxial structures and one of the second source/drain epitaxial structures, such that the one of the first source/drain epitaxial structures is electrically isolated from the one of the second source/drain epitaxial structures.

20 Claims, 49 Drawing Sheets

(51) Int. Cl.
*H01L 21/8238* (2006.01)
*H01L 27/06* (2006.01)
*H01L 27/092* (2006.01)
*H01L 27/12* (2006.01)
*H01L 29/06* (2006.01)
*H01L 29/423* (2006.01)
*H01L 29/66* (2006.01)
*H01L 29/78* (2006.01)

(52) U.S. Cl.
CPC ........ *H01L 21/823814* (2013.01); *H01L 21/823828* (2013.01); *H01L 21/823878* (2013.01); *H01L 27/0688* (2013.01); *H01L 27/0922* (2013.01); *H01L 27/1207* (2013.01); *H01L 29/0673* (2013.01); *H01L 29/42392* (2013.01); *H01L 29/66439* (2013.01); *H01L 29/66545* (2013.01); *H01L 29/66787* (2013.01); *H01L 29/7848* (2013.01)

(58) Field of Classification Search
CPC ......... H01L 21/823878; H01L 27/0688; H01L 27/0922; H01L 29/0673; H01L 29/42392; H01L 29/66545; H01L 29/66787
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |

OTHER PUBLICATIONS

Huang et al., "3-D Self-aligned Stacked NMOS-on-PMOS Nanoribbon Transistors for Continued Moore's Law Scaling", 2020 IEEE International Electron Devices Meeting (IEDM), 2020, pp. 425-428. Total 6 pages.

Rachmady et al., "300mm Heterogeneous 3D Integration of Record Performance Layer Transfer Germanium PMOS with Silicon NMOS for Low Power High Performance Logic Applications", 2019 IEEE International Electron Devices Meeting (IEDM), pp. 697-700. Total 6 pages.

Subramanian et al., "First Monolithic Integration of 3D Complementary FET (CFET) on 300mm Wafers", 2020 IEEE Symposium on VLSI Technology, 2020, pp. 1-2. Total 4 pages.

* cited by examiner

P

STACKED SEMICONDUCTOR DEVICE WITH NANOSTRUCTURE CHANNELS AND MANUFACTURING METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process can increase production efficiency and lower associated costs. Such scaling down has also increased the complexity of processing and manufacturing ICs and, for these advancements to be realized, similar developments in IC processing and manufacturing are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
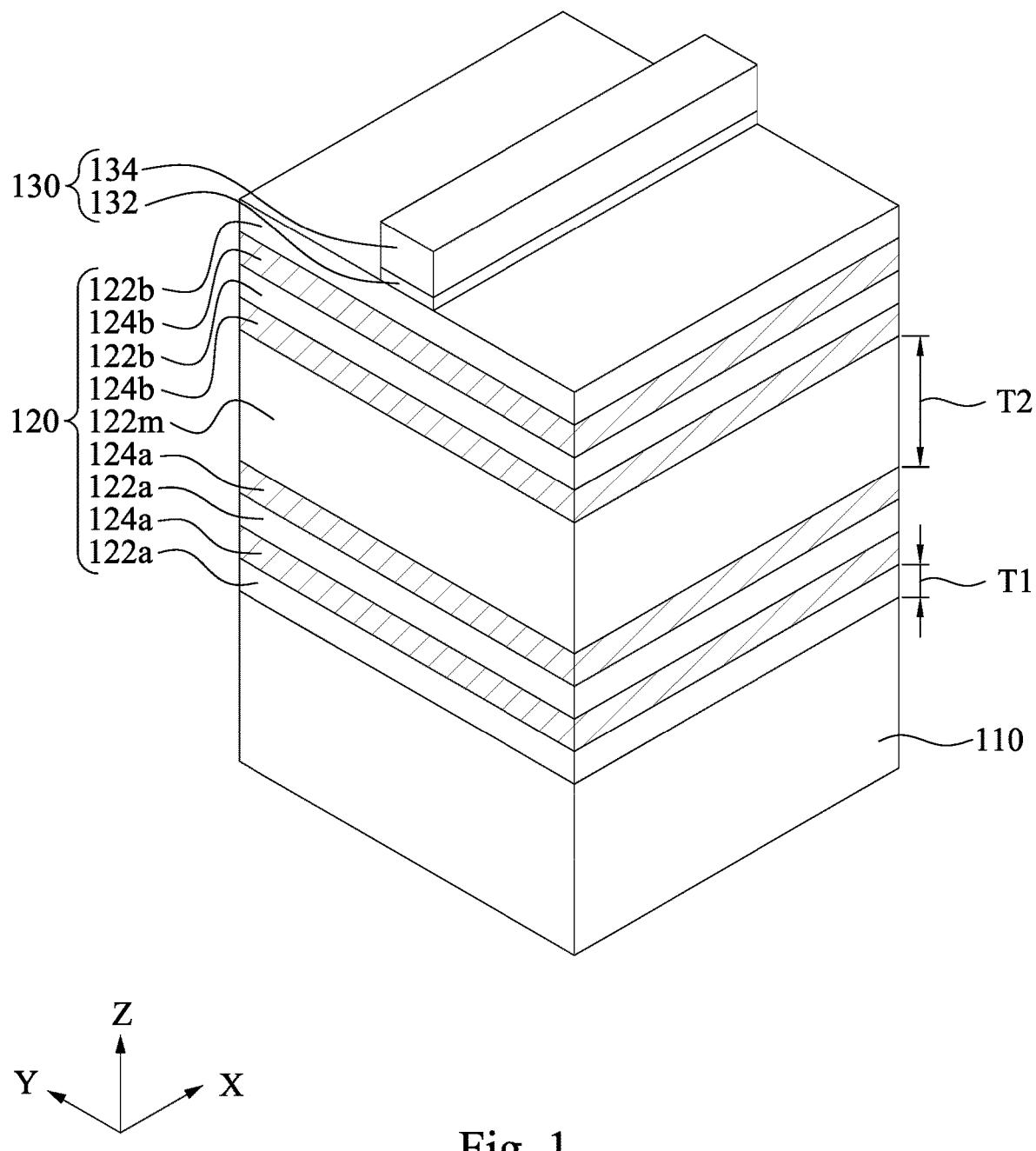
FIGS. 1-17B illustrate perspective views and cross-sectional views of intermediate stages in the formation of an integrated circuit structure (or a semiconductor device) in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

As used herein, the term "etch selectivity" refers to the ratio of the etch rates of two different materials under the same etching conditions. As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9). As used herein, the term "low-k" refers to a low dielectric constant. In the field of semiconductor device structures and manufacturing processes, low-k refers to a dielectric constant that is less than the dielectric constant of $SiO_2$ (e.g., less than 3.9). As used herein, the term "p-type" defines a structure, layer, and/or region as being doped with p-type dopants, such as boron. As used herein, the term "n-type" defines a structure, layer, and/or region as being doped with n-type dopants, such as phosphorus. As used herein, the term "conductive" refers to an electrically conductive structure, layer, and/or region.

The nanostructure transistor (e.g., gate all around (GAA) transistor) structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit structures and methods of forming the same. More particularly, some embodiments of the present disclosure are related to complementary FET (CFET) devices including an epitaxial stack as an isolation structure between source/drain epitaxial structures of the CFET. The epitaxial stack is configured to improve the current leakage problem of the source/drain epitaxial structures.

FIGS. 1-17B illustrate perspective views and cross-sectional views of intermediate stages in the formation of an integrated circuit structure (or a semiconductor device) 100a in accordance with some embodiments of the present disclosure. In some embodiments, the semiconductor device in FIGS. 17A and 17B is a CFET device. In addition to the integrated circuit structure, FIGS. 1-7A, 8A, 9A, 10A, 11A, 12A, 13A, 14A, 15A, 16A, and 17A depict X-axis, Y-axis, and Z-axis directions. The formed devices include a p-type transistor (such as a p-type GAA FET) and an n-type transistor (such as an n-type FAA FET) in accordance with some exemplary embodiments. Throughout the various views and illustrative embodiments, like reference numbers are used to designate like elements. It is understood that additional operations can be provided before, during, and after the processes shown by FIGS. 1-17B, and some of the operations described below can be replaced or eliminated, for additional embodiments of the method. The order of the operations/processes may be interchangeable.

Referring to FIG. 1, an epitaxial stack 120 is formed over a substrate 110. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method.

The epitaxial stack 120 includes epitaxial layers 122a, 122b, 122m of a first composition interposed by epitaxial layers 124a, 124b of a second composition. The first and second compositions can be different. In some embodiments, the epitaxial layers 122a, 122b, 122m are SiGe and the epitaxial layers 124a, 124b are silicon (Si). However, other embodiments are possible including those that provide for a first composition and a second composition having different etch selectivity.

The epitaxial layers 124a and 124b or portions thereof may form nanostructure channel(s) of the nanostructure transistor. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. For example, the nanostructures are nanosheets, nanowires, nanoslabs, or nanorings, depending on their geometry. The use of the epitaxial layers 124a and 124b to define a channel or channels of a device is further discussed below.

In FIG. 1, the epitaxial layers 124b are disposed above the epitaxial layers 124a. It is noted that two layers of the epitaxial layers 124a and two layers of the epitaxial layers 124b are arranged as illustrated in FIG. 1, which is for illustrative purposes only and not intended to be limiting beyond what is specifically recited in the claims. It can be appreciated that any number of epitaxial layers can be formed in the epitaxial stack 120; the number of layers depending on the desired number of channels regions for the transistor. In some embodiments, the number of each of the epitaxial layers 124a and 124b is between 2 and 10.

The epitaxial layers 122a are interposed by the epitaxial layers 124a, the epitaxial layers 122b are interposed by the epitaxial layers 124b, and the epitaxial layer 122m is between the epitaxial layers 124a and 124b. In some embodiments, the epitaxial layers 122a and 122b have substantially the same thickness T1, and the epitaxial layer 122m has a thickness T2 greater than the thickness T1. In some embodiments, the thickness T2 is determined by the thickness of the epitaxial isolation structure 190 (see FIGS. 13A and 13B) and is in a range of about 20 nm to about 1000 nm. For example, the thickness T2 is greater than 4 times of the thickness T1.

As described in more detail below, the epitaxial layers 124a and 124b may serve as channel region(s) for a subsequently-formed semiconductor device and the thickness is chosen based on device performance considerations. The epitaxial layers 122a, 122b, and 122m in channel regions(s) may eventually be removed and serve to define a vertical distance between adjacent channel region(s) for a subsequently-formed multi-gate device and the thickness is chosen based on device performance considerations. Accordingly, the epitaxial layers 122a, 122b, and 122m may also be referred to as sacrificial layers, and epitaxial layers 124a and 124b may also be referred to as channel layers.

By way of example, epitaxial growth of the layers of the epitaxial stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 124a and 124b include the same material as the substrate 110. In some embodiments, the epitaxial layers 122a, 122b, 122m and 124a, 124b include a different material than the substrate 110. As stated above, in at least some examples, the epitaxial layers 122a, 122b, and 122m include an epitaxially grown silicon germanium (SiGe) layer and the epitaxial layers 124a and 124b include an epitaxially grown silicon (Si) layer. Alternatively, in some embodiments, either of the epitaxial layers 122a, 122b, 122m and 124a, 124b may include other materials such as germanium, tin, a compound semiconductor such as silicon carbide, gallium arsenide, gallium phosphide, indium phosphide, indium arsenide, and/or indium antimonide, an alloy semiconductor such as SiGe, GeSn, GaAsP, AlInAs, AlGaAs, InGaAs, GaInP, and/or GaInAsP, or combinations thereof. As discussed, the materials of the epitaxial layers 122a, 122b, 122m and 124a, 124b may be chosen based on providing differing oxidation and/or etching selectivity properties.

Figure 2:
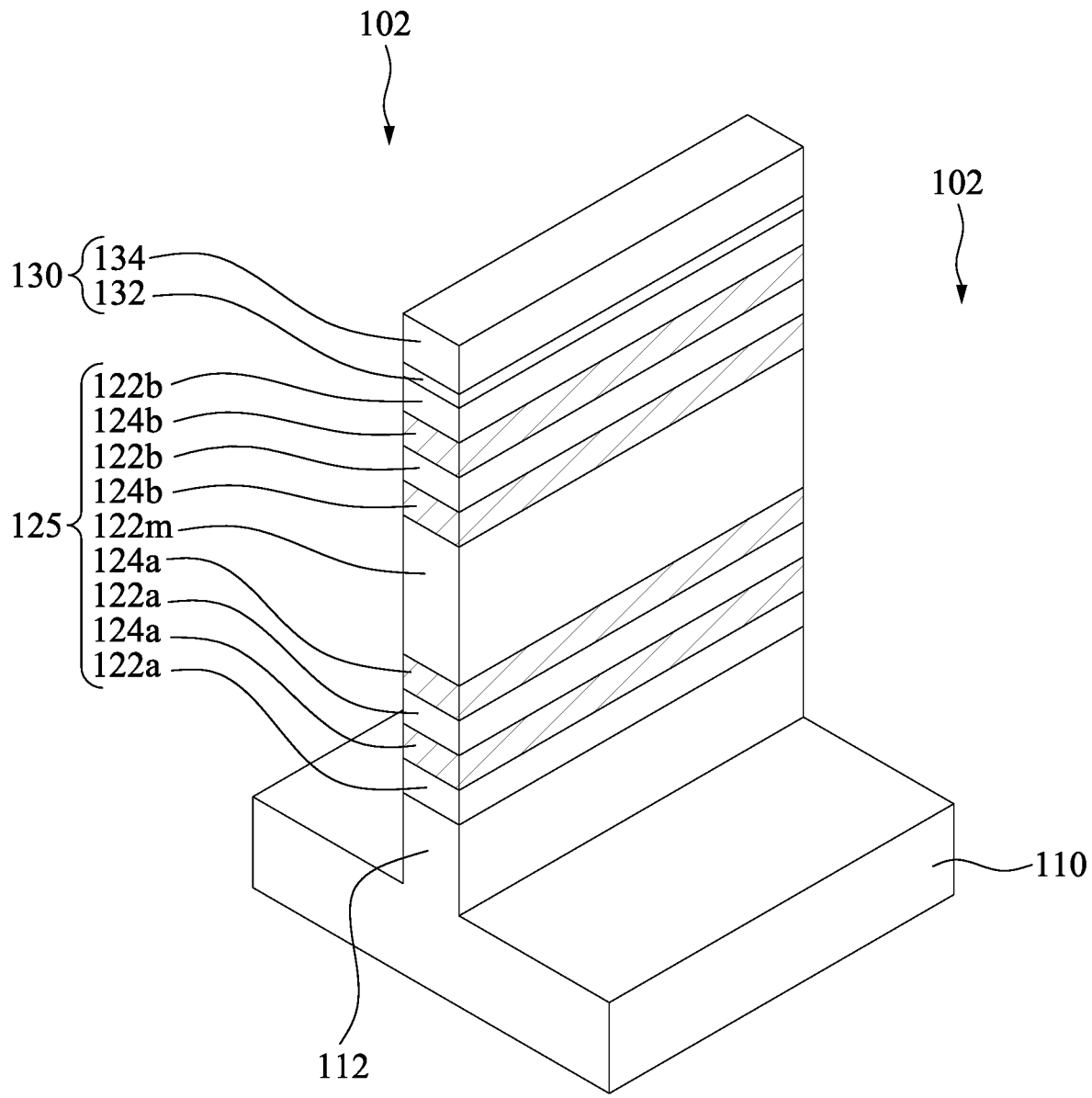

Referring to FIG. 2, at least one fin structure 125 extending from the substrate 110 is formed. In various embodiments, the fin structure 125 includes a protruding portion 112 formed from the substrate 110 and portions of each of the epitaxial layers of the epitaxial stack including epitaxial layers 122a, 122b, 122m and 124a, 124b. The fin structure 125 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structure 125 by etching the epitaxial stack 120. The etching process can include dry etching, wet etching, reactive ion etching (RIE), and/or other suitable processes.

In the illustrated embodiment as illustrated in FIGS. 1 and 2, a hard mask (HM) layer 130 is formed over the epitaxial stack 120 prior to patterning the fin structure 125. In some embodiments, the HM layer 130 includes an oxide layer 132 (e.g., a pad oxide layer that may include $SiO_2$) and a nitride layer 134 (e.g., a pad nitride layer that may include $Si_3N_4$) formed over the oxide layer 132. The oxide layer 132 may act as an adhesion layer between the epitaxial stack 120 and the nitride layer 134 and may act as an etch stop layer for etching the nitride layer 134. In some examples, the oxide layer 132 includes thermally grown oxide, chemical vapor deposition (CVD)-deposited oxide, and/or atomic layer deposition (ALD)-deposited oxide. In some embodiments, the nitride layer 134 is deposited on the oxide layer 132 by CVD and/or other suitable techniques.

The fin structure 125 may subsequently be fabricated using suitable processes including photolithography and etch processes. The photolithography process may include forming a photoresist layer (not shown) over the HM layer 130, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process using light in EUV region, having a wavelength of, for example, about 1-200 nm. The patterned mask may then be used to protect regions of the substrate 110, and layers formed thereupon, while an etch process forms trenches 102 in unprotected regions through the HM layer 130, through the epitaxial stack 120, and into the substrate 110, thereby leaving the fin structure 125. The trenches 102 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the fin structure 125.

Figure 3:
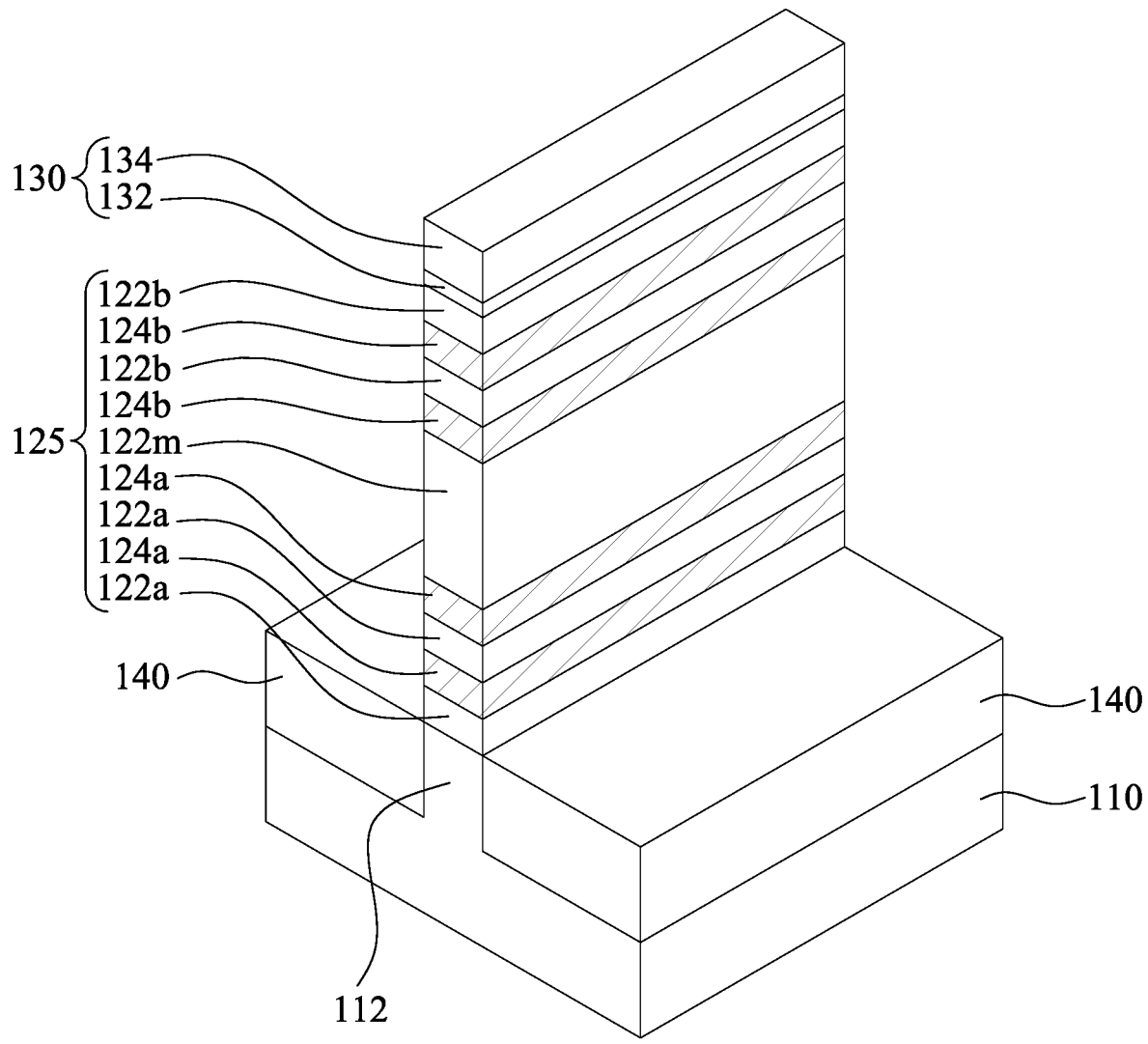

Next, as illustrated in FIG. 3, isolation structures 140 are formed to surround the fin structure 125. The isolation structures 140 may include a liner oxide (not shown). The liner oxide may be formed of a thermal oxide formed through a thermal oxidation of a surface layer of the substrate 110. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). The isolation structures 140 may also include a dielectric material over the liner oxide, and the dielectric material may be formed using flowable chemical vapor deposition (FCVD), spin-on coating, or the like.

The isolation structures 140 are then recessed, so that the top portion of the fin structure 125 protrudes higher than the top surfaces of the neighboring isolation structures 140. The etching may be performed using a dry etching process, wherein $NH_3$ and $NF_3$ are used as the etching gases. During the etching process, plasma may be generated. Argon may also be included. In accordance with alternative embodiments of the present disclosure, the recessing of the isolation structures 140 is performed using a wet etch process. The etching chemical may include diluted HF, for example.

Figure 4:
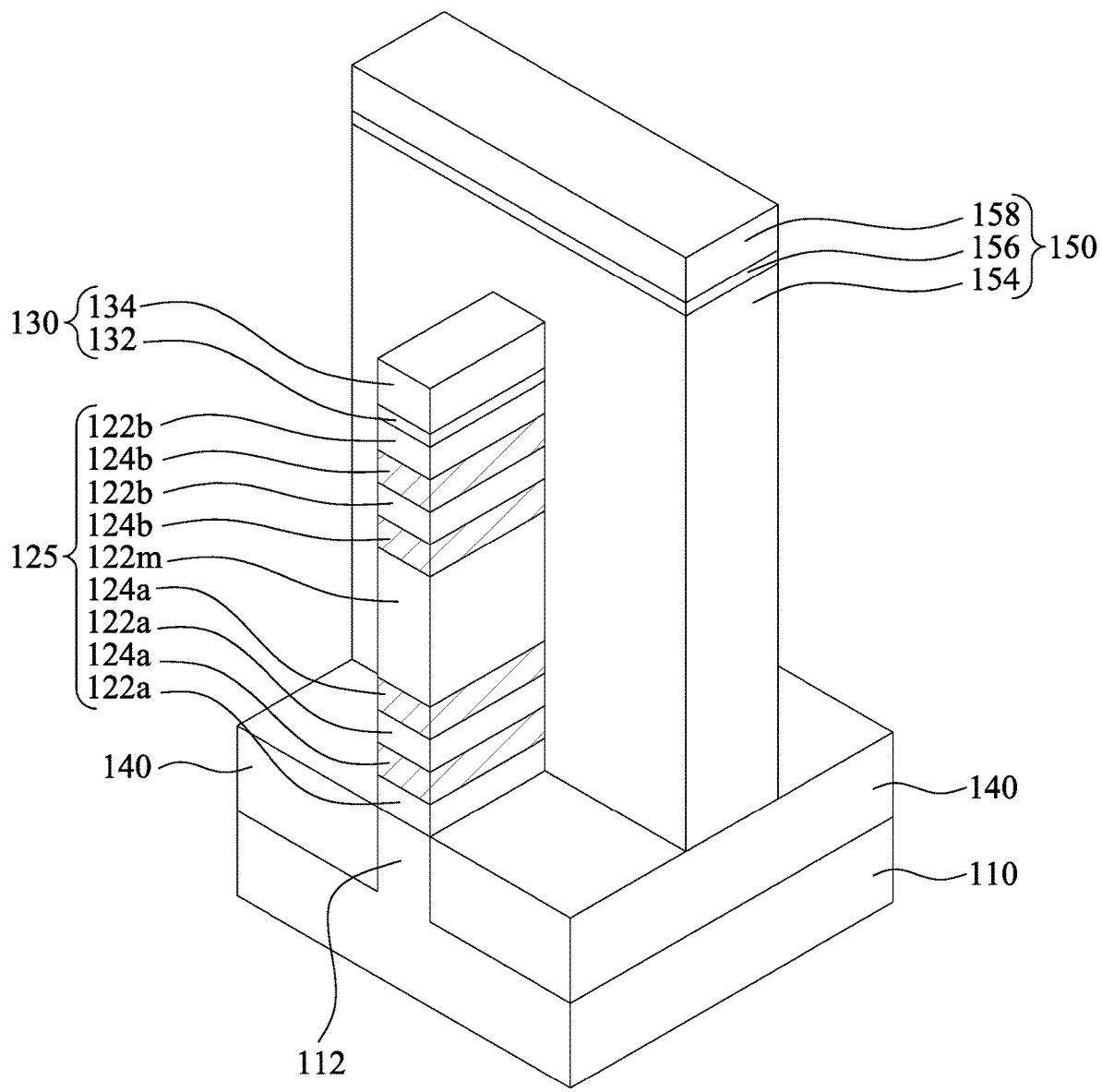

Reference is made to FIG. 4. At least one dummy gate structure 150 is formed over the substrate 110 and is partially disposed over the fin structure 125. The portion of the fin structure 125 underlying the dummy gate structure 150 may be referred to as the channel region. The dummy gate structure 150 may also define source/drain regions S/D (labeled in FIG. 7B) of the fin structure 125, for example, the regions of the fin structure 125 adjacent and on opposing sides of the channel region.

Dummy gate formation operation forms a dummy gate electrode layer and a hard mask which may include multiple layers (e.g., an oxide layer and a nitride layer) over the dummy gate electrode layer. The hard mask is then patterned, followed by patterning the dummy gate electrode layer by using the patterned hard mask as an etch mask. The etch process may include a wet etch, a dry etch, and/or combinations thereof. As such, a dummy gate structure 150 including a dummy gate electrode layer 154 and a hard mask (e.g., an oxide layer 156 and a nitride layer 158) is formed.

Figure 5:
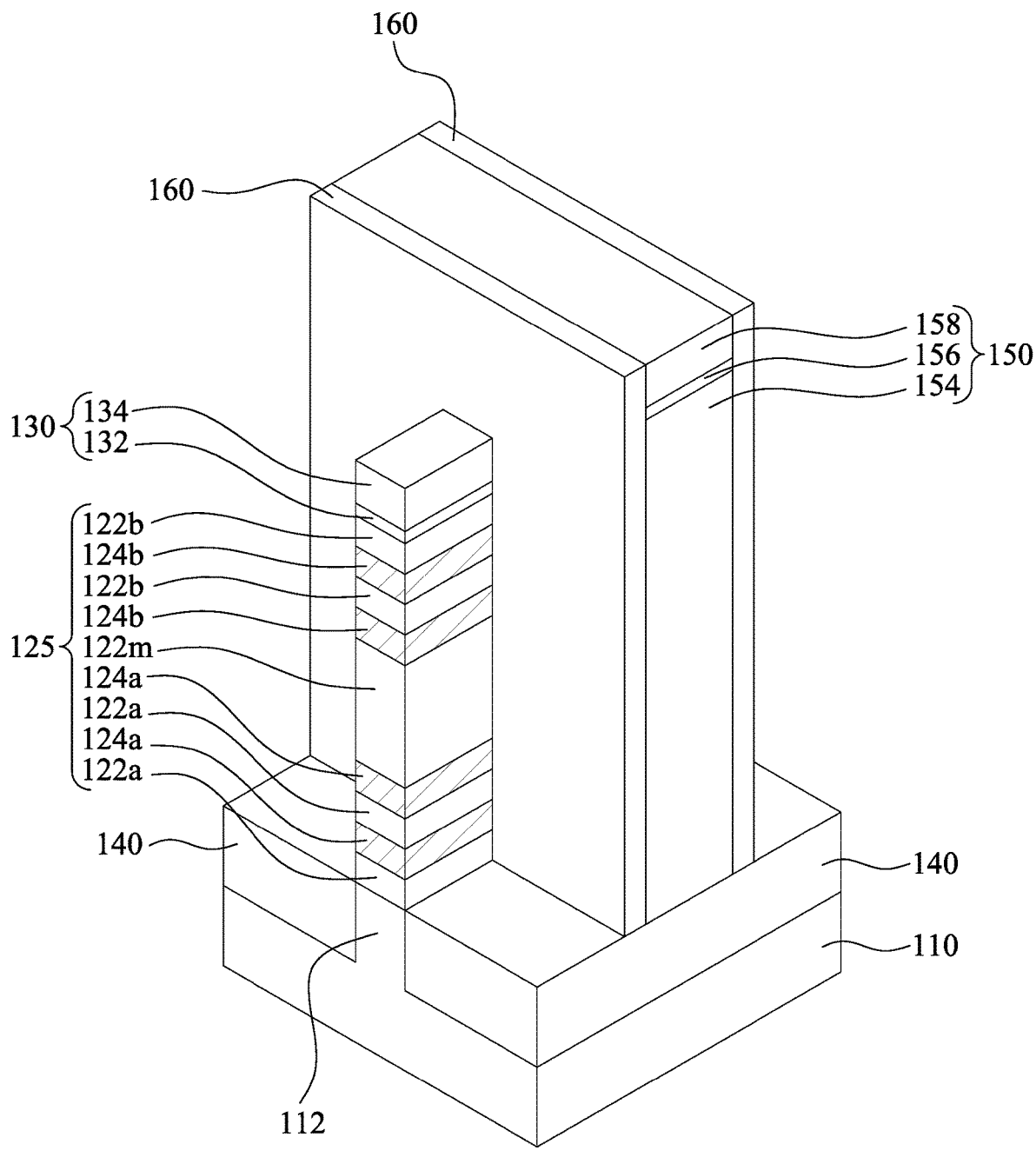

After formation of the dummy gate structure 150 is completed, gate spacers 160 are formed on sidewalls of the dummy gate structure 150 as shown in FIG. 5. For example, a spacer material layer is deposited on the substrate 110. The spacer material layer may be a conformal layer that is subsequently etched back to form gate sidewall spacers. In the illustrated embodiment, a spacer material layer is disposed conformally on top and sidewalls of the dummy gate structure 150. The spacer material layer may include a dielectric material such as silicon oxide, silicon nitride, silicon carbide, silicon oxynitride, SiCN films, silicon oxycarbide, SiOCN films, and/or combinations thereof. In some embodiments, the spacer material layer includes multiple layers, such as a first spacer layer and a second spacer layer formed over the first spacer layer. By way of example, the spacer material layer may be formed by depositing a dielectric material over the dummy gate structure 150 using suitable deposition processes. An anisotropic etching process is then performed on the deposited spacer material layer to expose portions of the HM layer 130 not covered by the dummy gate structure 150 (e.g., over the source/drain regions of the fin structure 125). Portions of the spacer material layer directly above the dummy gate structure 150 may be completely removed by this anisotropic etching process. Portions of the spacer material layer on sidewalls of the dummy gate structure 150 may remain, forming gate sidewall spacers, which are denoted as the gate spacers 160, for the sake of simplicity.

Figure 6:
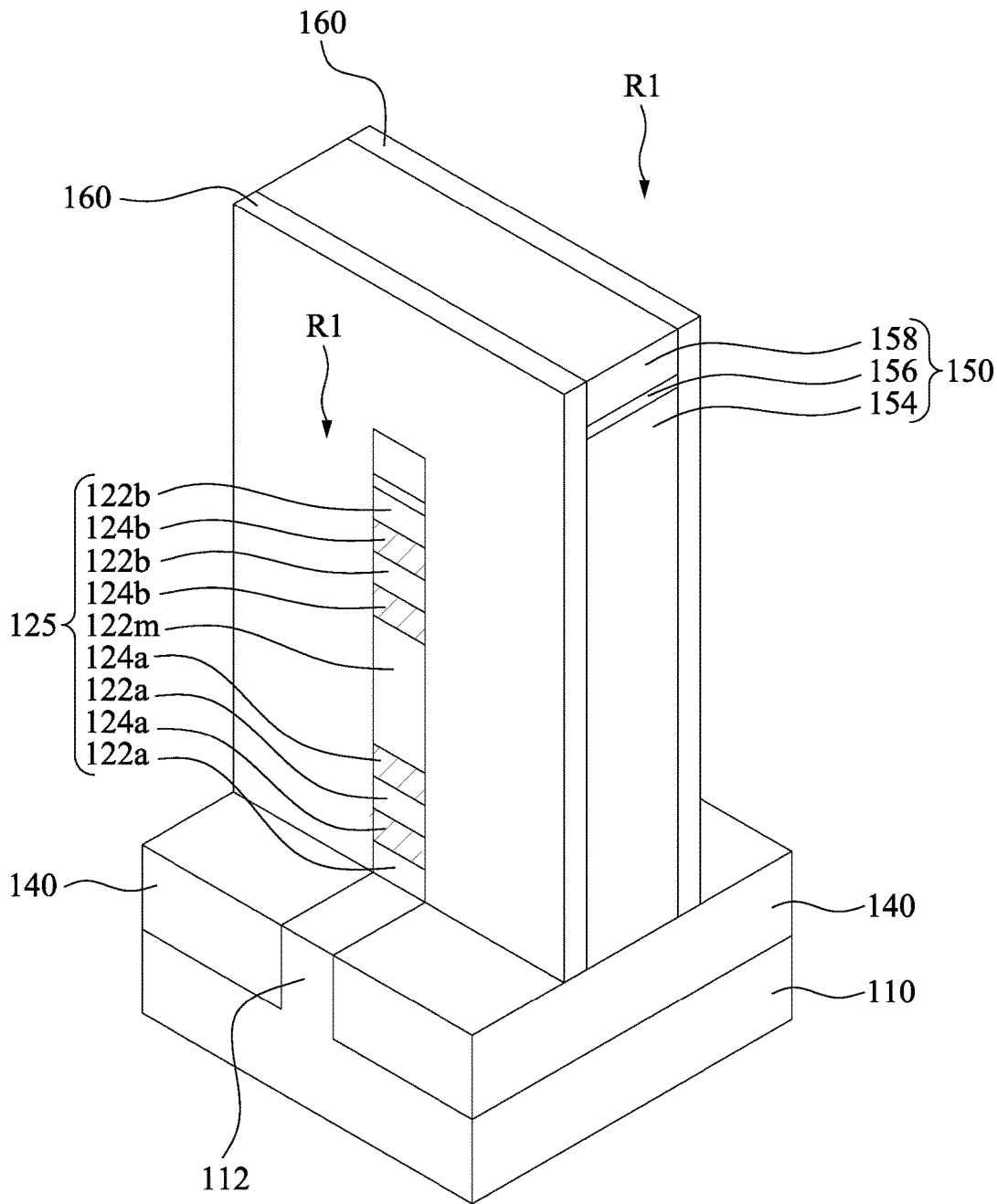

Next, as illustrated in FIG. 6, exposed portions of the HM layer 130 and the fin structure 125 that extend laterally beyond the gate spacers 160 (e.g., in source/drain regions S/D of the fin structure 125) are etched by using, for example, an anisotropic etching process that uses the dummy gate structure 150 and the gate spacers 160 as an etch mask, resulting in recesses R1 into the fin structure 125. After the anisotropic etching, end surfaces of the HM layer 130, the epitaxial layers 122a, 122b, 122m, and the epitaxial layers 124a, 124b and respective outermost sidewalls of the gate spacers 160 are substantially coterminous, due to the anisotropic etching. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 7A:
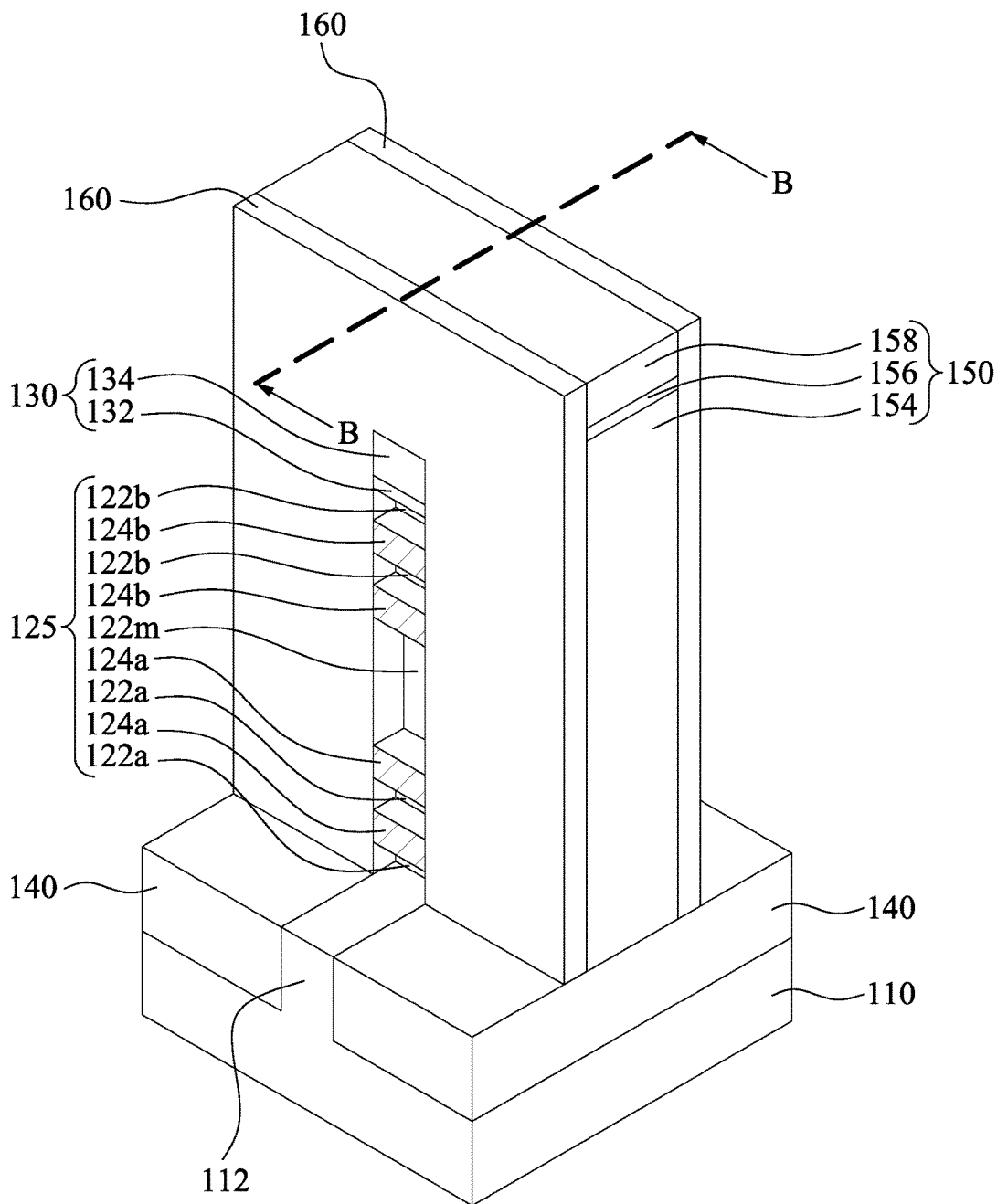
Figure 7B:
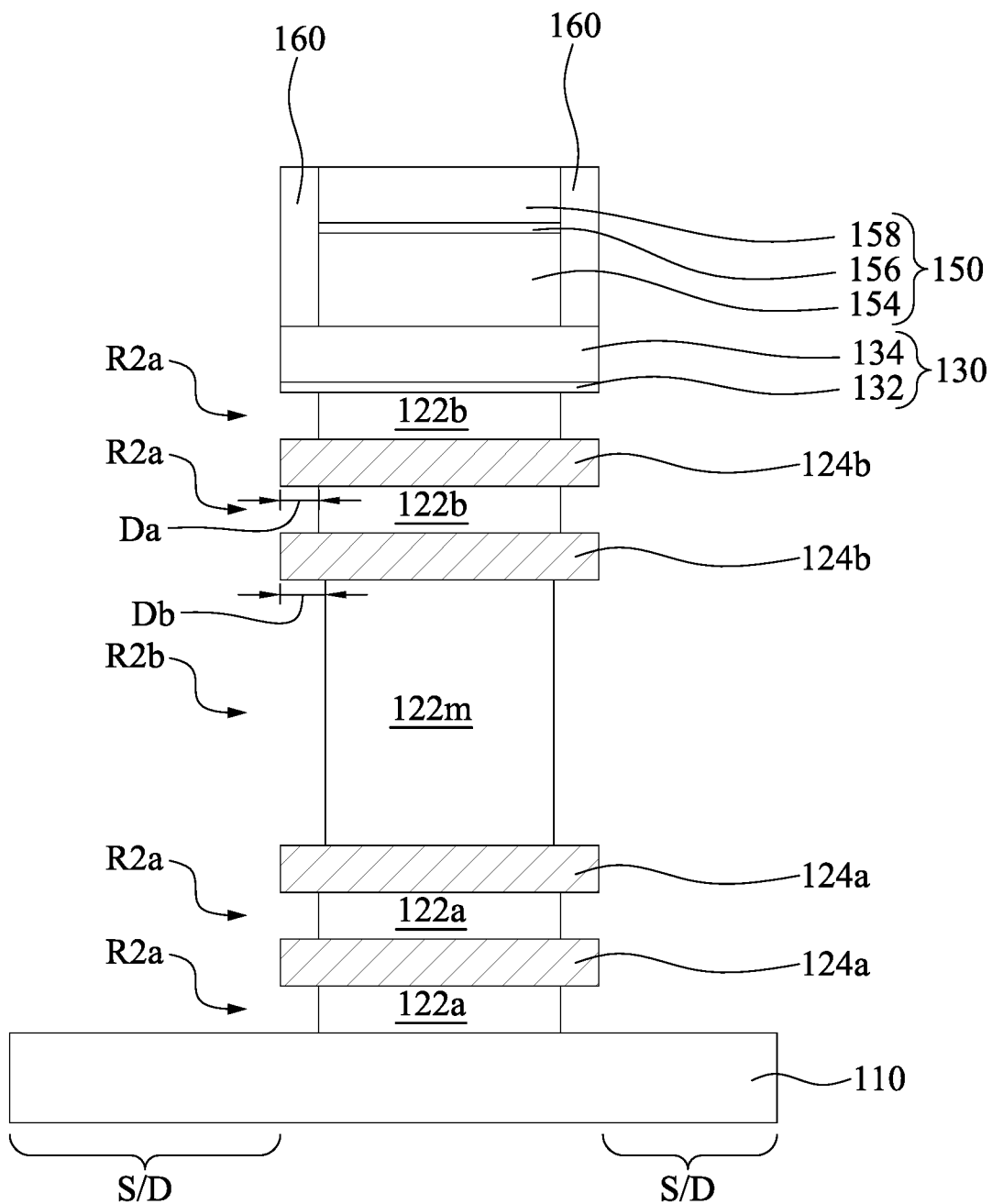

Reference is made to FIGS. 7A and 7B, where FIG. 7B is a cross-sectional view taken along line B-B of FIG. 7A. The epitaxial layers 122a, 122b, and 122m are laterally or horizontally recessed by using suitable etch techniques, resulting in lateral recesses R2a and R2b each vertically between corresponding epitaxial layers 124a and 124b. This operation may be performed by using a selective etching process. By way of example and not limitation, the epitaxial layers 122a, 122b, and 122m are SiGe and the epitaxial layers 124a and 124b are silicon allowing for the selective etching of the epitaxial layers 122a, 122b, and 122m. In some embodiments, the selective dry etching etches SiGe at a faster etch rate than it etches Si. As a result, the epitaxial layers 124a and 124b laterally extend past opposite end surfaces of the epitaxial layers 122a, 122b, and 122m. In some embodiments, since the epitaxial layer 122m is thicker than each of the epitaxial layers 122a and 122b, a depth Db of each of the recesses R2b is deeper than a depth Da of each of the recesses R2a.

Figure 8A:
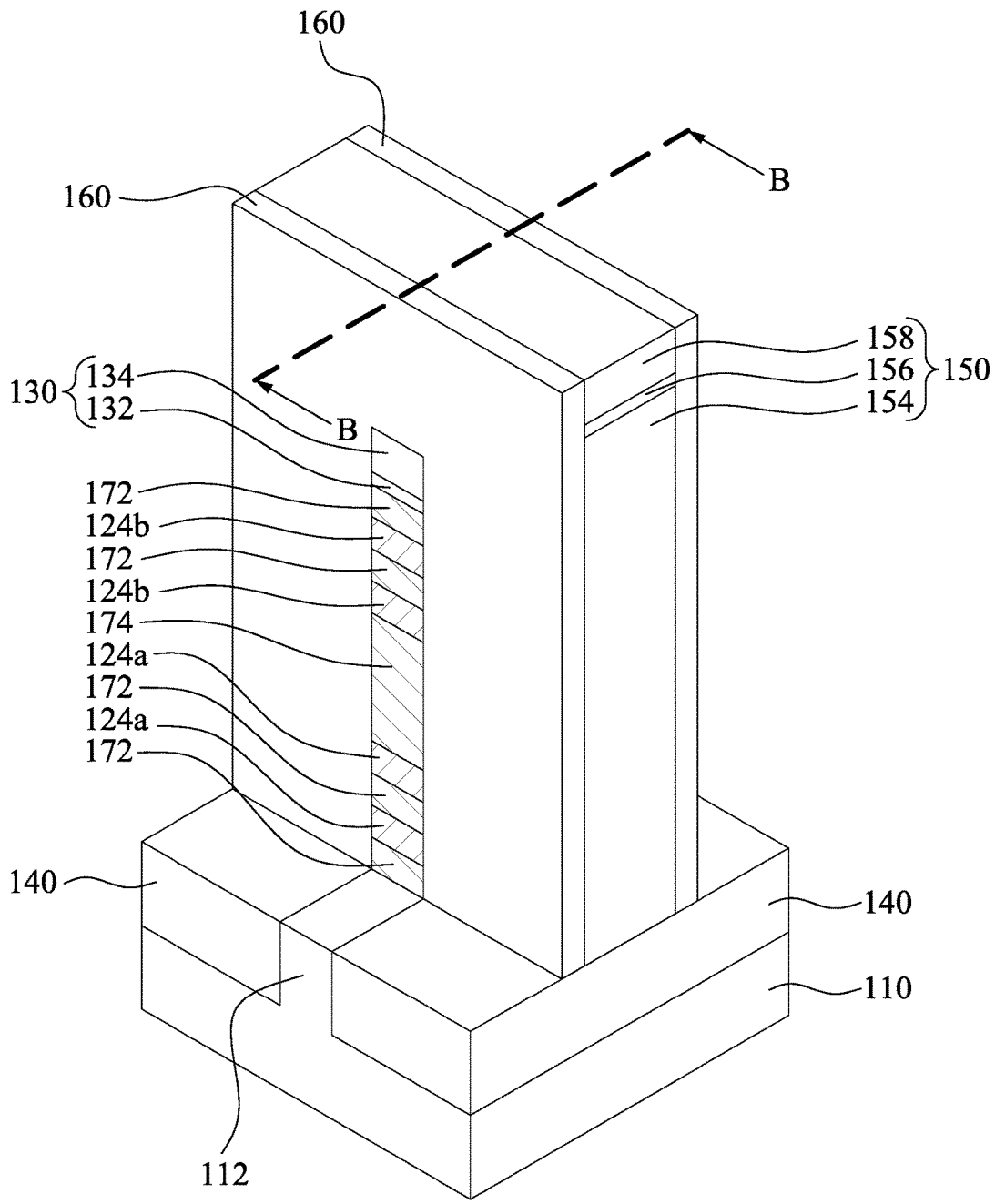
Figure 8B:
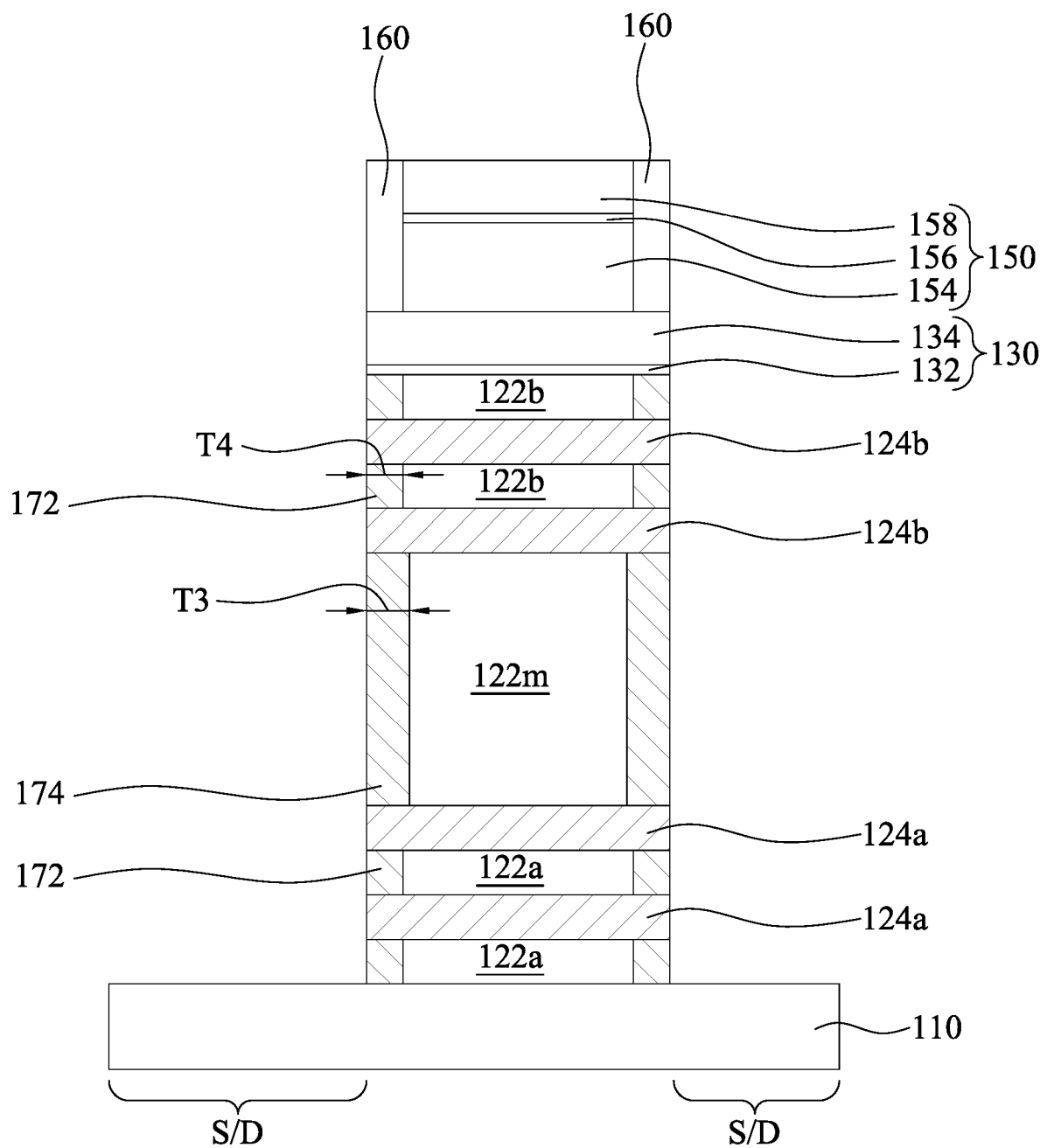

Reference is made to FIGS. 8A and 8B, where FIG. 8B is a cross-sectional view taken along line B-B of FIG. 8A. Inner dielectric spacers 172 and 174 are filled in the recesses R2a and R2b (see FIG. 7B), respectively. For example, spacer material layers are formed to fill the recesses R2a and R2b left by the lateral etching of the epitaxial layers 122a, 122b, and 122m discussed above with reference to FIGS. 7A and 7B. The spacer material layer may be a low-k dielectric material, such as $SiO_2$, SiN, SiC, SiON, SiCN, or SiOCN, and may be formed by a suitable deposition method, such as ALD. In some embodiments, the spacer material layer is intrinsic or un-doped with impurities. The spacer material layer can be formed using CVD, including LPCVD and PECVD, PVD, ALD, or other suitable processes.

After the deposition of the spacer material layer, an anisotropic etching process may be performed to trim the deposited spacer material layer, such that portions of the deposited spacer material layer that fill the recesses R2a and R2b left by the lateral etching of the epitaxial layers 122a, 122b, and 122m are left. After the trimming process, the remaining portions of the deposited spacer material are denoted as inner dielectric spacers 172 in the recesses R2a and inner dielectric spacers 174 in the recesses R2b, for the sake of simplicity. The inner dielectric spacers 172 and 174 serve to isolate metal gates from source/drain epitaxial structures formed in subsequent processing. As mentioned above, since the recess R2b is deeper than the recess R2a, a thickness T3 of the inner dielectric spacer 174 is greater than a thickness T4 of the inner dielectric spacer 172.

Figure 9A:
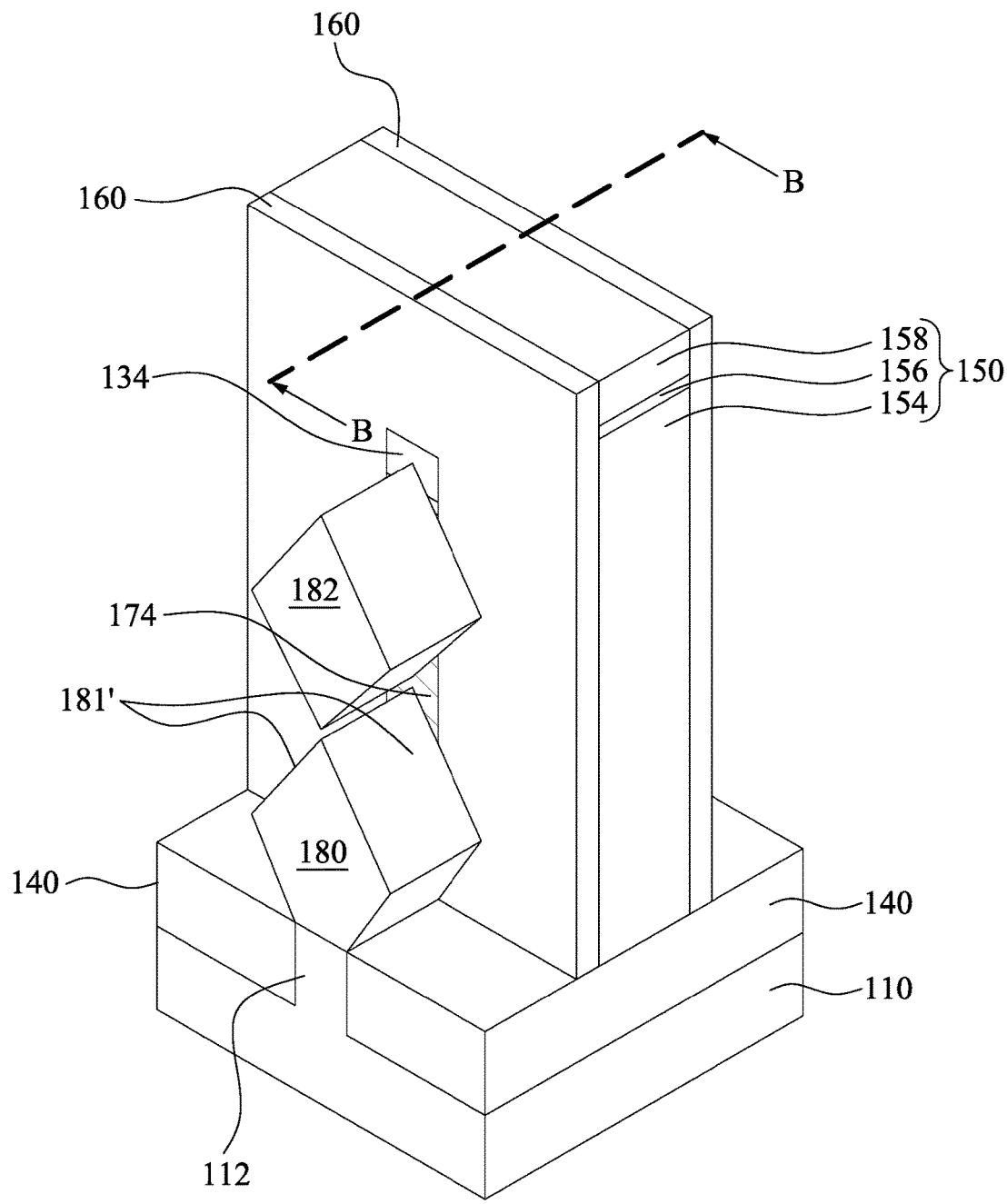
Figure 9B:
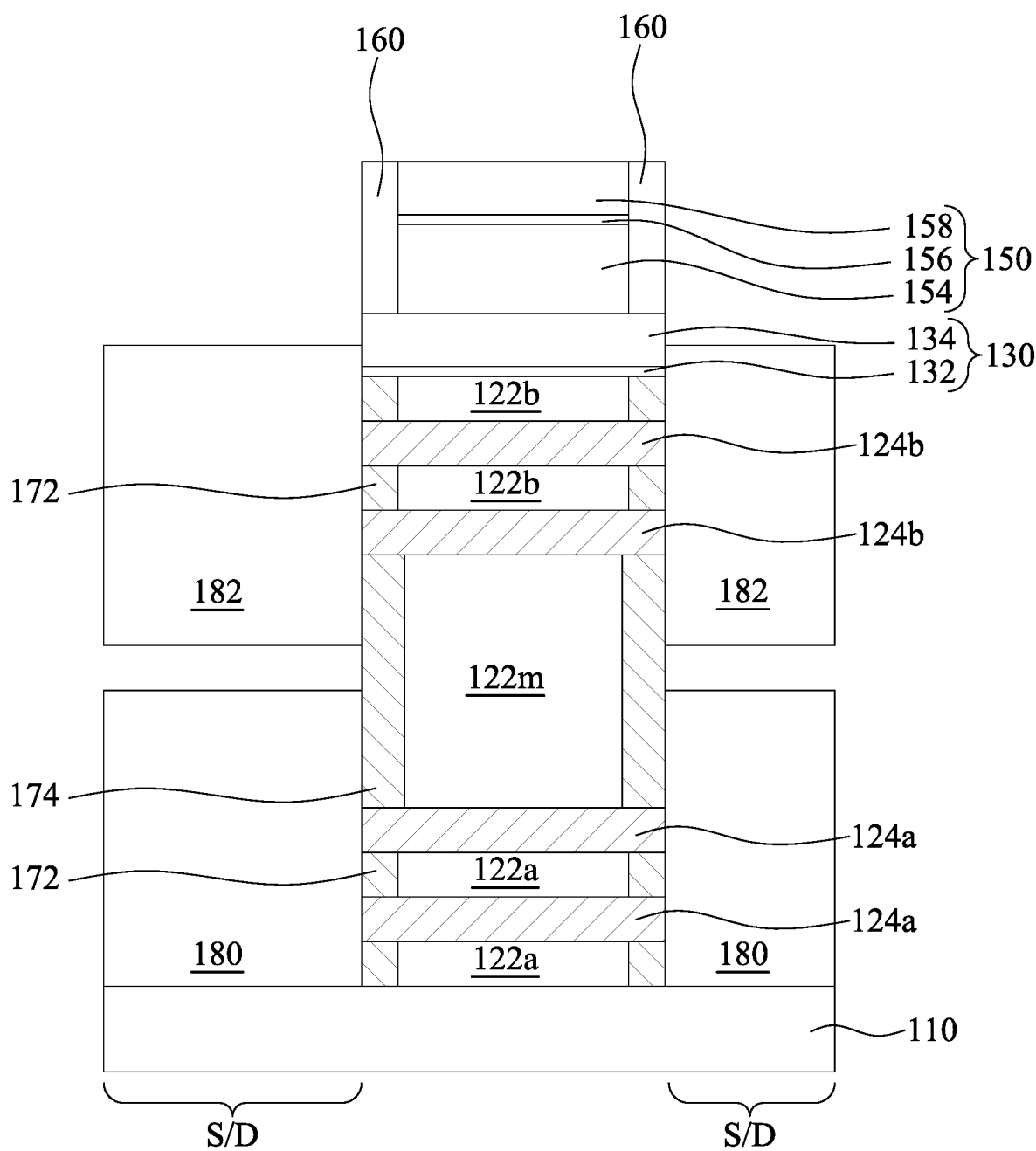

Reference is made to FIGS. 9A and 9B, where FIG. 9B is a cross-sectional view taken along line B-B of FIG. 9A. First source/drain epitaxial structures 180 and 182 are formed over the source/drain regions S/D of the fin structure 125. The first source/drain epitaxial structures 180 are connected to the epitaxial layers 124a, and the first source/drain epitaxial structures 182 are connected to the epitaxial layers 124b as shown in FIG. 9B. In some embodiments, each of the first source/drain epitaxial structures 180 has facets 181' facing upwardly. In some embodiments, the facets 181' are {111} facets. The first source/drain epitaxial structures 180 and 182 may be formed by performing an epitaxial growth process that provides an epitaxial material on the fin structure 125. During the epitaxial growth process, the dummy gate structure 150, gate spacers 160, and the inner dielectric spacers 172, 174 limit the first source/drain epitaxial structures 180 and 182 to the source/drain regions S/D. In some embodiments, the lattice constants of the first source/drain epitaxial structures 180 are different from the lattice constant of the epitaxial layers 124a, so that the epitaxial layers 124a can be strained or stressed by the first source/drain epitaxial structures 180 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the epitaxial layers 124a and 124b.

In some embodiments, the first source/drain epitaxial structures 180 and 182 may include Ge, Si, GaAs, AlGaAs, SiGe, GaAsP, SiP, or other suitable material. The first source/drain epitaxial structures 180 and 182 may be in-situ doped during the epitaxial process by introducing doping species including: p-type dopants, such as boron or $BF_2$; n-type dopants, such as phosphorus or arsenic; and/or other suitable dopants including combinations thereof. If the first source/drain epitaxial structures 180 and 182 are not in-situ doped, an implantation process (i.e., a junction implant process) is performed to dope the first source/drain epitaxial structures 180 and 182. In some exemplary embodiments, the first source/drain epitaxial structures 180 and 182 in a p-type include SiGeB and/or GeSnB.

Figure 10A:
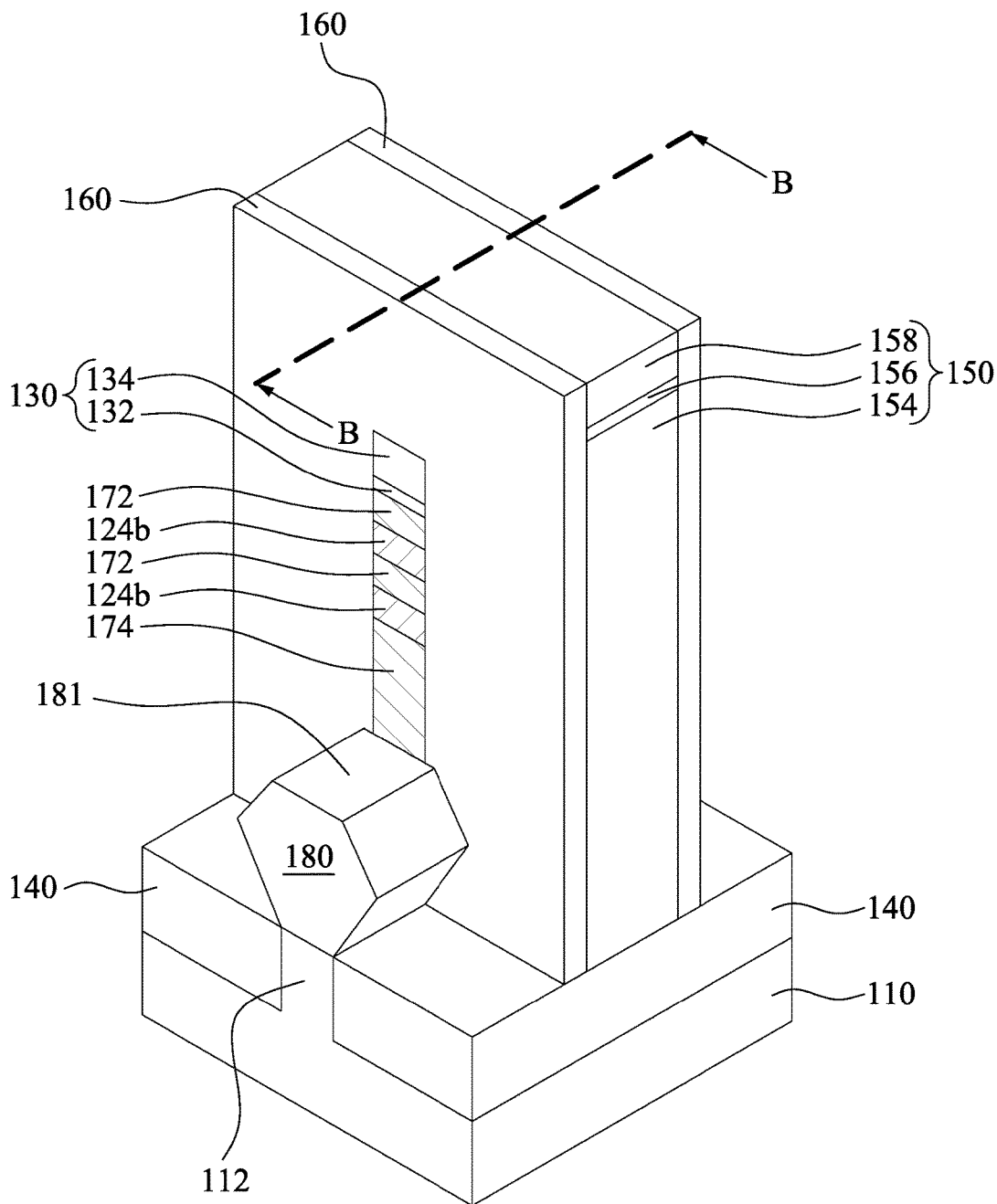
Figure 10B:
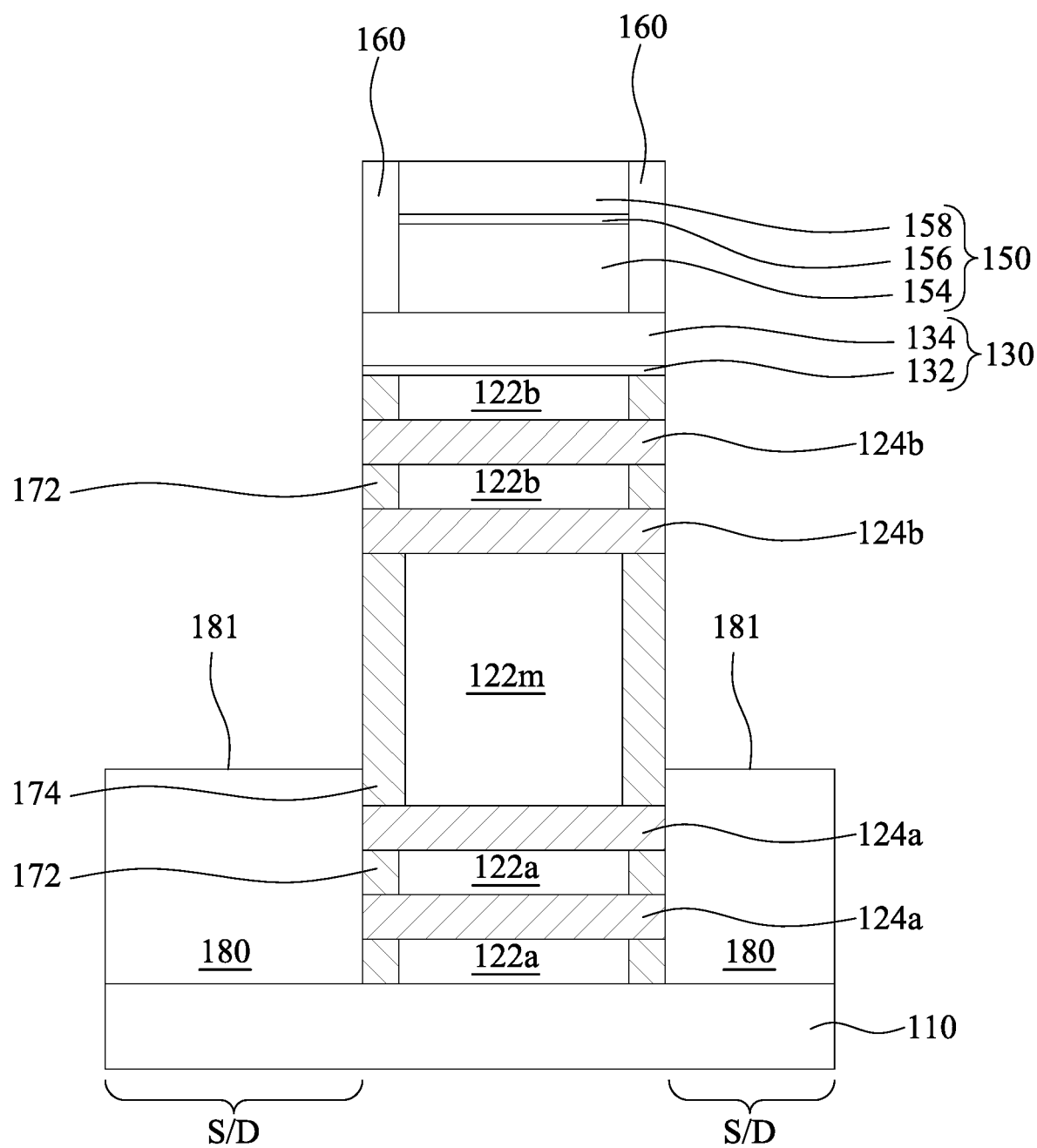

Reference is made to FIGS. 10A and 10B, where FIG. 10B is a cross-sectional view taken along line B-B of FIG. 10A. An etching process is performed to remove the first source/drain epitaxial structures 182, such that the epitaxial layers 124b are exposed. Further, the etching process (or an additional etching process) is performed to etch back the first source/drain epitaxial structures 180, such that each of the first source/drain epitaxial structures 180 has a {100} top surface 181.

Figure 11A:
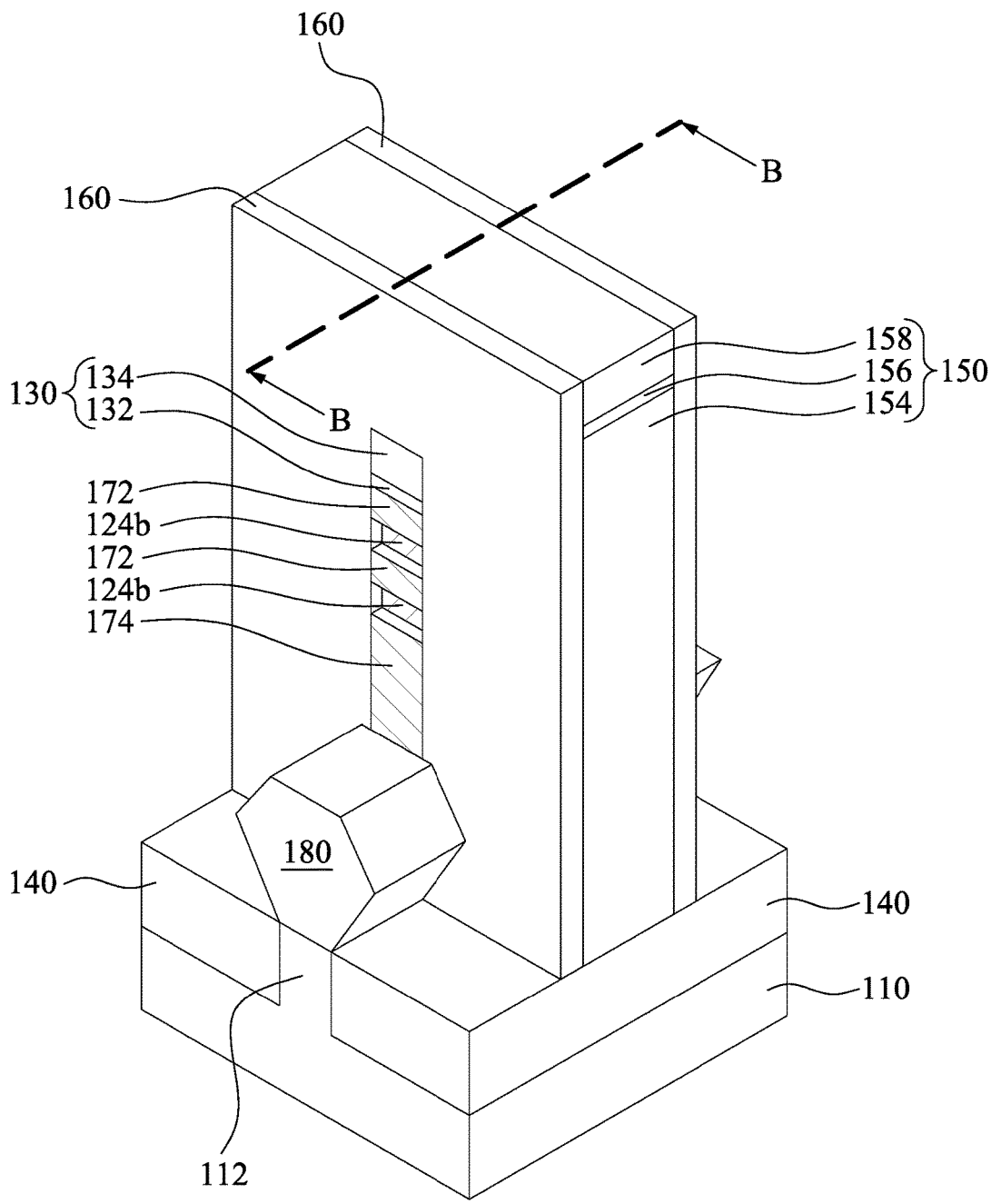
Figure 11B:
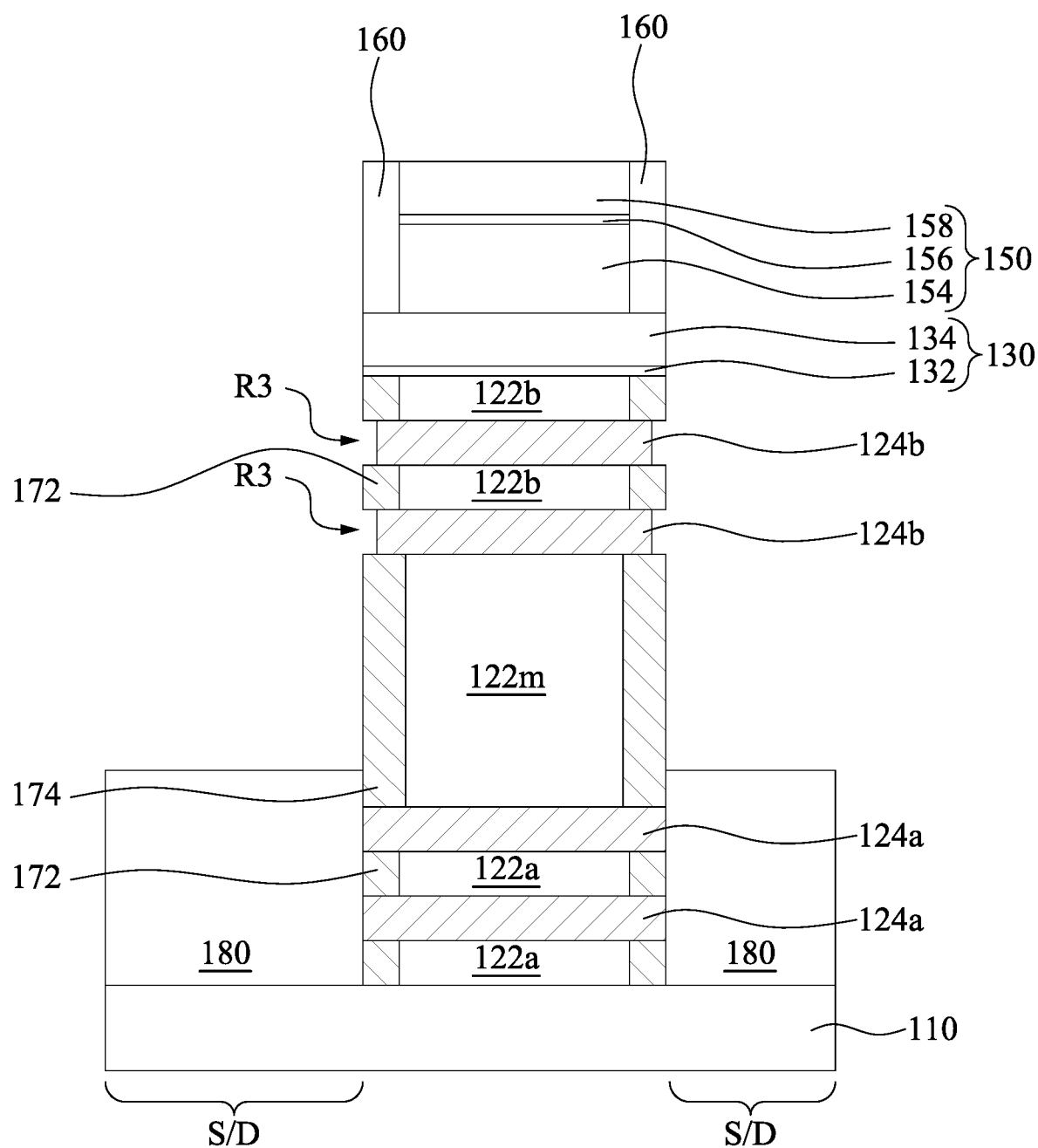

Reference is made to FIGS. 11A and 11B, where FIG. 11B is a cross-sectional view taken along line B-B of FIG. 11A. The epitaxial layers 124b are laterally or horizontally recessed by using suitable etch techniques, resulting in lateral recesses R3 each vertically between corresponding inner dielectric spacers 172 and 174. This operation may be performed by using a selective etching process. By way of example and not limitation, the first source/drain epitaxial structures 180 are SiGe, the inner dielectric spacers 172 and 174 are nitride, and the epitaxial layers 124b are silicon allowing for the selective etching of the epitaxial layers 124b. As a result, the inner dielectric spacers 172 and 174 laterally extend past opposite end surfaces of the epitaxial layers 124b.

Figure 12A:
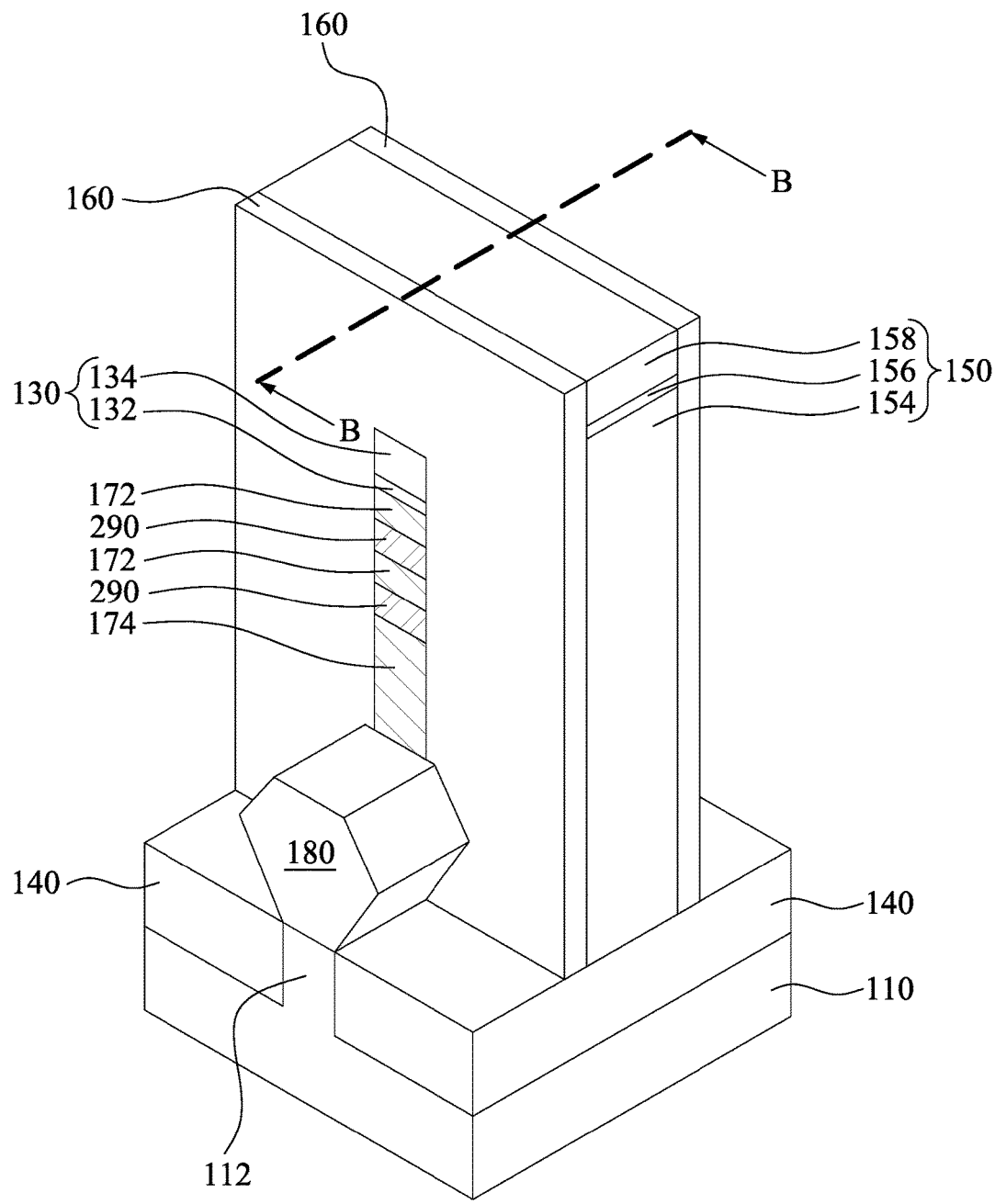
Figure 12B:
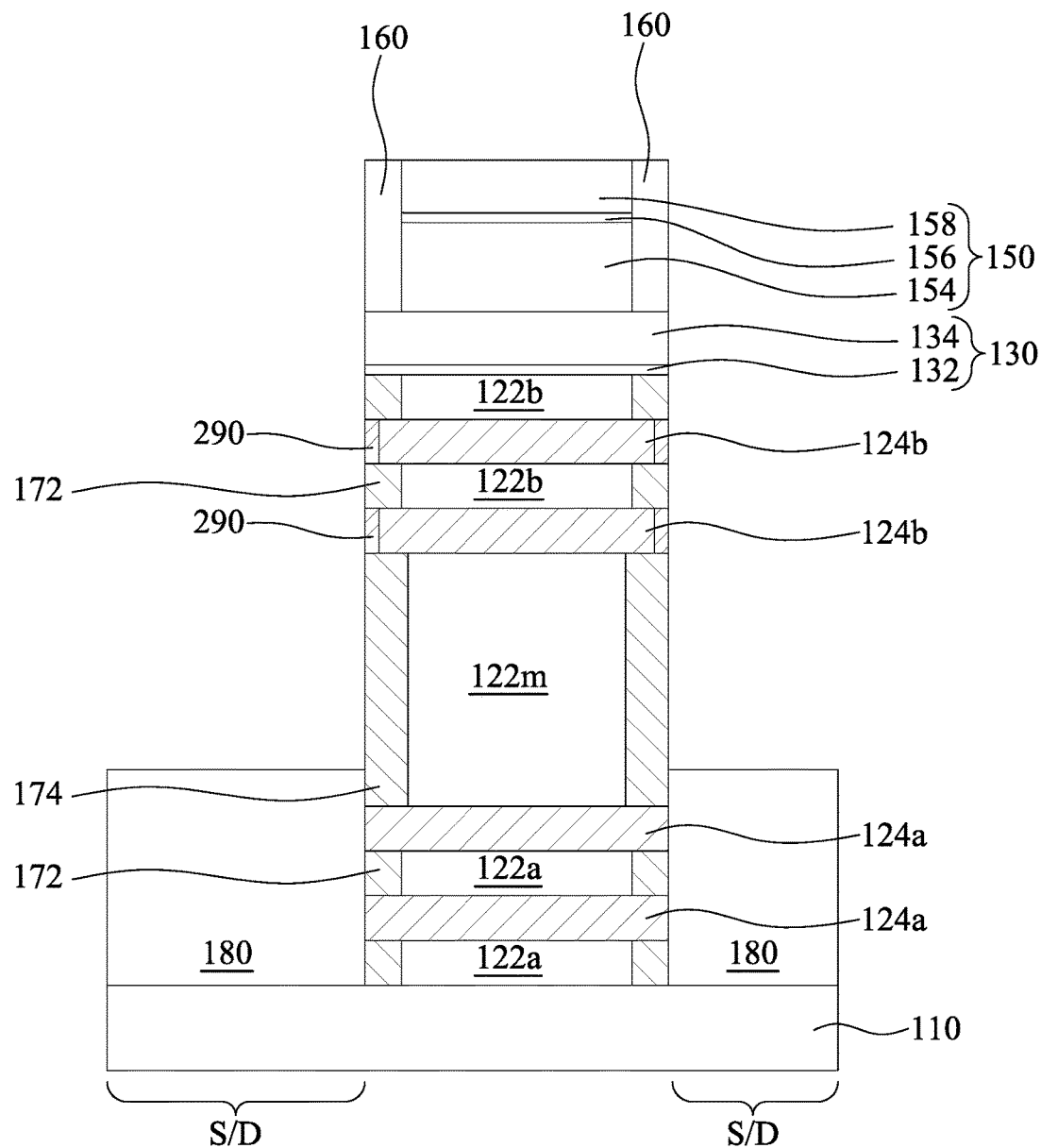

Reference is made to FIGS. 12A and 12B, where FIG. 12B is a cross-sectional view taken along line B-B of FIG. 12A. Dielectric blocking layers 290 are filled in the recesses R3 (see FIG. 11B), respectively. For example, dielectric material layers are formed to fill the recesses R3 left by the lateral etching of the epitaxial layers 124b discussed above with reference to FIGS. 11A and 11B. The dielectric material layer may be a low-k dielectric material, such as $SiO_2$, SiN, SiC, SiON, SiCN, or SiOCN, and may be formed by a suitable deposition method, such as ALD. In some embodiments, the dielectric material layer is intrinsic or un-doped with impurities. The dielectric material layer can be formed using CVD, including LPCVD and PECVD, PVD, ALD, or other suitable processes.

After the deposition of the dielectric material layer, an anisotropic etching process may be performed to trim the deposited dielectric material layer, such that portions of the deposited dielectric material layer that fill the recesses R3 left by the lateral etching of the epitaxial layers 124b are left. After the trimming process, the remaining portions of the deposited dielectric material are denoted as dielectric blocking layers 290 in the recesses R3, for the sake of simplicity. The dielectric blocking layers 290 serve to seal the epitaxial layers 124b during the formation of the epitaxial isolation structure 190 (see FIGS. 13A and 13B). In some embodiments, the dielectric blocking layers 290 and the inner dielectric spacers 172 and 174 includes different materials. For example, the dielectric blocking layers 290 are made of oxide, and the inner dielectric spacers 172 and 174 are made of nitride.

In some other embodiments, the dielectric blocking layers 290 can be formed by using a thermal oxidation process. Specifically, after the process shown in FIGS. 10A and 10B, a thermal oxidation process is performed such that the exposed sidewalls of the epitaxial layers 124b are oxidized to be the dielectric blocking layers 290. As such, an etching process and a dielectric material deposition process as shown in FIGS. 11A-12B can be omitted.

Figure 13A:
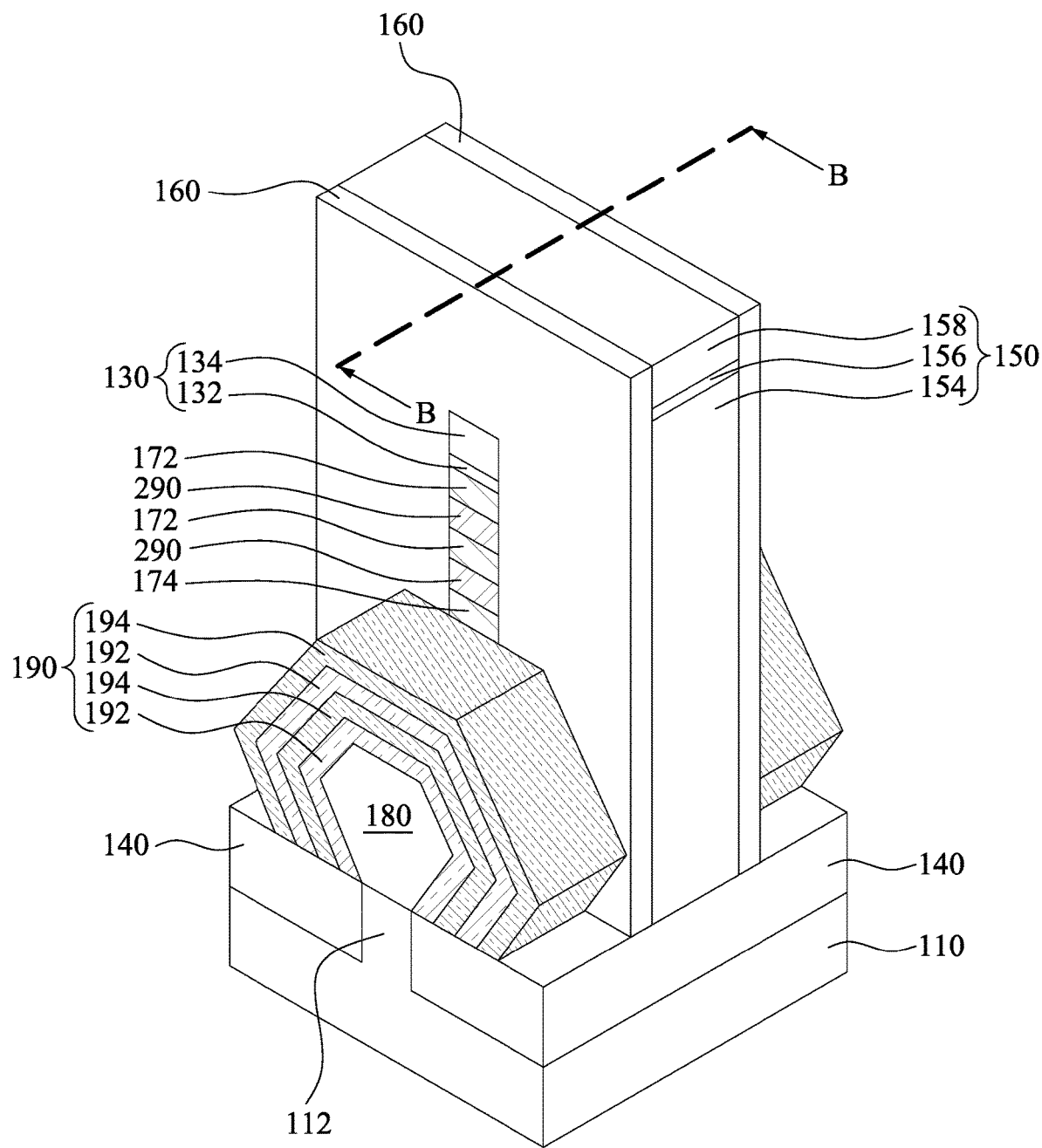
Figure 13B:
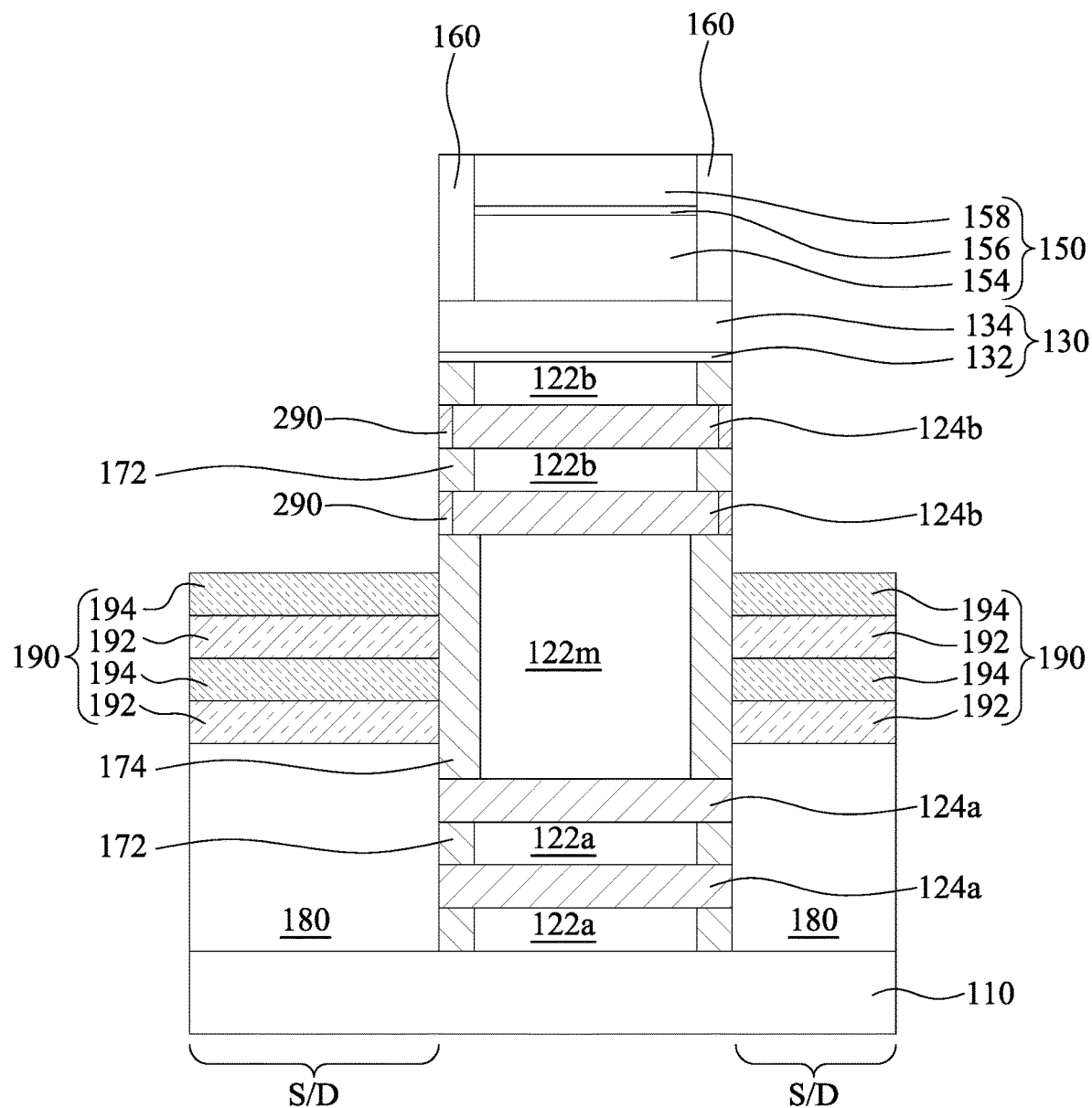

Reference is made to FIGS. 13A and 13B, where FIG. 13B is a cross-sectional view taken along line B-B of FIG. 13A. Epitaxial isolation structures 190 are formed on the first source/drain epitaxial structures 180. Each of the epitaxial isolation structures 190 includes epitaxial layers 192 of a third composition interposed by epitaxial layers 194 of a fourth composition. The third and fourth compositions are different and have different conductivity types. In some embodiments, the epitaxial layers 192 are boron-doped silicon and the epitaxial layers 194 are phosphorus-doped silicon. However, other embodiments are possible including those that provide for a first composition and a second composition having different conductivity types. In some embodiments, since the epitaxial isolation structures 190 are deposited over the top surfaces 181 (see FIG. 10B) of the first source/drain epitaxial structures 180, each of the epitaxial layers 192 and 194 has a {100} top surface.

The epitaxial layers 192 and 194 may be formed by performing an epitaxial growth process that provides epitaxial materials on the first source/drain epitaxial structures 180. During the epitaxial growth process, the dummy gate structure 150, gate spacers 160, and the inner dielectric spacers 172, 174 limit the epitaxial layers 192 and 194 to the surfaces of the first source/drain epitaxial structures 180. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the first source/drain epitaxial structures 180.

In some embodiments, the epitaxial layers 192 and 194 may include Ge, Si, SiGe, GeSn, GaAs, III-V, or other suitable material. The epitaxial layers 192 and 194 may be in-situ doped during the epitaxial process by introducing doping species including: p-type dopants, such as boron or $BF_2$; n-type dopants, such as phosphorus or arsenic; and/or other suitable dopants including combinations thereof. If the epitaxial layers 192 and 194 are not in-situ doped, an implantation process (i.e., a junction implant process) is performed to dope the epitaxial layers 192 and 194. In some exemplary embodiments, the epitaxial layers 192 in a p-type include Si:B and the epitaxial layers 194 in an n-type include Si:P.

Figure 14A:
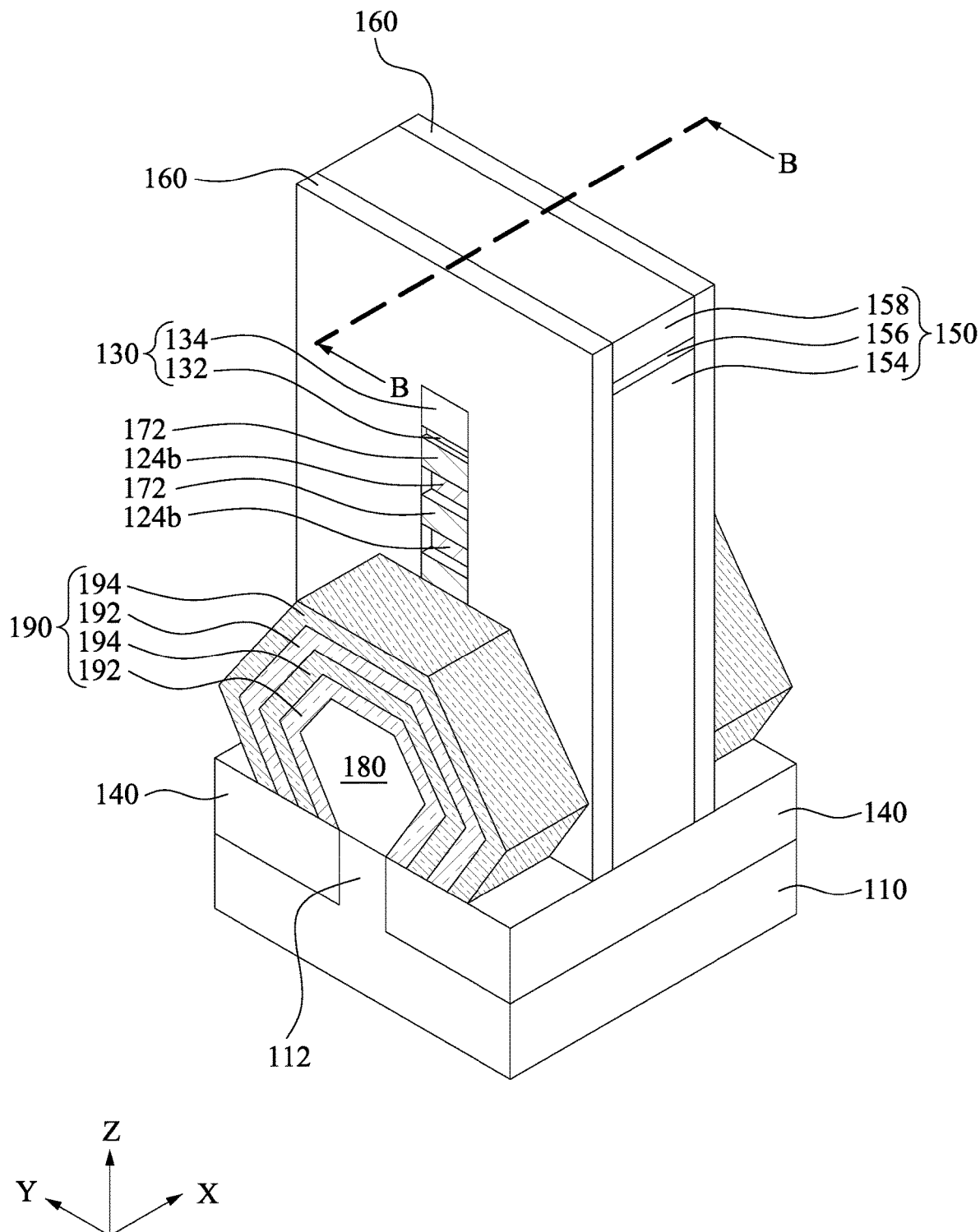
Figure 14B:
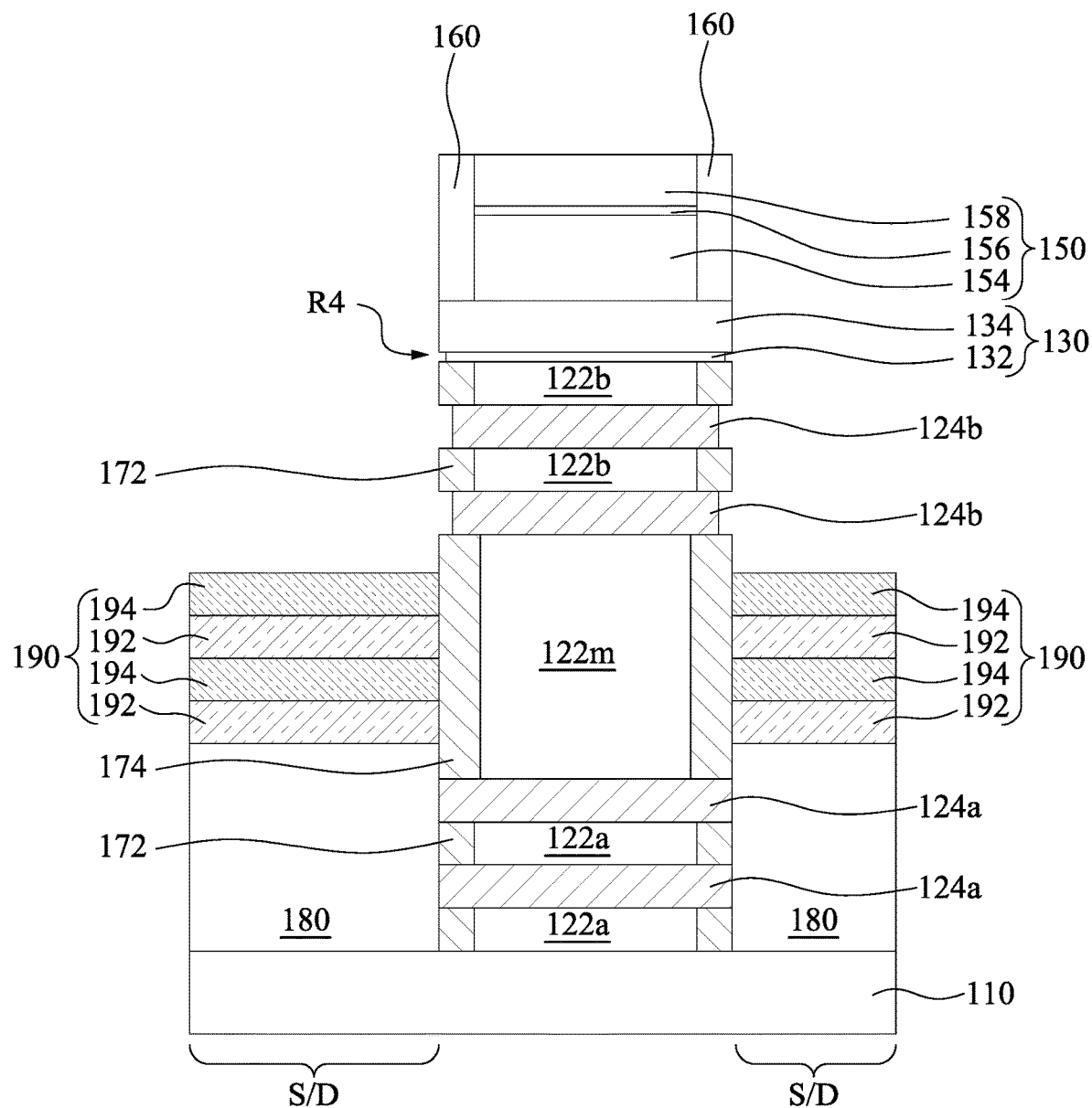

Reference is made to FIGS. 14A and 14B, where FIG. 14B is a cross-sectional view taken along line B-B of FIG. 14A. An etching process is performed to remove the dielectric blocking layers 290. In some embodiments, since the dielectric blocking layers 290 are oxide, portions of the oxide layer 132 are removed during the etching process. As such, recesses R4 are formed in the oxide layer 132.

Figure 15A:
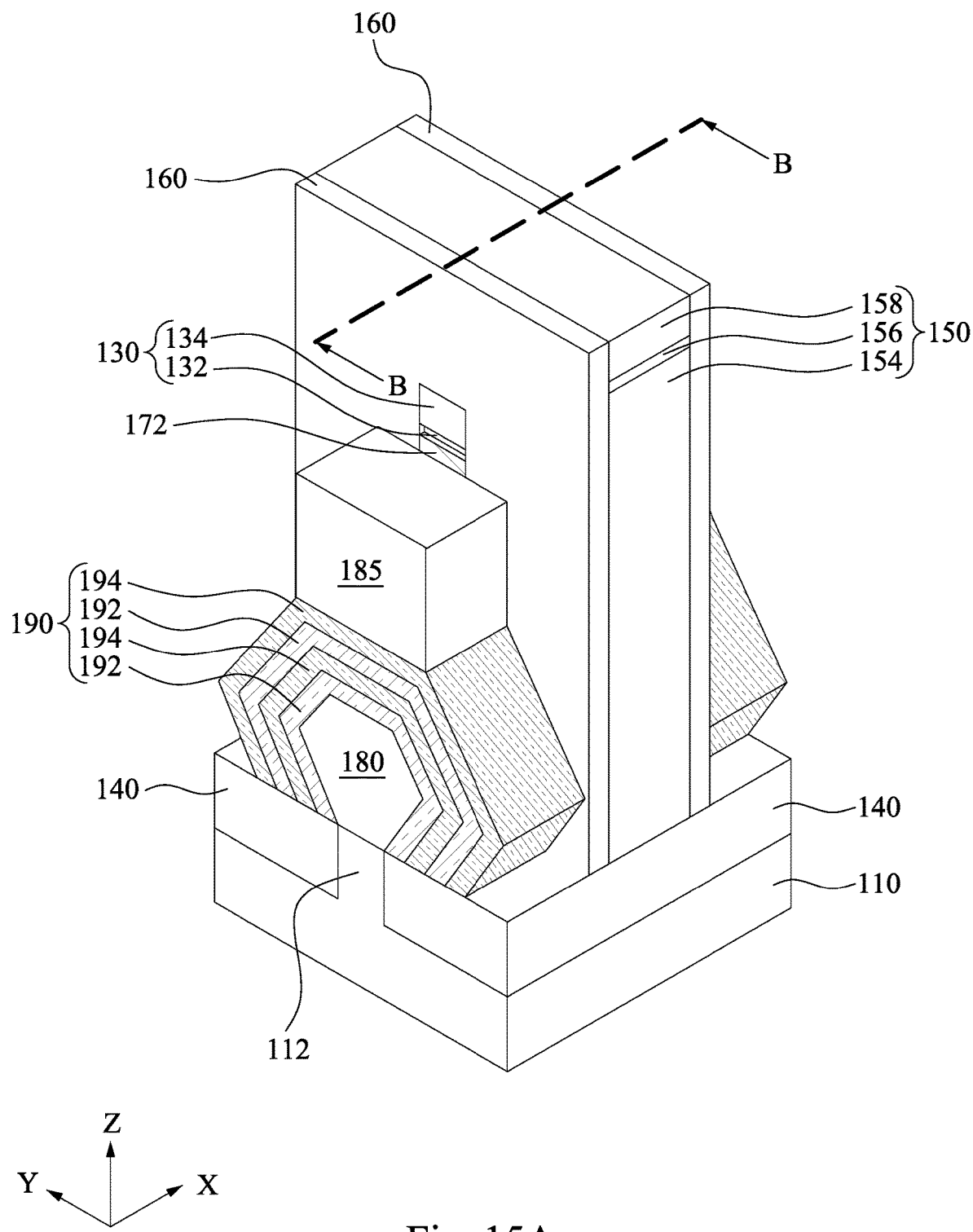
Figure 15B:
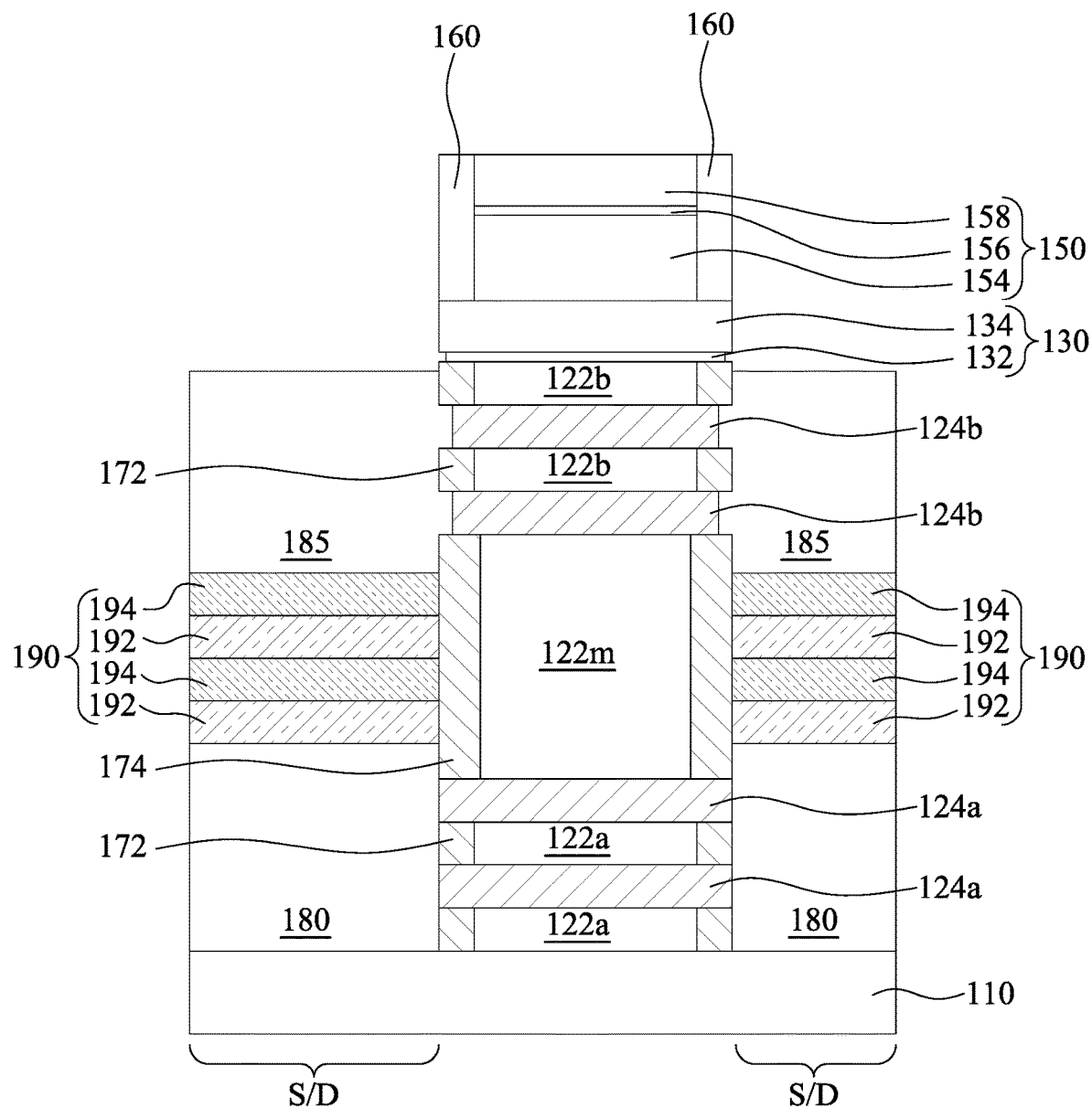

Reference is made to FIGS. 15A and 15B, where FIG. 15B is a cross-sectional view taken along line B-B of FIG. 15A. Second source/drain epitaxial structures 185 are formed over the epitaxial isolation structure 190. The second source/drain epitaxial structures 185 may be formed by performing an epitaxial growth process that provides an epitaxial material on the epitaxial isolation structure 190. During the epitaxial growth process, the dummy gate structure 150, the gate spacers 160, and the inner dielectric spacers 172, 174 limit the second source/drain epitaxial structures 185 to the source/drain regions SID. In some embodiments, the lattice constants of the second source/drain epitaxial structures 185 are different from the lattice constant of the epitaxial layers 124b, so that the epitaxial layers 124b can be strained or stressed by the second source/drain epitaxial structures 185 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the epitaxial layers 124b.

In some embodiments, the second source/drain epitaxial structures 185 may include Ge, Si, GaAs, AlGaAs, SiGe, GaAsP, SiP, or other suitable material. The second source/drain epitaxial structures 185 may be in-situ doped during the epitaxial process by introducing doping species including: p-type dopants, such as boron or $BF_2$; n-type dopants, such as phosphorus or arsenic; and/or other suitable dopants including combinations thereof. If the second source/drain epitaxial structures 185 are not in-situ doped, an implantation process (i.e., a junction implant process) is performed to dope the second source/drain epitaxial structures 185. In some exemplary embodiments, the second source/drain epitaxial structures 185 in an n-type transistor include SiP. The first source/drain epitaxial structures 180 and the second source/drain epitaxial structures 185 are made of different materials. For example, the first source/drain epitaxial structures 180 are made of SiGeB and the second source/drain epitaxial structures 185 are made of SiP.

Figure 16A:
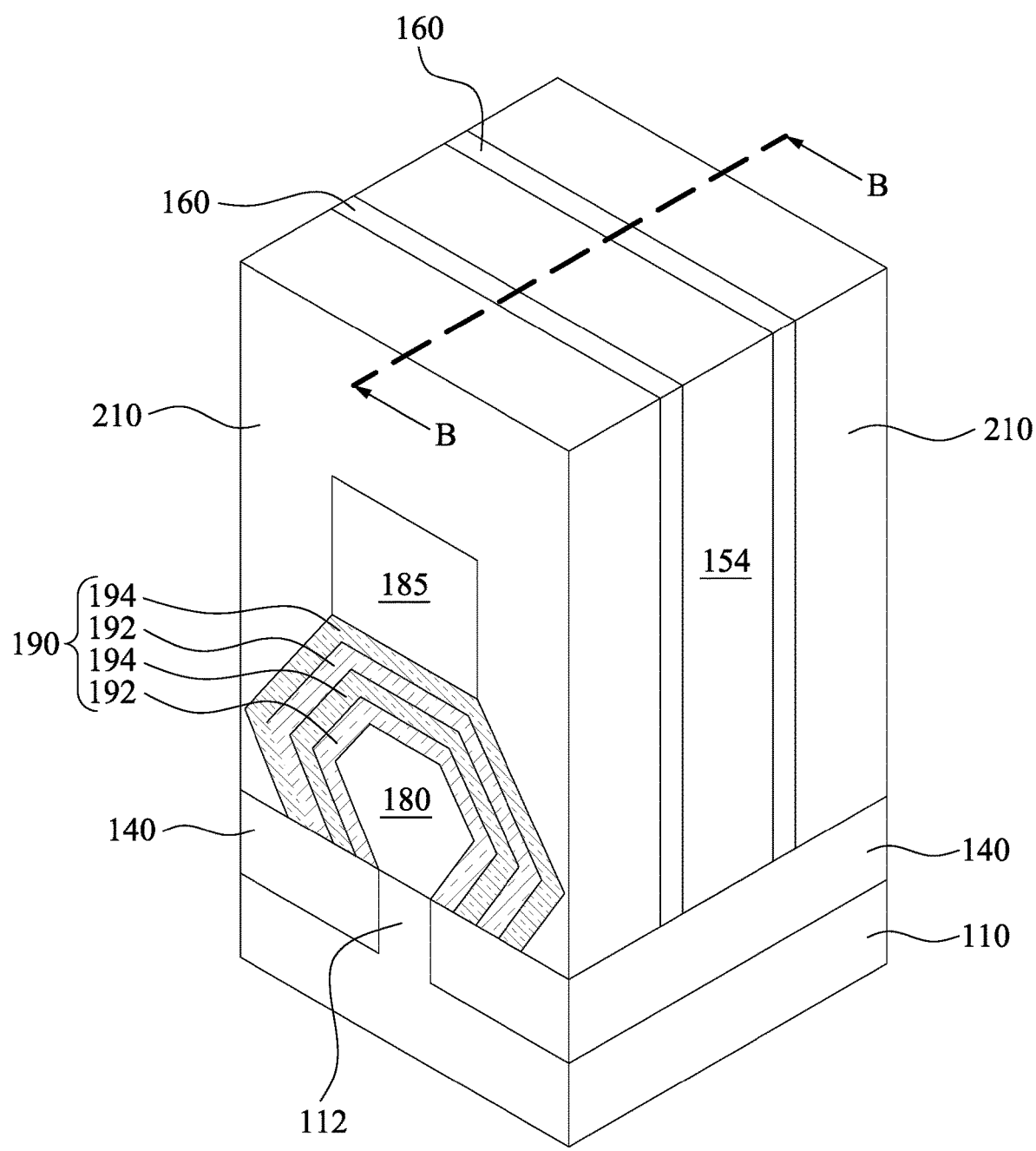
Figure 16B:
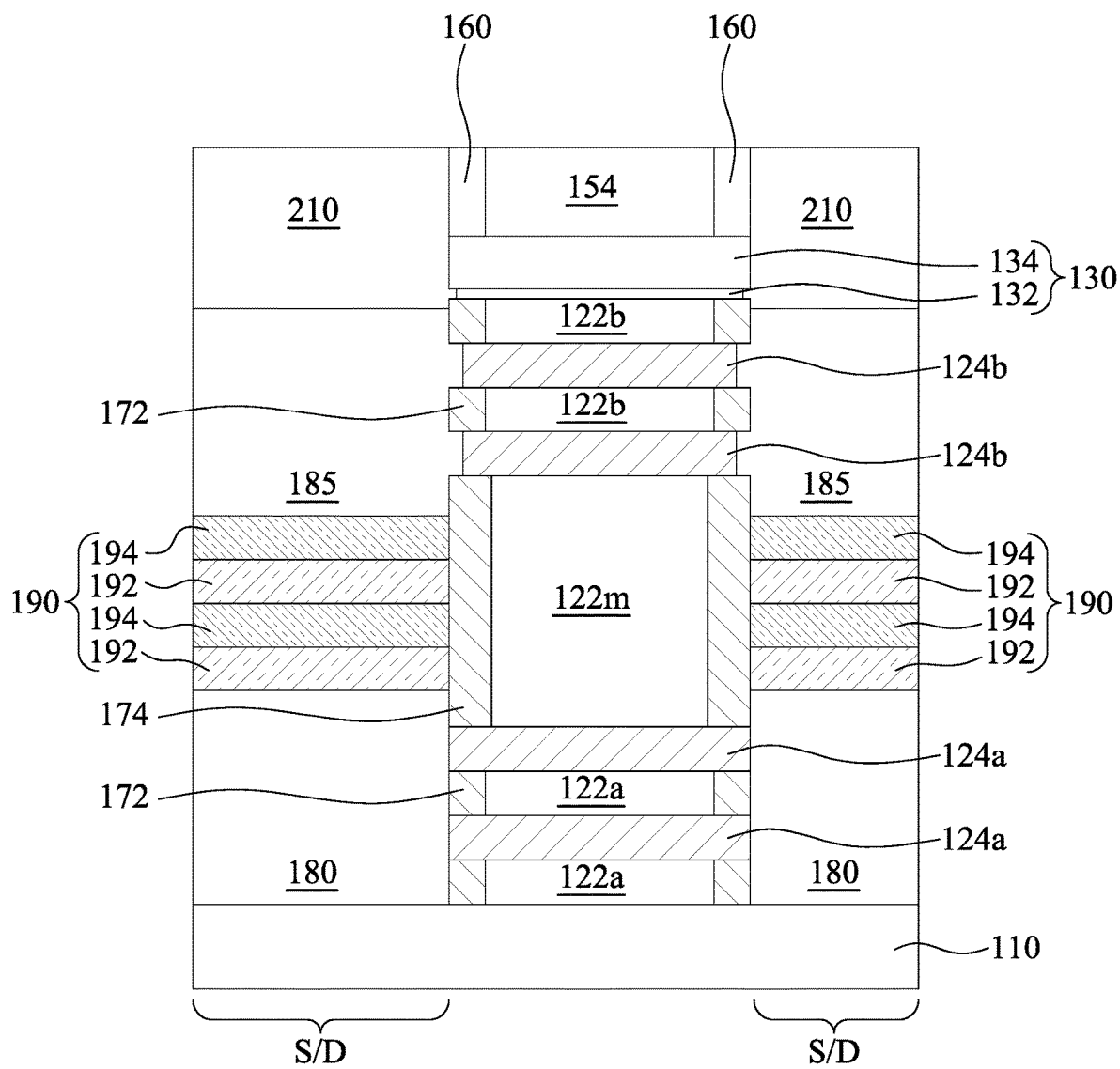
Figure 17A:
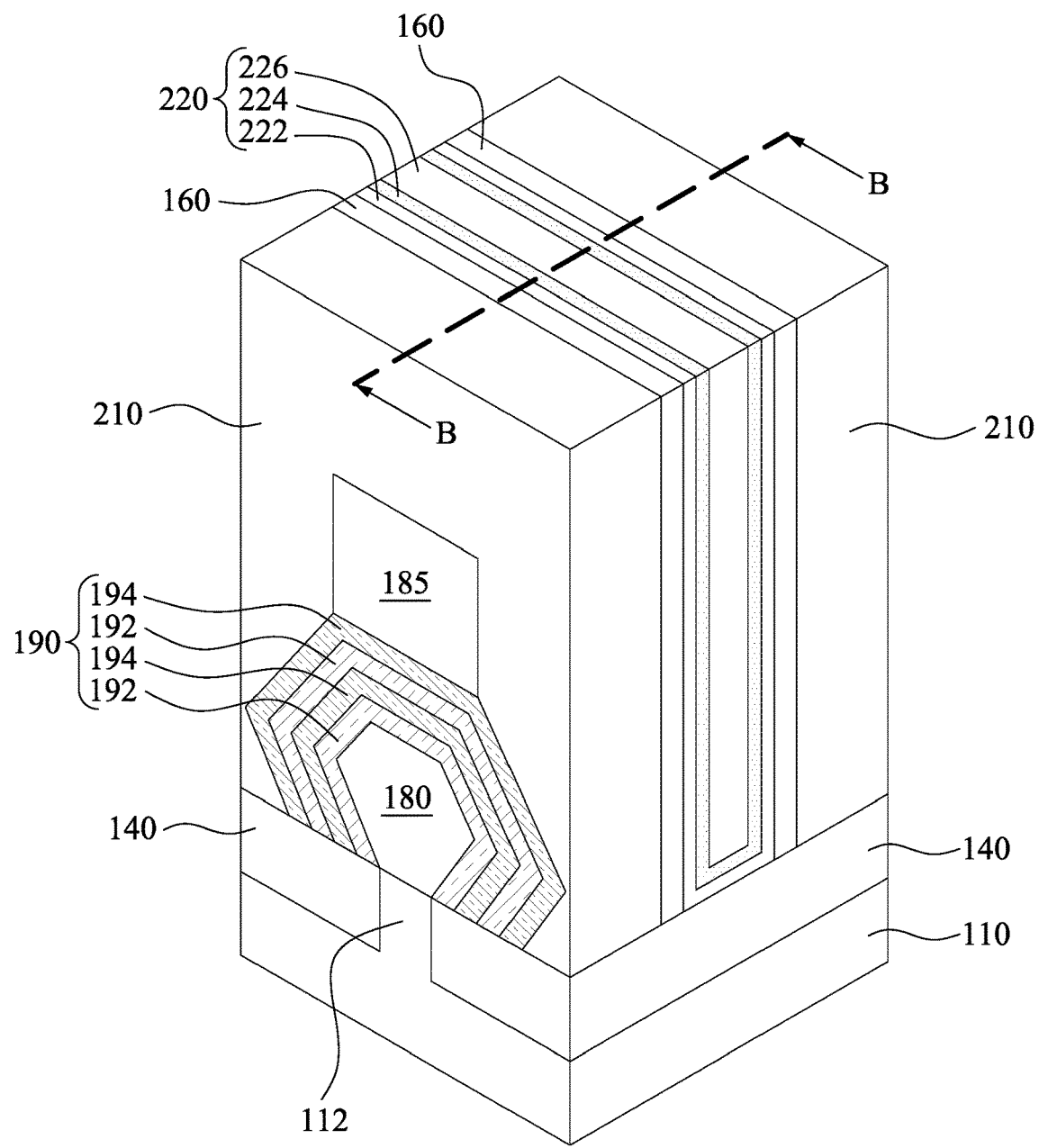
FIG. 17C is an enlarged view of area P in FIG. 17B.
Figure 17B:
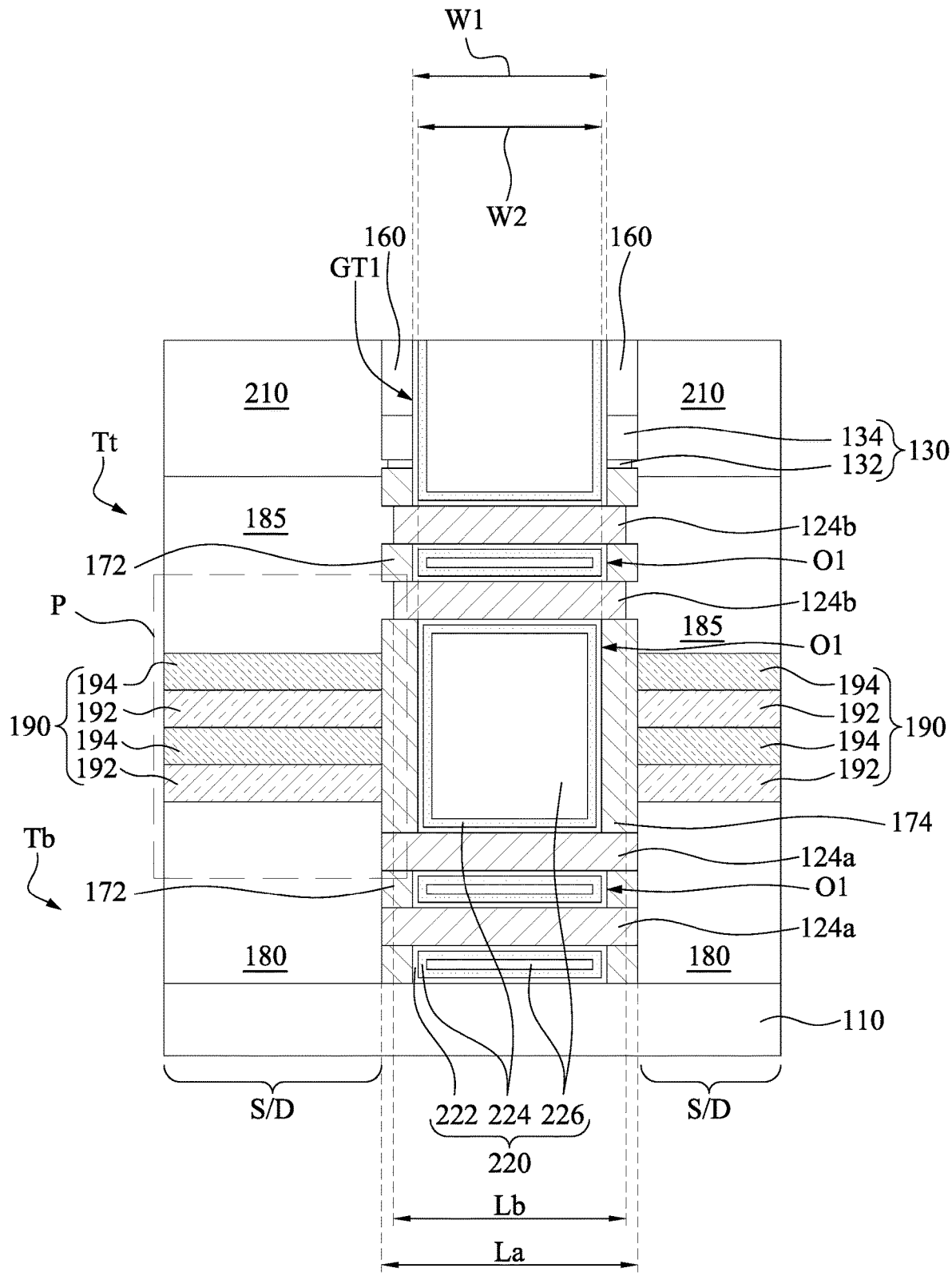

Reference is made to FIGS. 16A and 16B, where FIG. 16B is a cross-sectional view taken along line B-B of FIG. 16A. An interlayer dielectric (ILD) layer 210 is formed on the substrate 110. In some embodiments, a contact etch stop layer (CESL) is also formed prior to forming the ILD layer 210. In some examples, the CESL includes a silicon nitride layer, silicon oxide layer, a silicon oxynitride layer, and/or other suitable materials having a different etch selectivity than the ILD layer 210. The CESL may be formed by plasma-enhanced chemical vapor deposition (PECVD) process and/or other suitable deposition or oxidation processes. In some embodiments, the ILD layer 210 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL. The ILD layer 210 may be deposited by a PECVD process or other suitable deposition technique. In some embodiments, after formation of the ILD layer 210, the wafer may be subject to a high thermal budget process to anneal the ILD layer 210.

In some examples, after depositing the ILD layer 210, a planarization process may be performed to remove excessive materials of the ILD layer 210. For example, a planarization process includes a chemical mechanical planarization (CMP) process which removes portions of the ILD layer 210 (and CESL layer, if present) overlying the dummy gate structures 150 and planarizes a top surface of the integrated circuit structure 100a. In some embodiments, the CMP process also removes hard mask layers 156 and 158 (as shown in FIGS. 15A and 15B) and exposes the dummy gate electrode layer 154.

Thereafter, the dummy gate electrode layer 154 is removed first, and then the epitaxial layers (i.e., sacrificial layers) 122a, 122b, 122m are removed. The resulting structure is illustrated in FIGS. 17A and 17B. In some embodiments, the dummy gate electrode layer 154 is removed by using a selective etching process (e.g., selective dry etching, selective wet etching, or combinations thereof) that etches the materials in dummy gate electrode layer 154 at a faster etch rate than it etches other materials (e.g., the gate spacers 160 and/or the ILD layer 210), thus resulting in a gate trench GT1 between the gate spacers 160, with the epitaxial layers 122a, 122b, and 122m exposed in the gate trench GT1. The HM layer 130 is then etched. Subsequently, the epitaxial layers 122a, 122b, and 122m in the gate trench GT1 are removed by using another selective etching process that etches the epitaxial layers 122a, 122b, and 122m at a faster etch rate than it etches the epitaxial layers 124a and 124b, thus forming openings O1 between neighboring epitaxial layers (i.e., channel layers) 124a and 124b. In this way, the epitaxial layers 124a and 124b become nanosheets suspended over the substrate 110. This operation is also called a channel release process. In some embodiments, the epitaxial layers 124a and 124b can be interchangeably referred to as nanostructure (nanowires, nanoslabs and nanorings, nanosheet, etc., depending on their geometry). For example, in some other embodiments the epitaxial layers 124a and 124b may be trimmed to have a substantial rounded shape (i.e., cylindrical) due to the selective etching process for completely removing the epitaxial layers 124a and 124b. In that case, the resultant epitaxial layers 124a and 124b can be called nanowires.

In some embodiments, the epitaxial layers 122a, 122b, and 122m are removed by using a selective dry etching process by using, for example, $CF_4$ as etching gases. In some embodiments, the epitaxial layers 122a, 122b, and 122m are SiGe and the epitaxial layers 124a and 124b are silicon allowing for the selective removal of the epitaxial layers 122a, 122b, and 122m.

A (metal) gate structure 220 is formed in the gate trench GT1 and the openings O1 to surround each of the epitaxial layers 124a and 124b suspended in the gate trench GT1 and the openings O1. The gate structure 220 may be the final gate of a GAA FET. The final gate structure may be a high-k/metal gate stack, however other compositions are possible. In some embodiments, the gate structure 220 forms the gate associated with the multi-channels provided by the plurality of epitaxial layers 124a and 124b. For example, the gate structure 220 is formed within the openings O1 provided by the release of epitaxial layers 124a and 124b. In various embodiments, the gate structure 220 includes a gate dielectric layer 222 formed around the epitaxial layers 124a and 124b, a work function metal layer 224 formed around the gate dielectric layer 222, and a fill metal 226 formed around the work function metal layer 224 and filling a remainder of gate trench GT1. The gate dielectric layer 222 includes an interfacial layer (e.g., silicon oxide layer) and a high-k gate dielectric layer over the interfacial layer. High-k gate dielectrics include dielectric materials having a high dielectric constant, for example, greater than that of thermal silicon oxide (~3.9). The work function metal layer 224 and/or fill metal 226 used within high-k/metal gate structures 220 may include a metal, metal alloy, or metal silicide. Formation of the gate structures 220 may include depositions to form various gate materials, one or more liner layers, and one or more CMP processes to remove excessive gate materials.

In some embodiments, the interfacial layer of the gate dielectric layer 222 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 222 may include hafnium oxide ($HfO_2$). Alternatively, the gate dielectric layer 222 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO2), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 224 may include work function metals to provide a suitable work function for the gate structure 220. For an n-type FinFET, the work function metal layer 224 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 224 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 226 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

As such, the semiconductor device 100a is formed. The semiconductor device 100a includes a bottom transistor Tb, a top transistor Tt, and epitaxial isolation structures 190. The top transistor Tt is over the bottom transistor Tb. The bottom transistor Tb includes the channel layers 124a, the first source/drain epitaxial structures 180 on opposite sides of the channel layers 124a and connected to the channel layers 124a, and the gate structure 220 wrapping around the channel layers 124a. The top transistor Tt includes the channel layers 124b, the second source/drain epitaxial structures 185 on opposite sides of the channel layers 124b and connected to the channel layers 124b, and the gate structure 220 wrapping around the channel layers 124b. Each of the epitaxial isolation structures 190 is between one of the first source/drain epitaxial structures 180 and one of the second source/drain epitaxial structures 185 to electrically isolate the first source/drain epitaxial structure 180 from the second source/drain epitaxial structure 185.

Figure 17C:
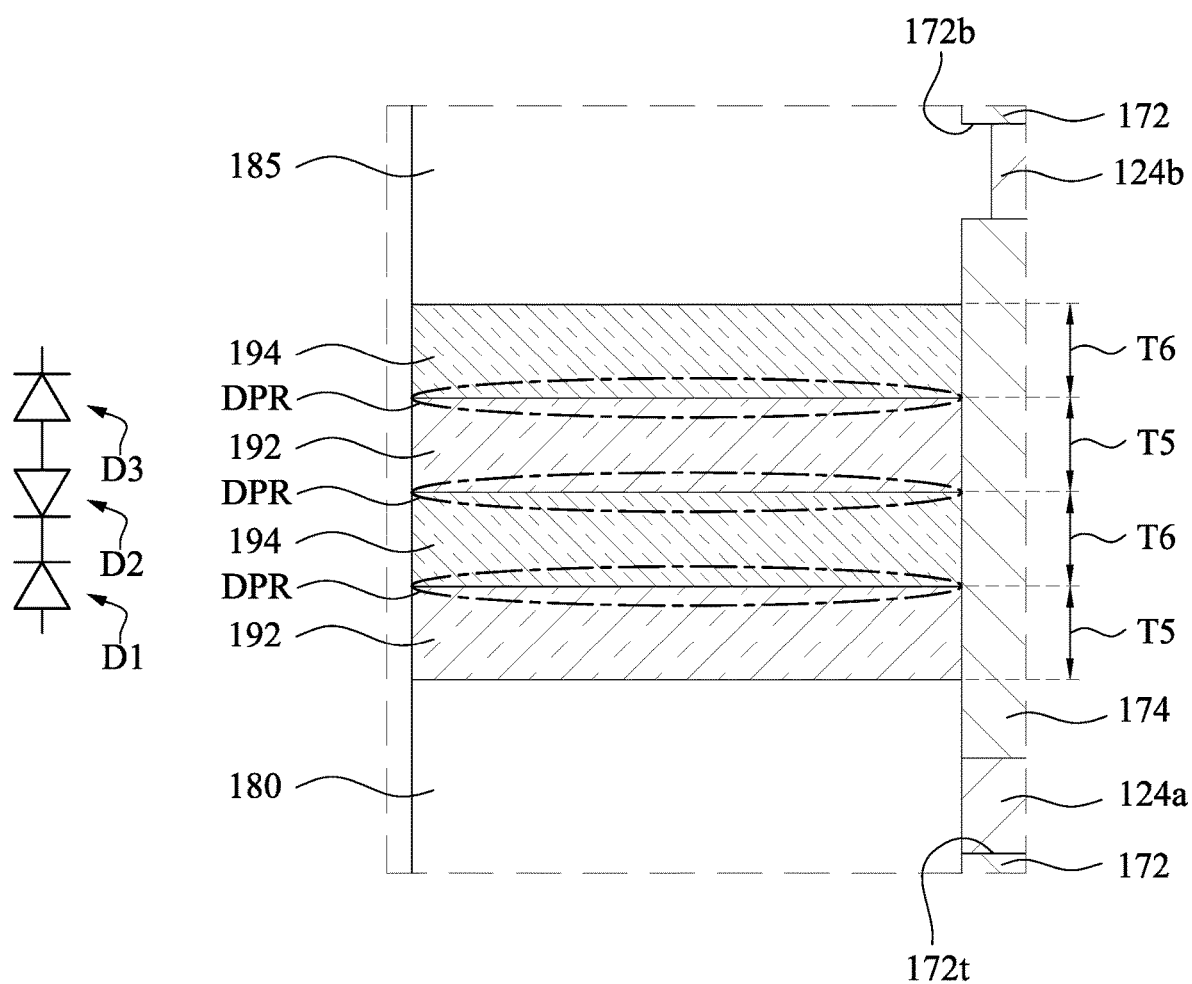
Figure 36:
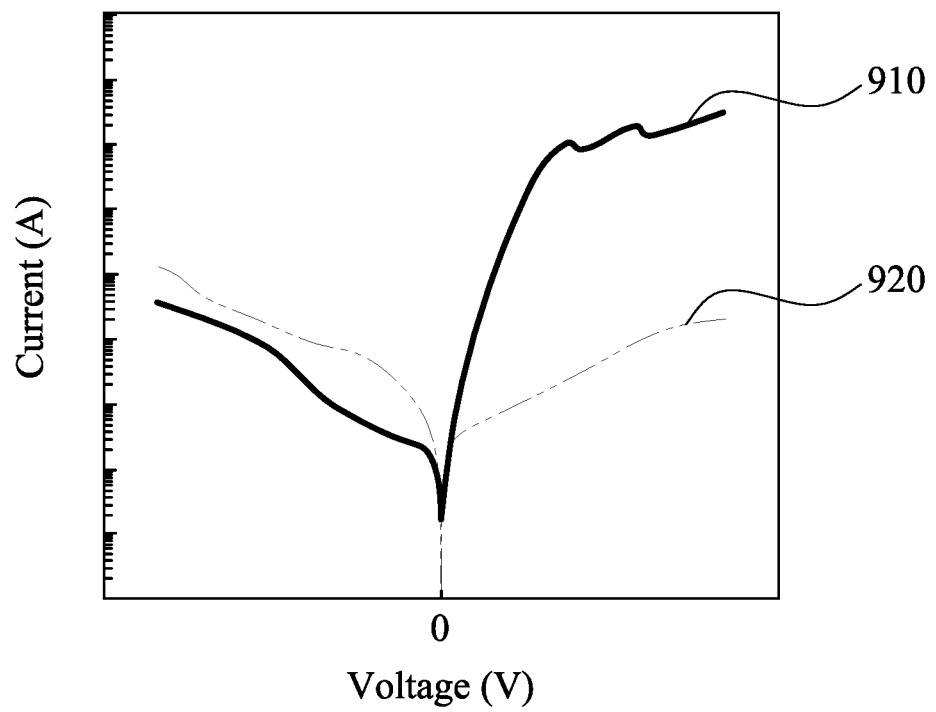
FIG. 36 shows current versus voltage (I-V) characteristics of p-n junction(s) according to some embodiments of the present disclosure.

FIG. 17C is an enlarged view of area P in FIG. 17B. Reference is made to FIGS. 17B and 17C. The epitaxial isolation structure 190 includes the epitaxial layers 192 interposed by the epitaxial layers 194. The epitaxial layers 192 have a conductivity type opposite to a conductivity type of the epitaxial layers 194. For example, the epitaxial layers 192 are P-type, and the epitaxial layers 194 are N-type, or vise versa. As such, adjacent epitaxial layer 192 and epitaxial layer 194 form a diode. As shown in FIG. 17C, the epitaxial isolation structure 190 form three diodes D1, D2, and D3, where the diode D2 is reversed. That is, a cathode of the diode D1 is connected to a cathode of the diode D2, and an anode of the diode D2 is connected to an anode of the diode D3. Therefore, the connected diodes D1, D2, and D3 suppress junction current as shown in FIG. 36. Stated another way, the epitaxial isolation structure 190 functions as an isolation structure between the adjacent first source/drain epitaxial structure 180 and the second source/drain epitaxial structure 185.

As shown in FIG. 17C, depletion regions DPR are formed at interfaces between adjacent epitaxial layers 192 and 194, and the depletion regions DPR are spaced apart from each other. The sizes of the depletion regions DPR are determined by the dopant concentrations of the epitaxial layers 192 and 194. In some embodiments, each of the epitaxial layers 192 and 194 has a dopant concentration in a range of about 1E15 to about 1E21 cm$^{-3}$. As the dopant concentrations increase, the sizes of the depletion regions DPR are reduced. Further, if the dopant concentrations of the epitaxial layers 192 and 194 are lower than about 1E15 cm$^{-3}$, the diodes D1, D2, and D3 may not be formed.

In some embodiments, each of the epitaxial layers 192 has a thickness T5, and each of the epitaxial layers 194 has a thickness T6. Each of the thicknesses T5 and T6 is in a range of about 5 nm to about 100 nm, or 5 nm to about 20 nm. If the thicknesses T5 and T6 are less than about 5 nm, the adjacent depletion regions DPR may be connected, and tunneling current may flow through the epitaxial isolation structure 190, resulting in current leakage in the epitaxial isolation structure 190. If the thicknesses T5 and T6 are higher than about 100 nm, source/drain contacts connected to the first source/drain epitaxial structure 180 may be difficult to be formed. It can be appreciated that any number of epitaxial layers 192 and 194 can be formed in the epitaxial isolation structure 190; the numbers of layers depending on the desired number of diodes for the epitaxial isolation structure 190. In some embodiments, the number of each of the epitaxial layers 192 and 194 can be greater than 2.

The semiconductor device 100a further includes the inner dielectric spacers 172 and 174. The inner dielectric spacers 172 are between the gate structure 220 and the first source/drain epitaxial structures 180 (or the second source/drain epitaxial structures 185), and the inner dielectric spacers 174 are between the gate structure 220 and the epitaxial isolation structures 190. Further, the inner dielectric spacer 174 extends from one of the first source/drain epitaxial structures 180 to one of the second source/drain epitaxial structures 185. The epitaxial isolation structures 190 are in contact with the inner dielectric spacers 174 but spaced apart from the inner dielectric spacers 172. As mentioned above, the inner dielectric spacers 174 each has the thickness T3 (see FIG. 8B) greater than the thickness T4 (see FIG. 8B) of the inner dielectric spacers 172. As such, a portion of the gate structure 220 in contact with the inner dielectric spacers 172 has a width W1 greater than a width W2 of another portion of the gate structure 220 in contact with the inner dielectric spacers 174.

Each of the channel layers 124a has a length La greater than a length Lb of each of the channel layers 124b. Further, the second source/drain epitaxial structures 185 each have protruding portions extending to the channel layers 124b. As such, the protruding portions of the second source/drain epitaxial structures 185 are in contact with top surface and/or bottom surface 172b of the inner dielectric spacers 172 while the first source/drain epitaxial structures 180 are spaced apart from the top surface 172t and/or bottom surface of the inner dielectric spacers 172.

In FIG. 17A, the semiconductor device 100a further includes the isolation structures 140 surrounding the protruding portion 112 of the substrate 110. The epitaxial isolation structures 190 are in contact with the isolation structures 140.

In some embodiments, the bottom transistor Tb is a p-type transistor, and the top transistor Tt is an n-type transistor. That is, the first source/drain epitaxial structures 180 and the epitaxial layers 192 are p-type, and the second source/drain epitaxial structures 185 and the epitaxial layers 194 are n-type. In some other embodiments, the bottom transistor Tb is an n-type transistor, and the top transistor Tt is a p-type transistor. That is, the first source/drain epitaxial structures 180 and the epitaxial layers 192 are n-type, and the second source/drain epitaxial structures 185 and the epitaxial layers 194 are p-type. In some embodiments, the epitaxial layers 192 and the first source/drain epitaxial structures 180 have the same conductivity type but include different materials. For example, the epitaxial layers 192 include Si:B, and the first source/drain epitaxial structures 180 include SiGe:B.

Figure 18:
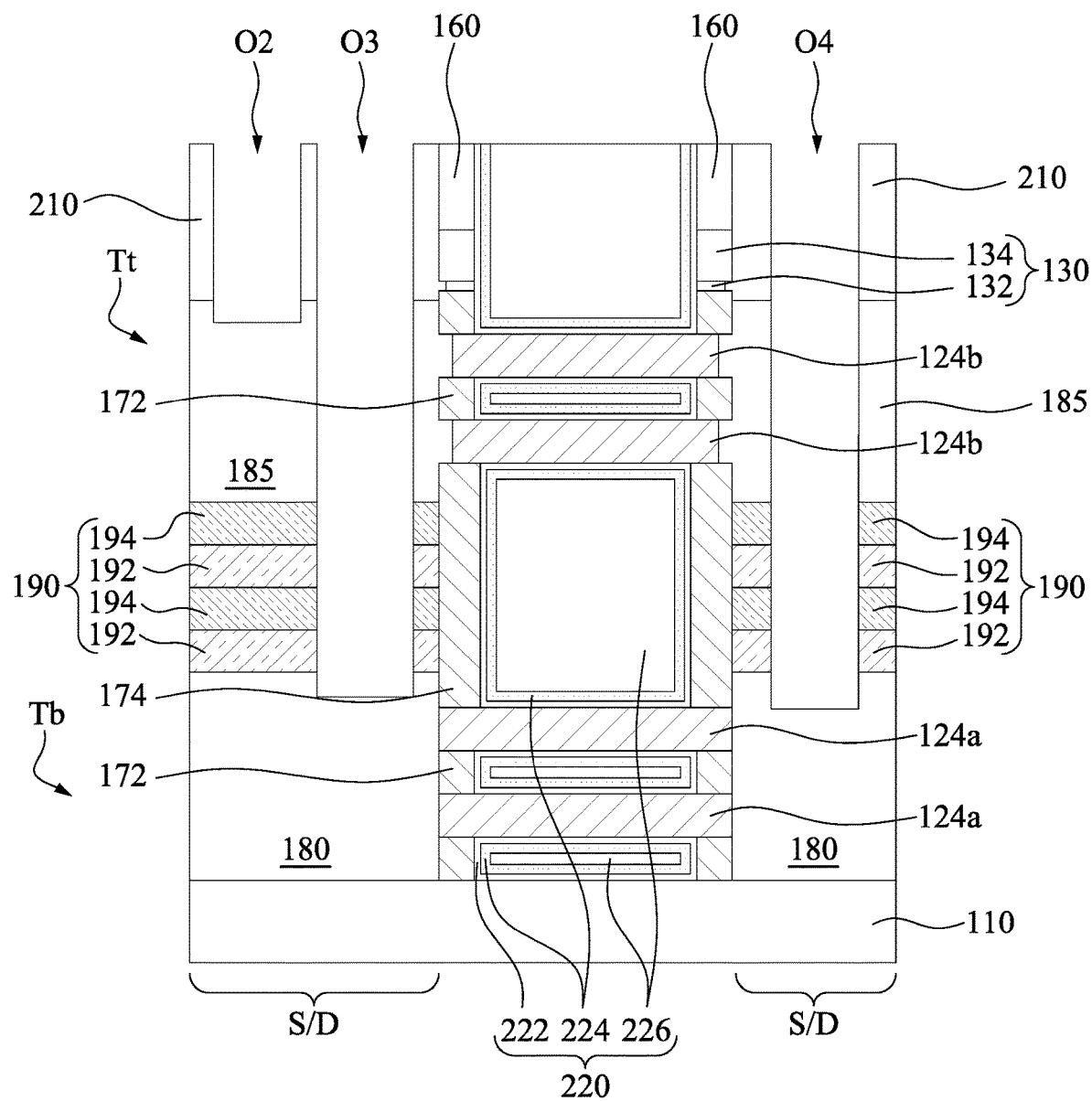
FIGS. 18-20 illustrate perspective views and cross-sectional views of intermediate stages in the formation of an integrated circuit structure (or a semiconductor device) in accordance with some embodiments of the present disclosure.
Figure 19:
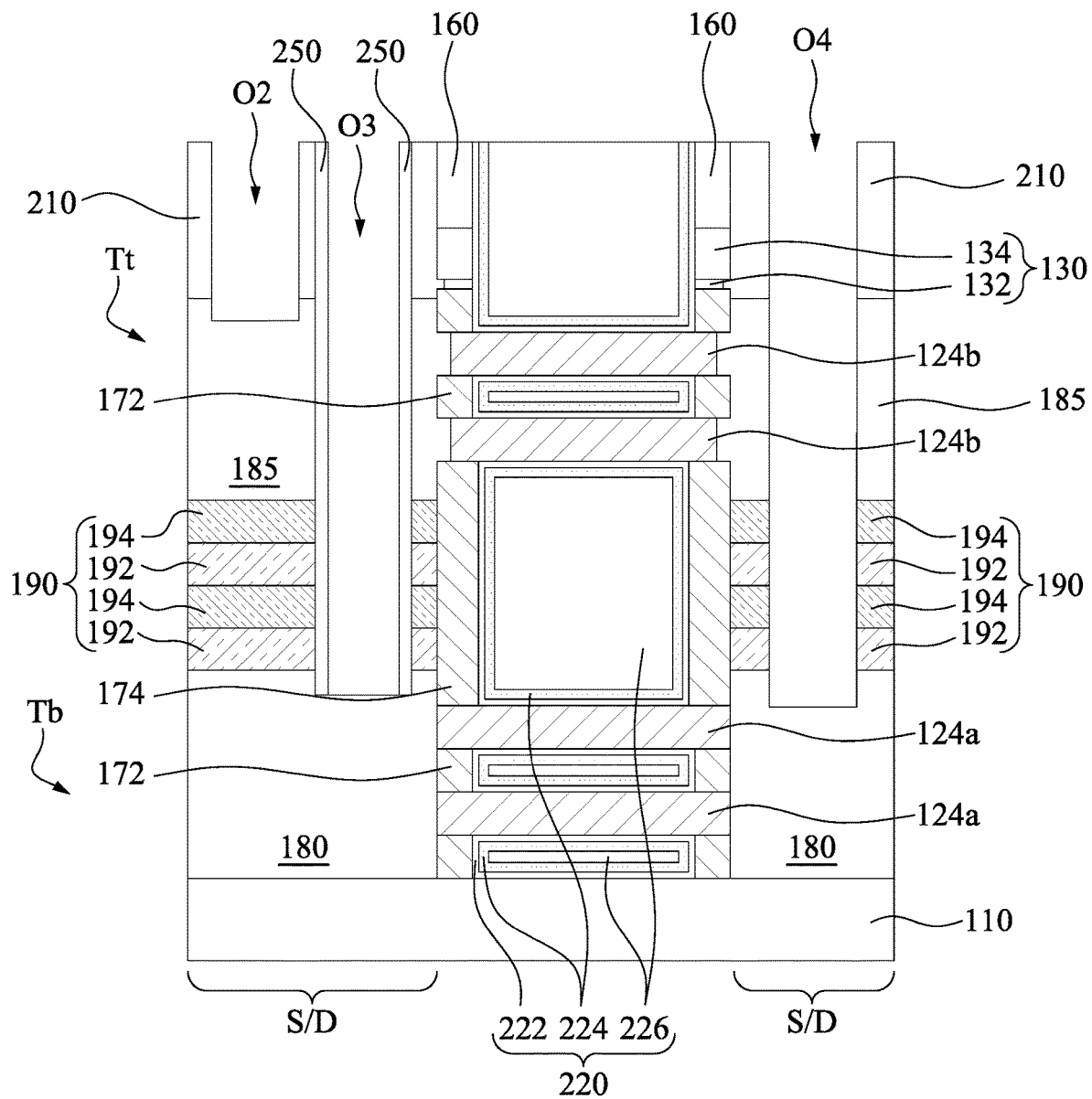
Figure 20:
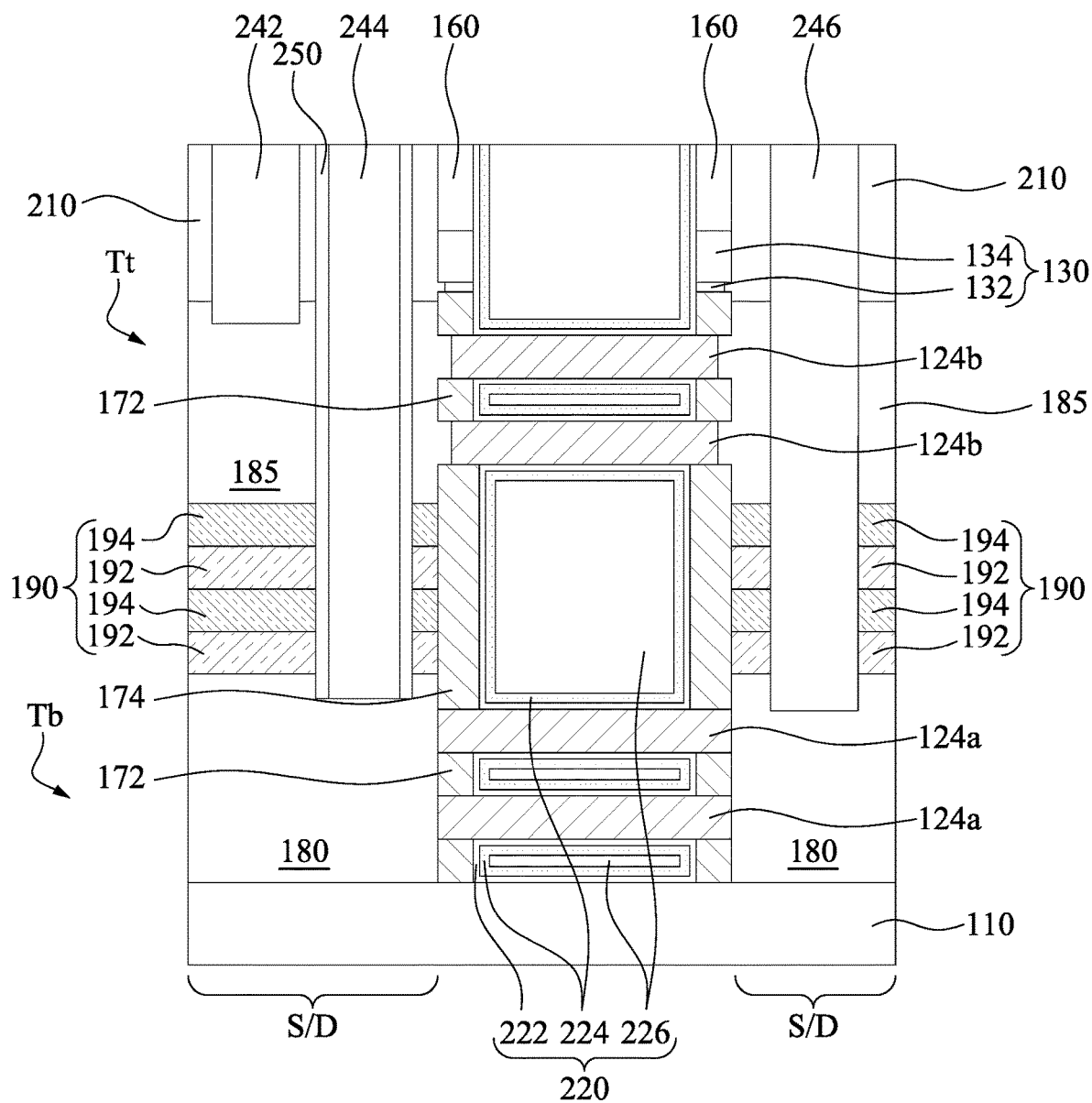
Figure 21:
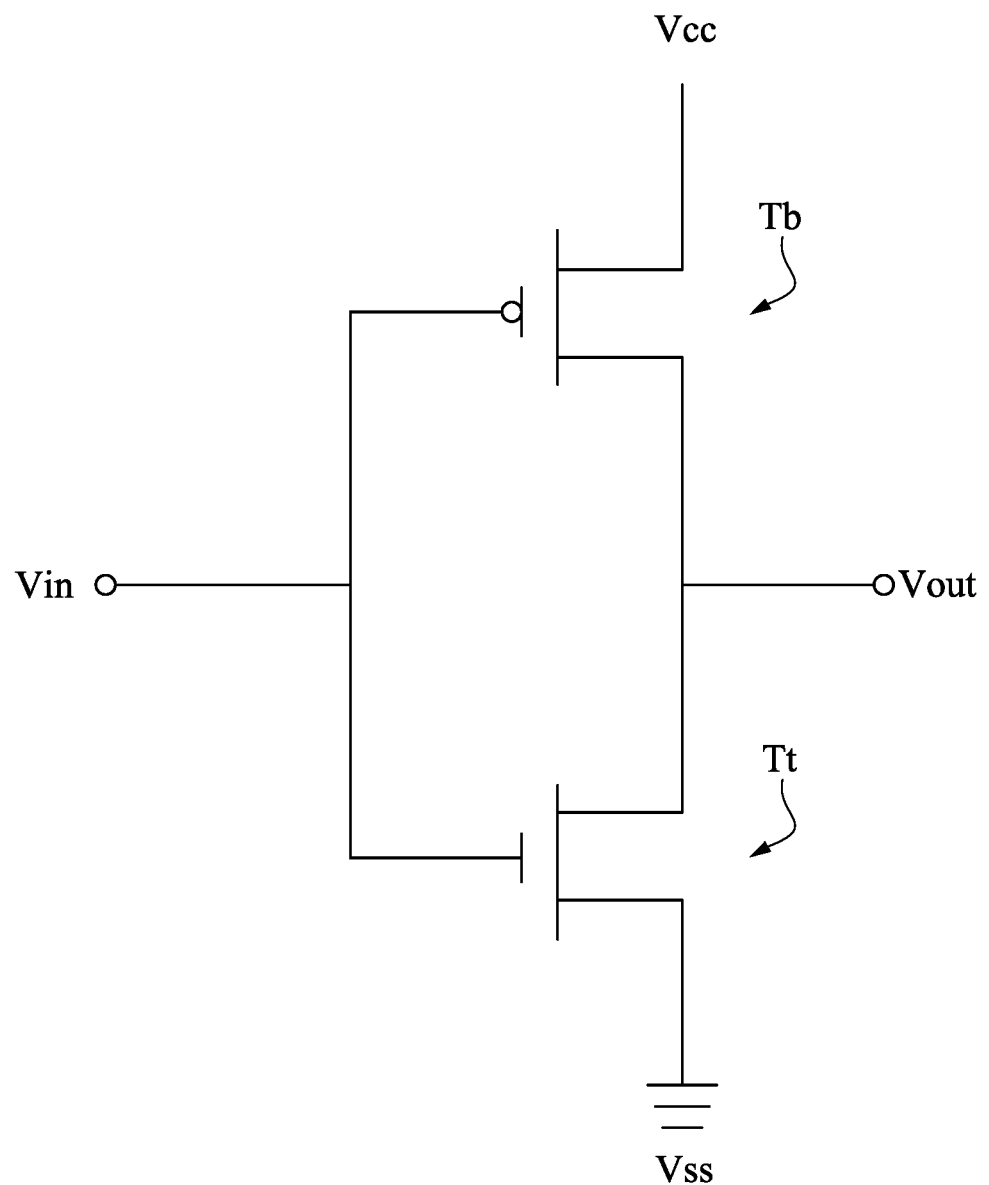
FIG. 21 is a circuit diagram of the inverter circuit.

In some embodiments, the semiconductor device 100a is applied to an inverter circuit. FIGS. 18-20 illustrate perspective views and cross-sectional views of intermediate stages in the formation of an integrated circuit structure (or a semiconductor device) 100b in accordance with some embodiments of the present disclosure, and FIG. 21 is a circuit diagram of the inverter circuit. Reference is made to FIG. 18. After the formation of the gate structure 220 as shown in FIGS. 17A and 17B, openings O2, O3, and O4 are formed in the ILD layer 210. The opening O2 exposes one of the second source/drain epitaxial structures 185, and both the openings O3 and O4 pass through the second source/drain epitaxial structures 185 and the epitaxial isolation structure 190 to the first source/drain epitaxial structures 180.

Reference is made to FIG. 19. A spacer layer 250 is formed on inner sidewalls of the opening O3. The formation of the spacer layer 250 may include blanket forming a dielectric layer and then performing etching operations to remove the horizontal portions of the dielectric layer. The remaining vertical portions of the dielectric layer form the spacer layer 250. The spacer layer 250 includes one or more dielectric materials, such as silicon oxide, silicon nitride, silicon oxynitride, SiCN, SiC$_x$O$_y$N$_z$, high-k dielectric materials, or combinations thereof. The spacer layer 250 can be formed using a deposition method, such as plasma enhanced chemical vapor deposition (PECVD), plasma enhanced atomic layer deposition (PEALD), or the like.

Reference is made to FIG. 20. Contacts 242, 244, and 246 are respectively formed in the openings O2, O3, and O4. The contact 242 is connected to one of the second source/drain epitaxial structures 185. The contact 244 is connected to one of the first source/drain epitaxial structures 180. Further, due to the spacer layer 250, the contact 244 is electrically isolated from the second source/drain epitaxial structure 185. The contact 246 is connected to another one of the first source/drain epitaxial structures 180 and another one of the second source/drain epitaxial structures 185. Formation of the contacts 242, 244, and 246 includes depositing one or more conductive (e.g., metal) materials overfilling the openings O2, O3, and O4, and then performing a CMP process to remove excessive metal materials outside the openings O2, O3, and O4.

Reference is made to FIGS. 20 and 21. The integrated circuit structure (i.e., the inverter) 100b includes the bottom transistor Tb (e.g., the p-type transistor) and the top transistor Tt (e.g., the n-type transistor). The drains of the bottom transistor Tb and the top transistor It are connected through the contact 246, and a Vout signal line can be connected to the contact 246. The gates (i.e., the gate structure 220) of the bottom transistor Tb and the top transistor Tt are connected, and the gate structure 220 can be connected to a Vin signal line. A Vcc signal line can be connected to the source of the bottom transistor Tb through the contact 244, and a Vss signal line can be connected to the source of the top transistor Tt through the contact 242.

Figure 22:
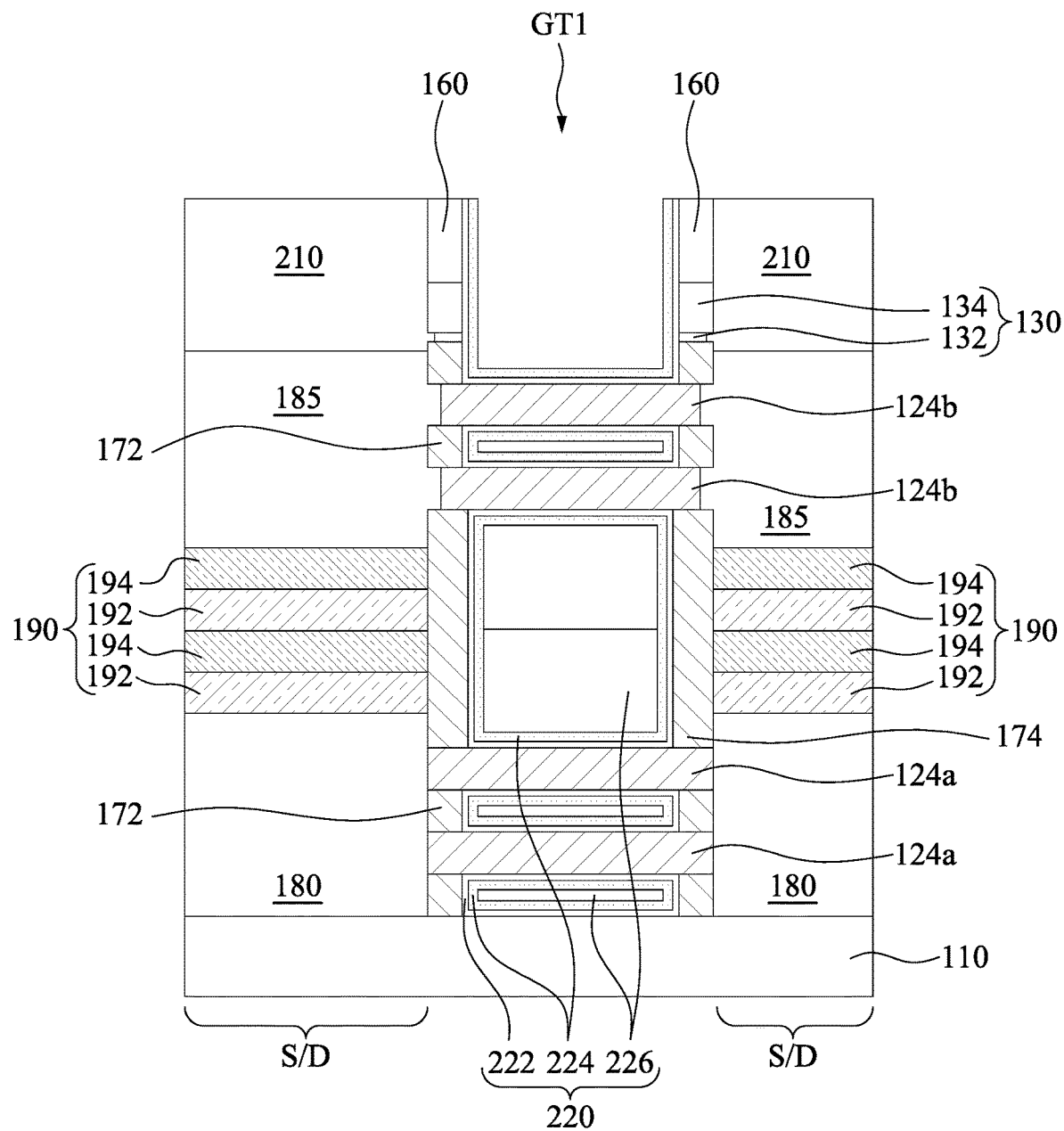
FIGS. 22-25 illustrate cross-sectional views of intermediate stages in the formation of an integrated circuit structure (or a semiconductor device) in accordance with some embodiments of the present disclosure.
Figure 23:
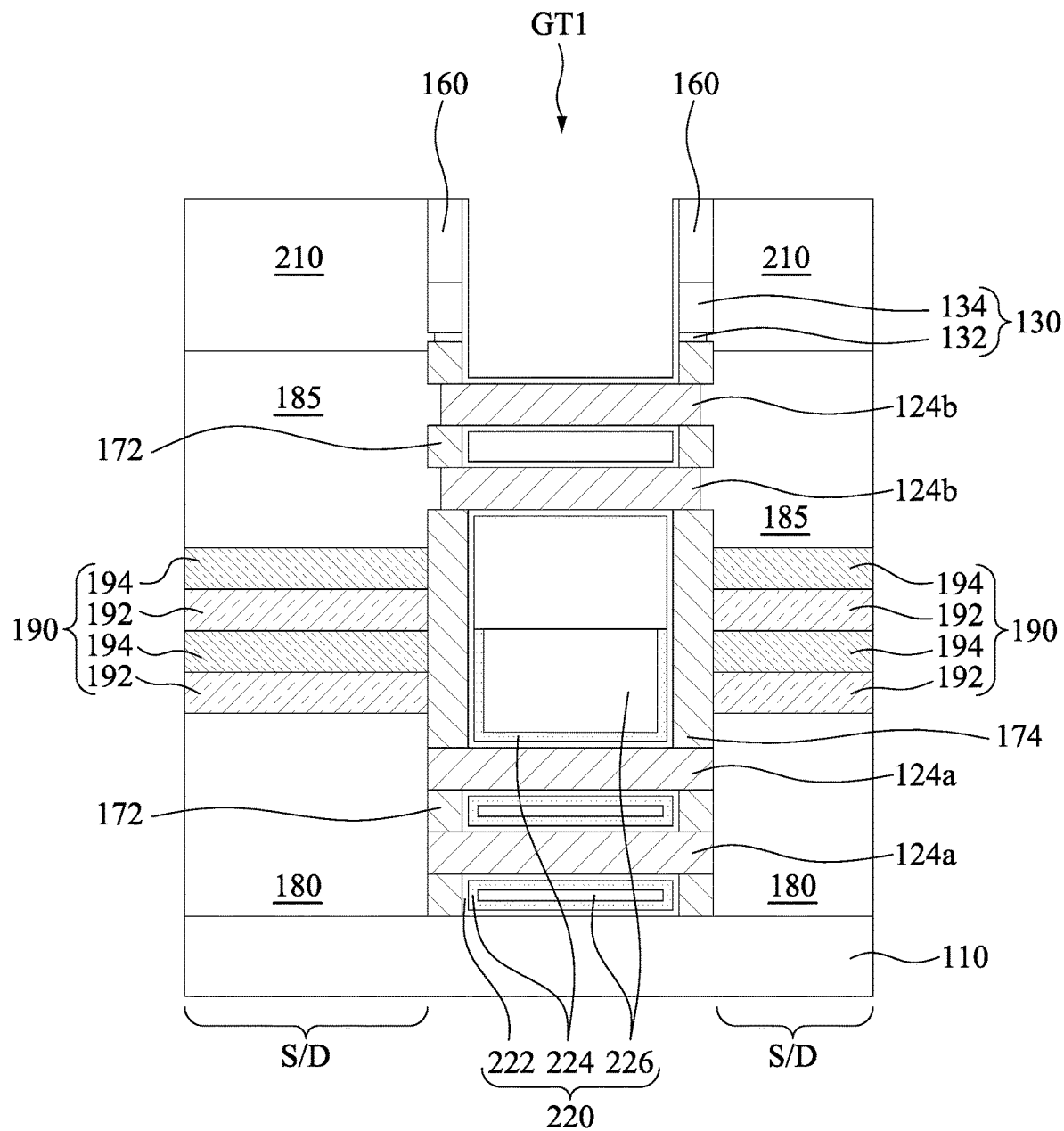
Figure 24:
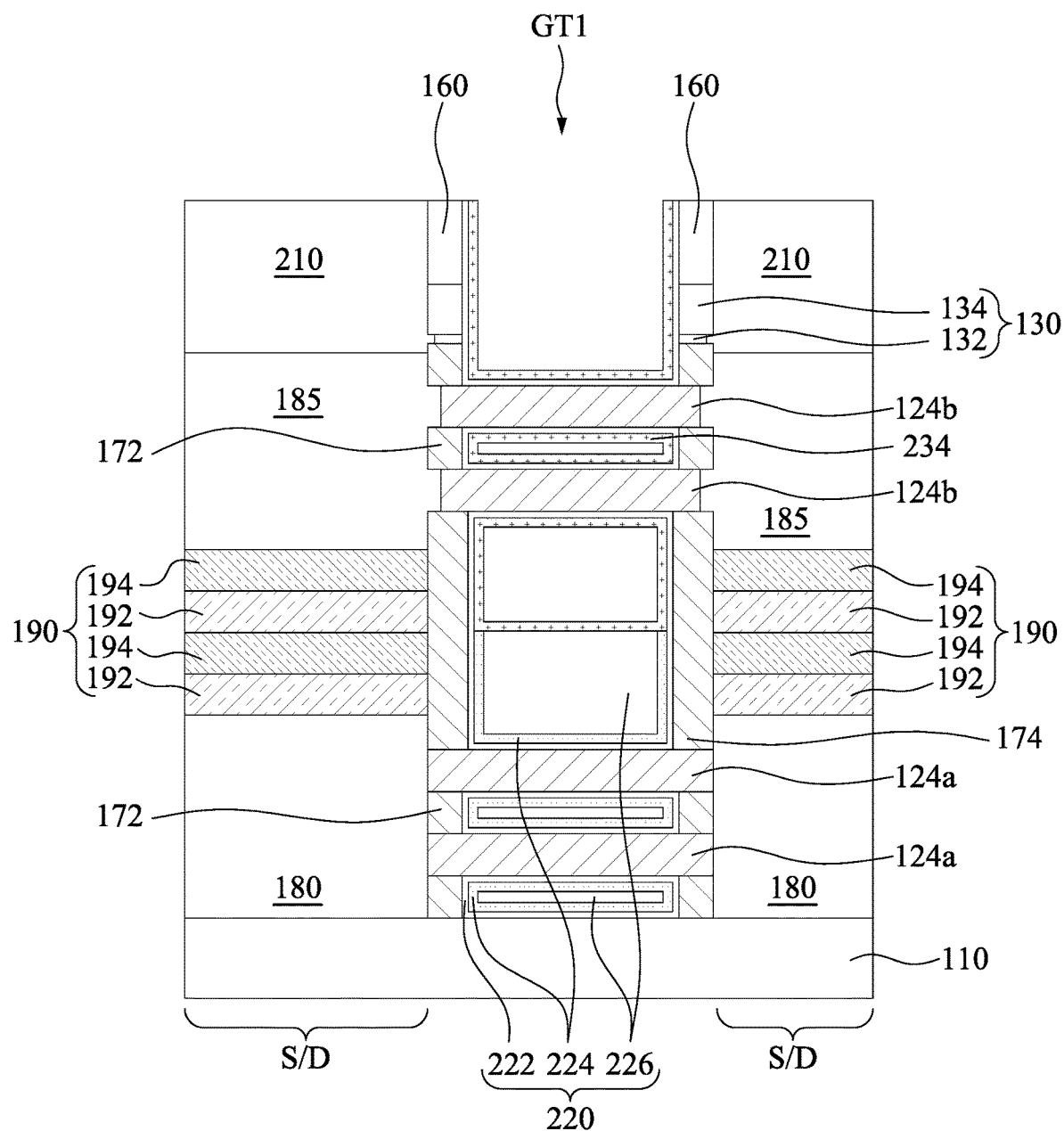
Figure 25:
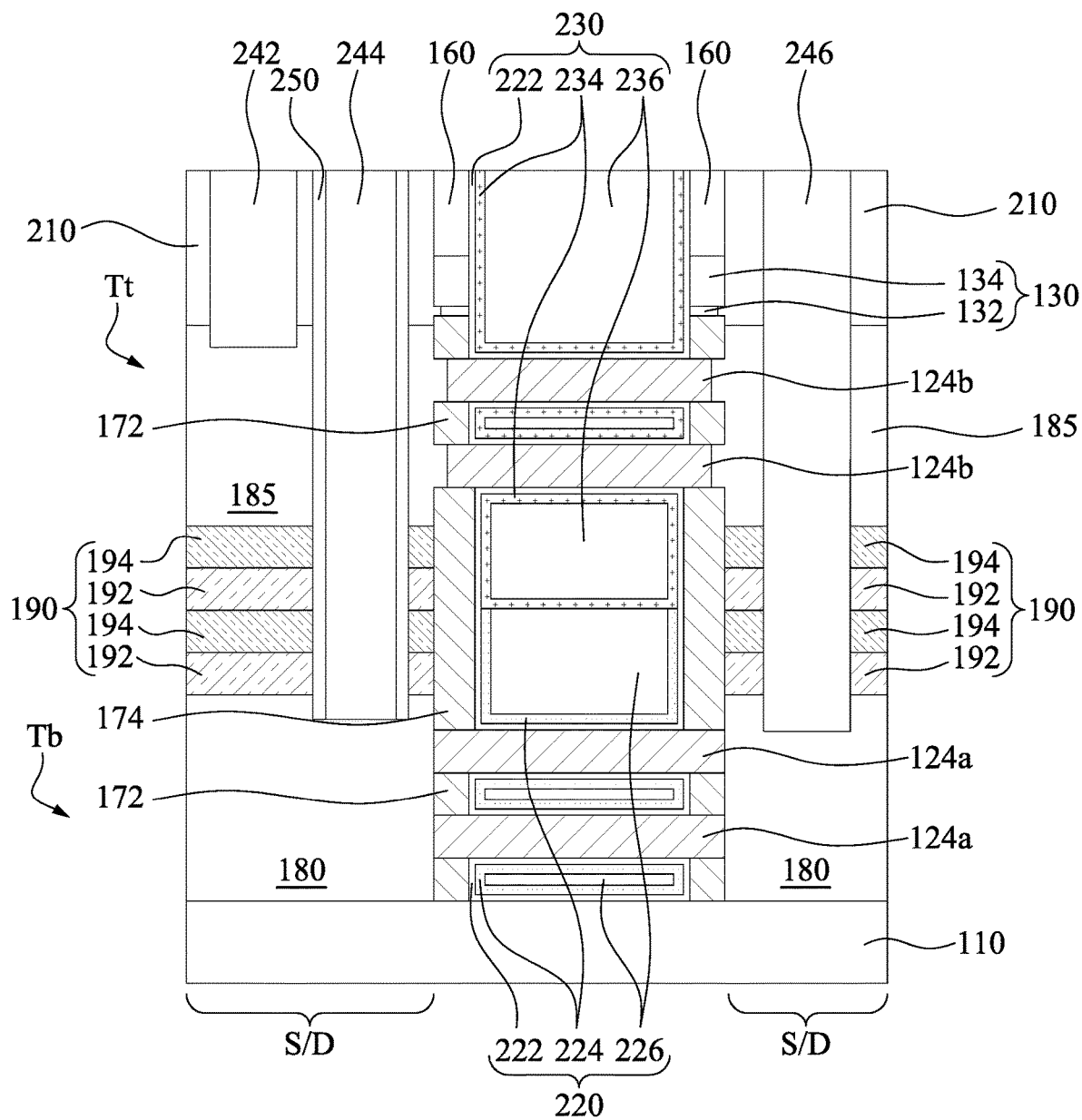

FIGS. 22-25 illustrate cross-sectional views of intermediate stages in the formation of an integrated circuit structure (or a semiconductor device) 100c in accordance with some embodiments of the present disclosure. In some embodiments, the bottom transistor Tb and the top transistor Tt have different gate structures. For example, as shown in FIG. 17B, the work function metal layer 224 of the gate structure 220 is P-metal, and has a p-type work function. After the formation of the gate structure 220 of FIG. 17B, the fill metal 226 is etched back by using an etching process as shown in FIG. 22, and top portions of the work function metal layer 224 are exposed. Next, in FIG. 23, the top portions of the work function metal layer 224 are removed by using an etching process, and top portions of the gate dielectric layer 222 are exposed. After the etching process in FIG. 23, another work function metal layer 234 is deposited in the gate trench GT1 and over the work function metal layer 224 and the fill metal 226 as shown in FIG. 24. As such, the work function metal layer 234 is in contact with the work function metal layer 224 and the fill metal 226. Next, another fill metal 236 is filled in the remaining gate trench GT1 as shown in FIG. 25. Thereafter, the contacts 242, 244, 246 and the spacer layer 250 are formed in the ILD layer 220.

The semiconductor device 100c includes a bottom transistor Tb, a top transistor Tt, and epitaxial isolation structures 190. The top transistor Tt is over the bottom transistor Tb. The bottom transistor Tb includes the channel layers 124a, the first source/drain epitaxial structures 180 on opposite sides of the channel layers 124a and connected to the channel layers 124a, and the gate structure 220 wrapping around the channel layers 124a. The top transistor Tt includes the channel layers 124b, the second source/drain epitaxial structures 185 on opposite sides of the channel layers 124b and connected to the channel layers 124b, and a (metal) gate structure 230 wrapping around the channel layers 124b. The gate structure 230 includes the gate dielectric layer 222, the work function metal layer 234, and the fill metal 236. The work function metal layer 224 is P-metal, and the work function metal layer 234 is N-metal, or vise versa. Each of the epitaxial isolation structures 190 is between one of the first source/drain epitaxial structures 180 and one of the second source/drain epitaxial structures 185 to electrically isolate the first source/drain epitaxial structure 180 from the second source/drain epitaxial structure 185.

Figure 30:
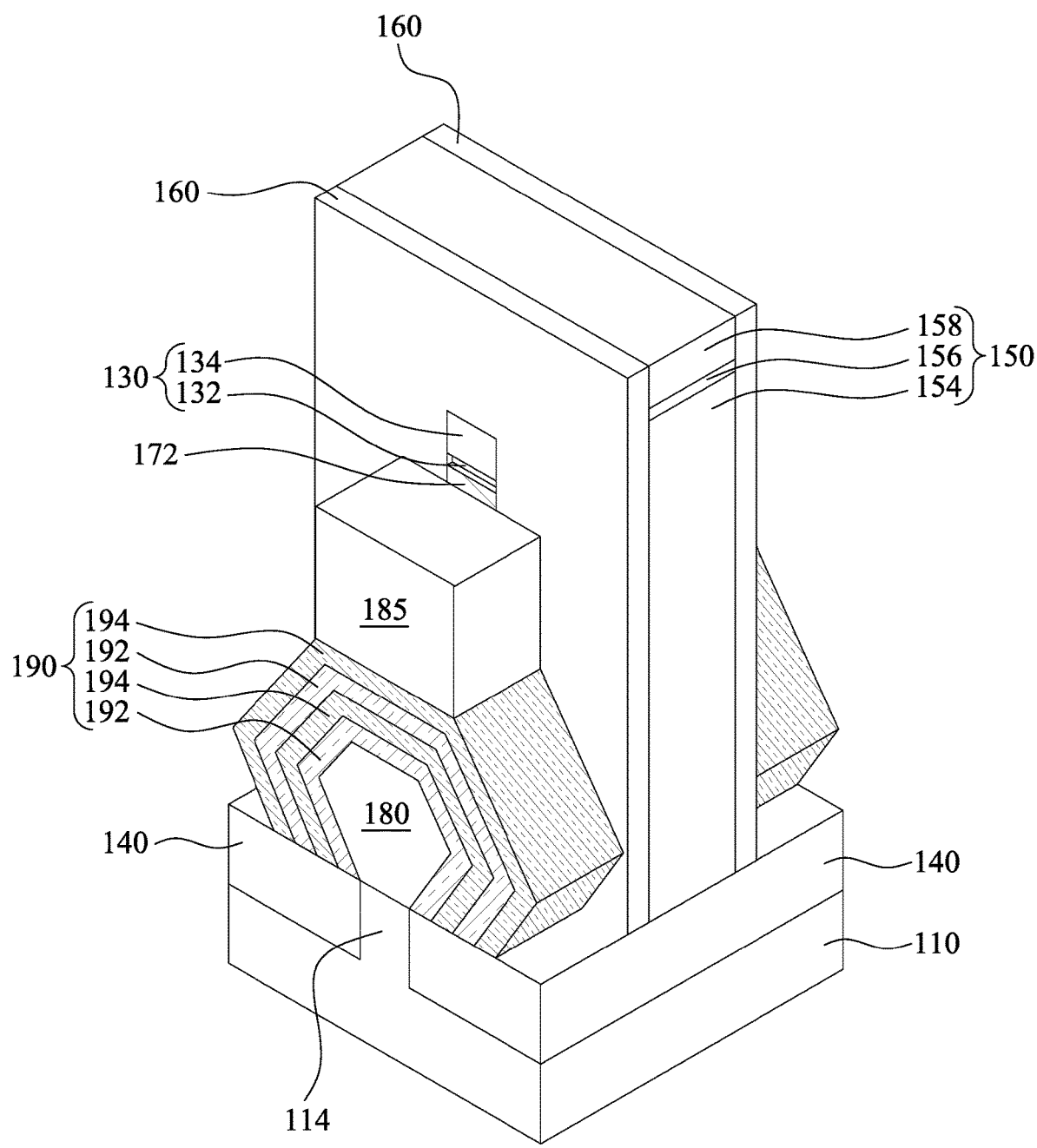
Figure 31A:
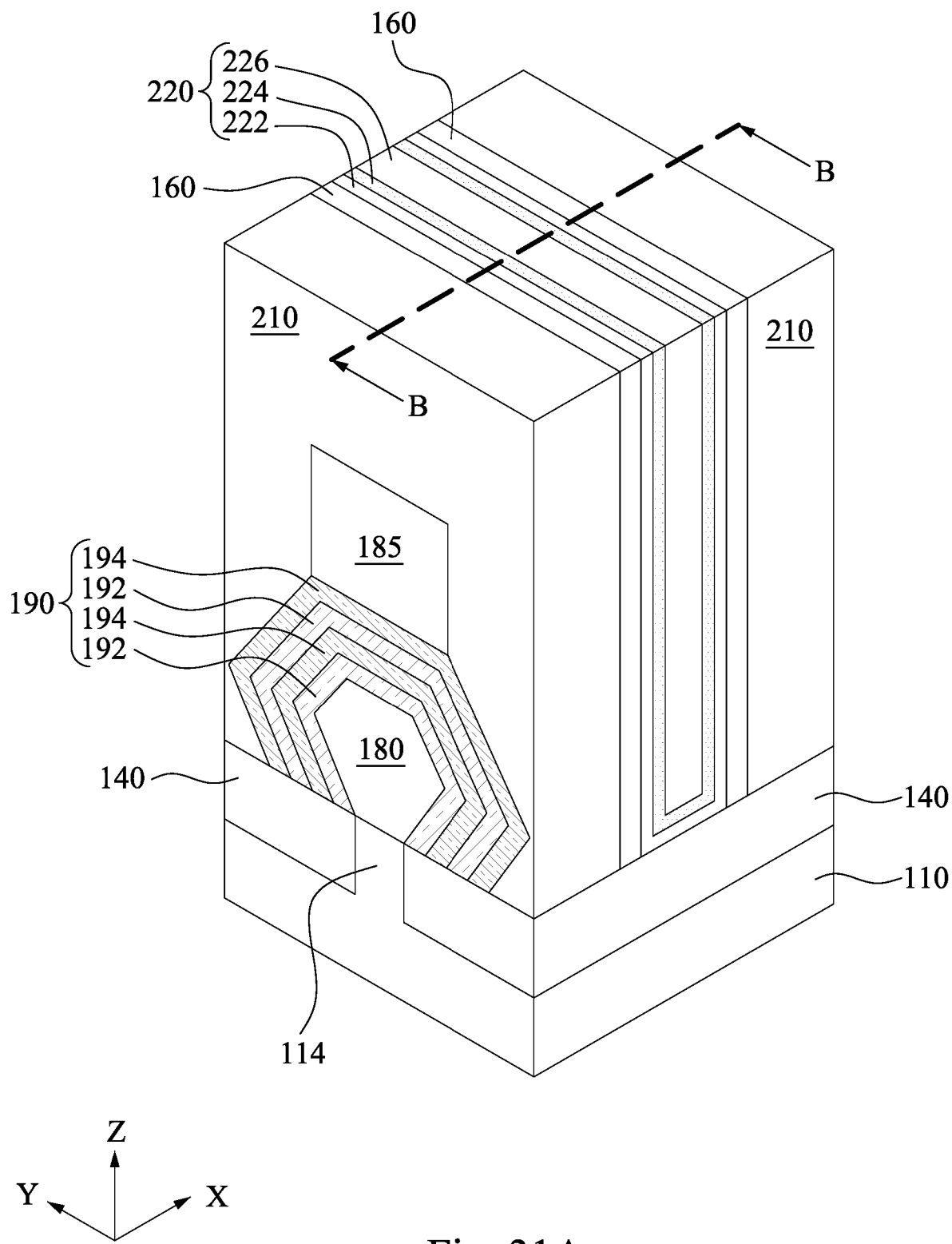
Figure 31B:
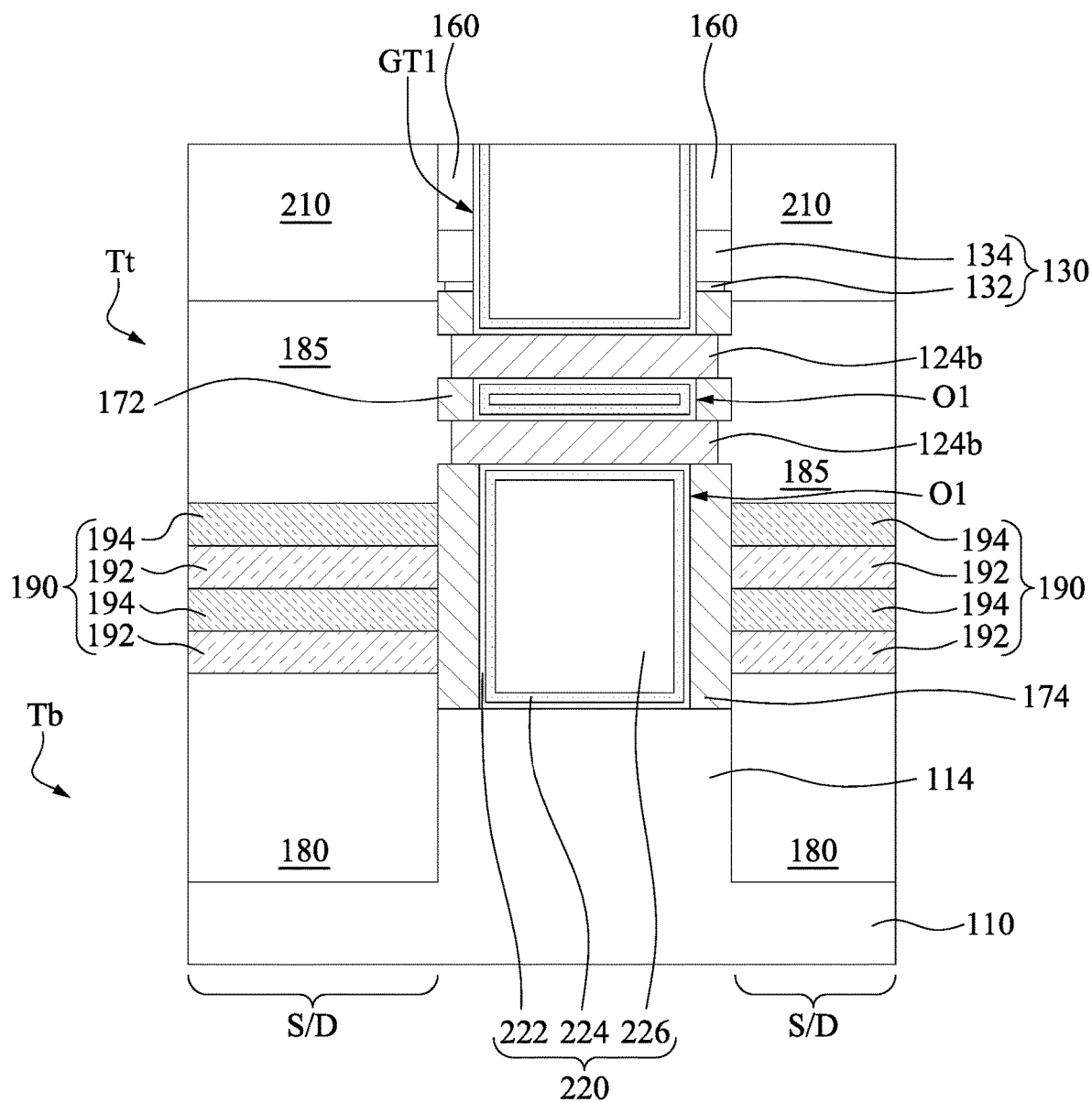
Figure 32:
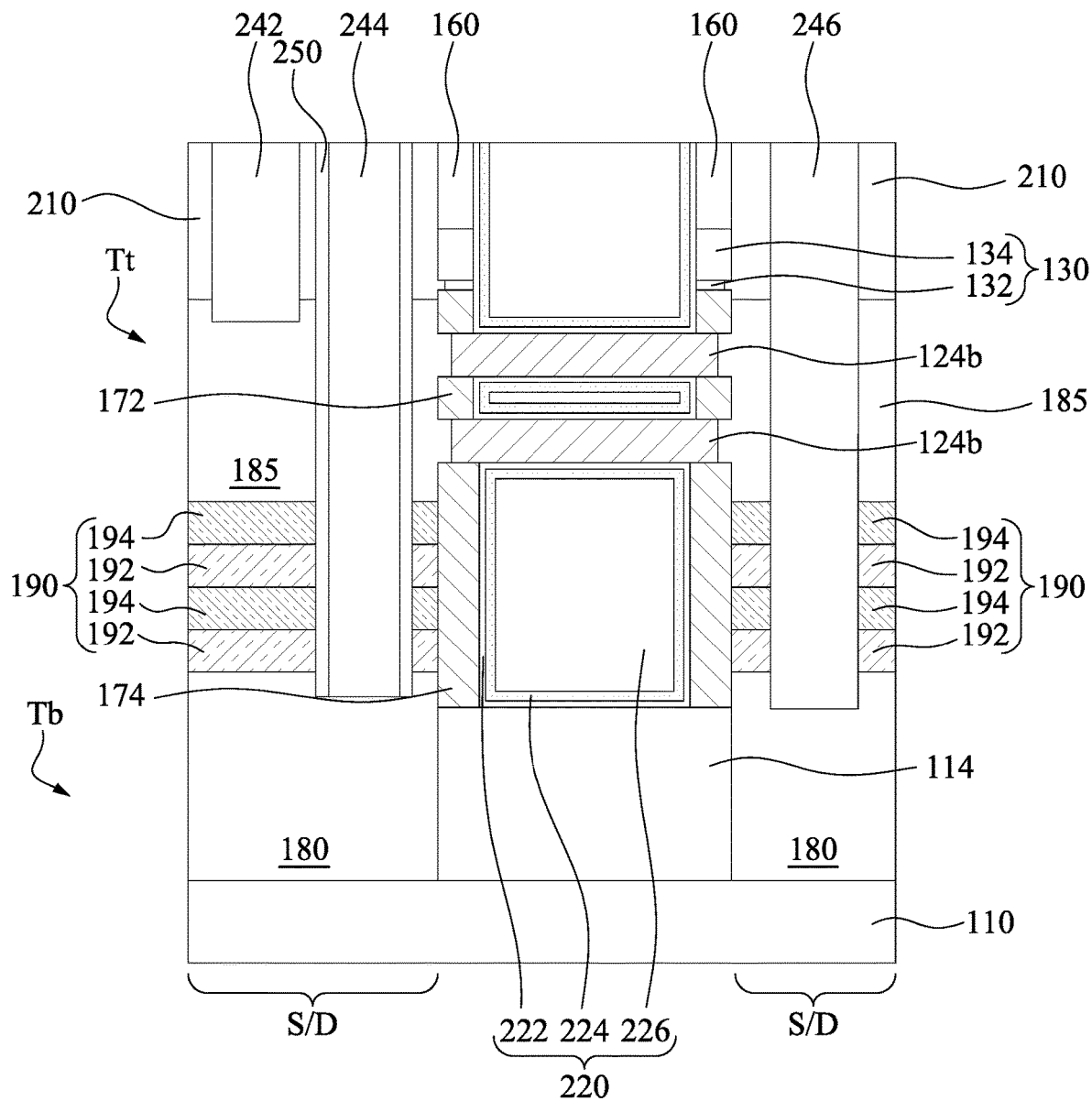

FIGS. 26-32 illustrate perspective views and cross-sectional views of intermediate stages in the formation of an integrated circuit structure (or a semiconductor device) 100d in accordance with some embodiments of the present disclosure. In some embodiments, the semiconductor device in FIG. 32 is a CFET device applied to an inverter circuit. In addition to the integrated circuit structure, FIGS. 26-31A depict X-axis, Y-axis, and Z-axis directions. The formed devices include a p-type transistor (such as a p-type GAA FET) and an n-type transistor (such as an n-type FAA FET) in accordance with some exemplary embodiments. Throughout the various views and illustrative embodiments, like reference numbers are used to designate like elements. It is understood that additional operations can be provided before, during, and after the processes shown by FIGS. 26-32, and some of the operations described below can be replaced or eliminated, for additional embodiments of the method. The order of the operations/processes may be interchangeable.

Figure 26:
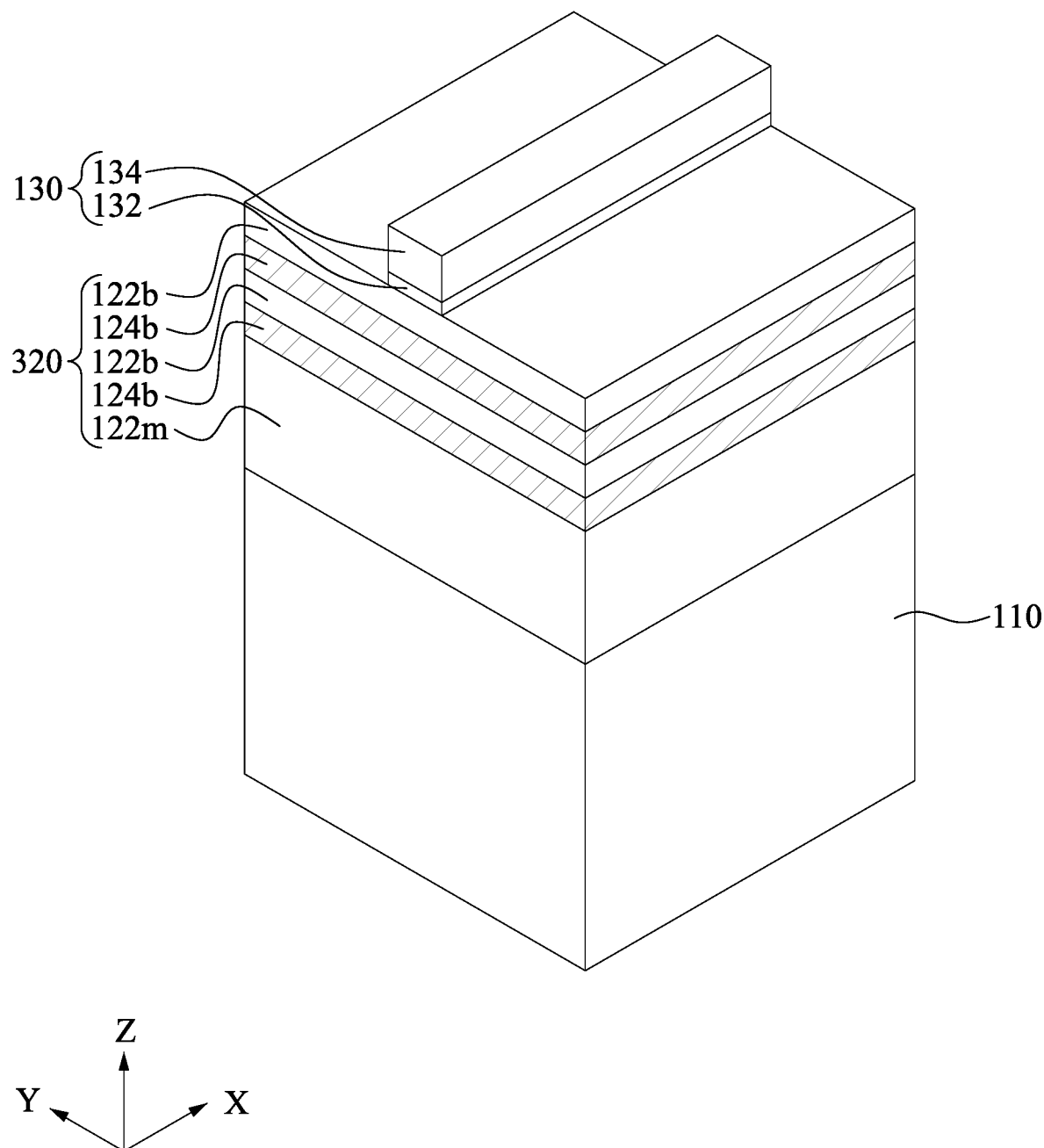
FIGS. 26-32 illustrate perspective views and cross-sectional views of intermediate stages in the formation of an integrated circuit structure (or a semiconductor device) in accordance with some embodiments of the present disclosure.

Referring to FIG. 26, an epitaxial stack 320 is formed over a substrate 110. The epitaxial stack 320 includes epitaxial layers 122b, 122m of a first composition interposed by epitaxial layers 124b of a second composition. Further, a HM layer 130 including an oxide layer 132 and a nitride layer 134 is formed over the epitaxial stack 320. Materials, configurations, dimensions, processes and/or operations regarding the substrate 110 are similar to or the same as the substrate 110 of FIG. 1. Materials, configurations, dimensions, processes and/or operations regarding the epitaxial layers 122b, 122m are similar to or the same as the epitaxial layers 122b, 122m of FIG. 1. Materials, configurations, dimensions, processes and/or operations regarding the HM layer 130 are similar to or the same as the HM layer 130 of FIG. 1.

Figure 27:
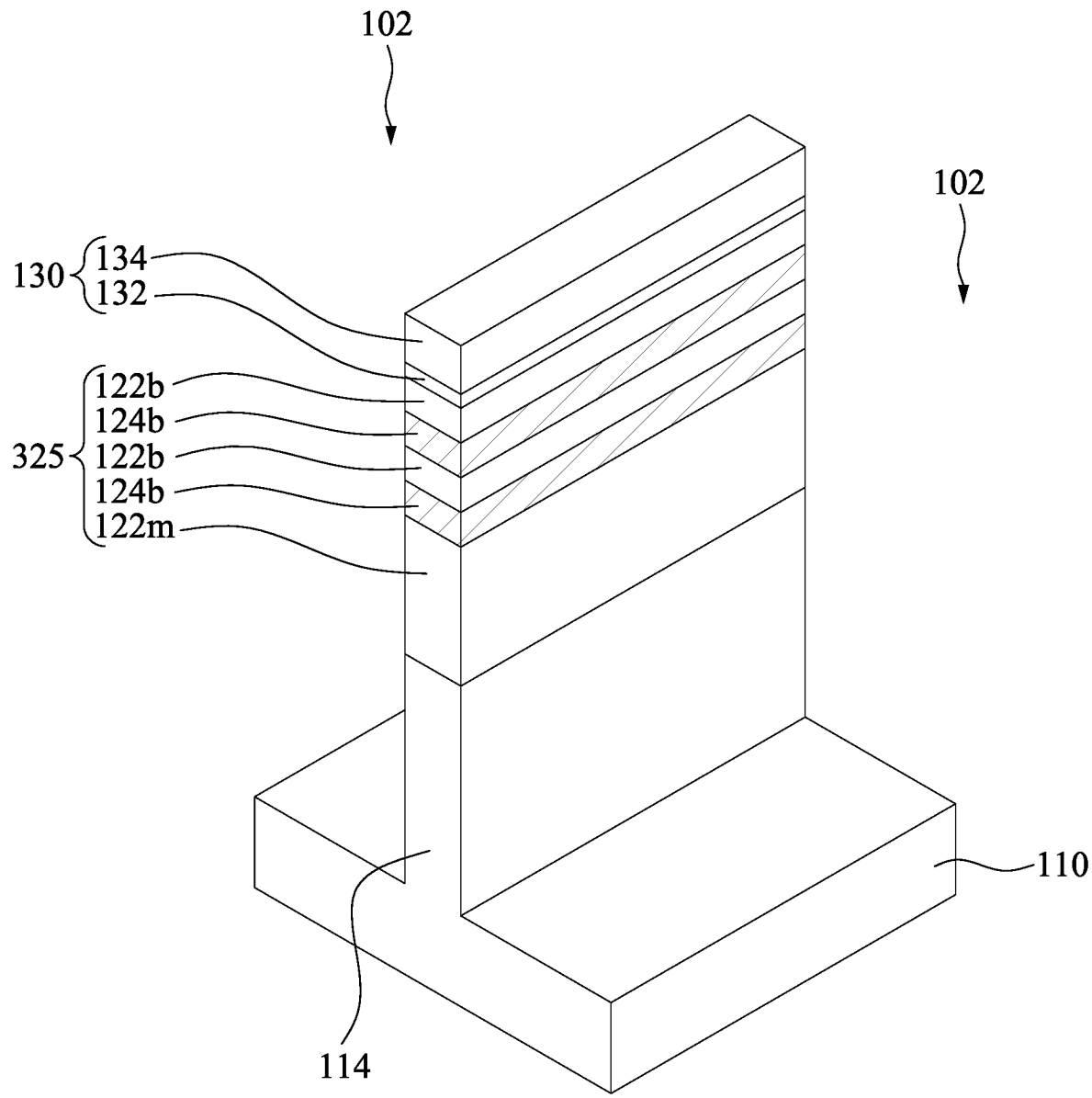

Referring to FIG. 27, at least one fin structure 325 extending from the substrate 110 is formed. Further, the substrate 110 is patterned to form a semiconductor fin 114. The fin structure 325 portions of each of the epitaxial layers of the epitaxial stack including epitaxial layers 122b, 122m and 124b. Materials, configurations, dimensions, processes and/or operations regarding the fin structure 325 are similar to or the same as the fin structure 125 of FIG. 2.

Figure 28:
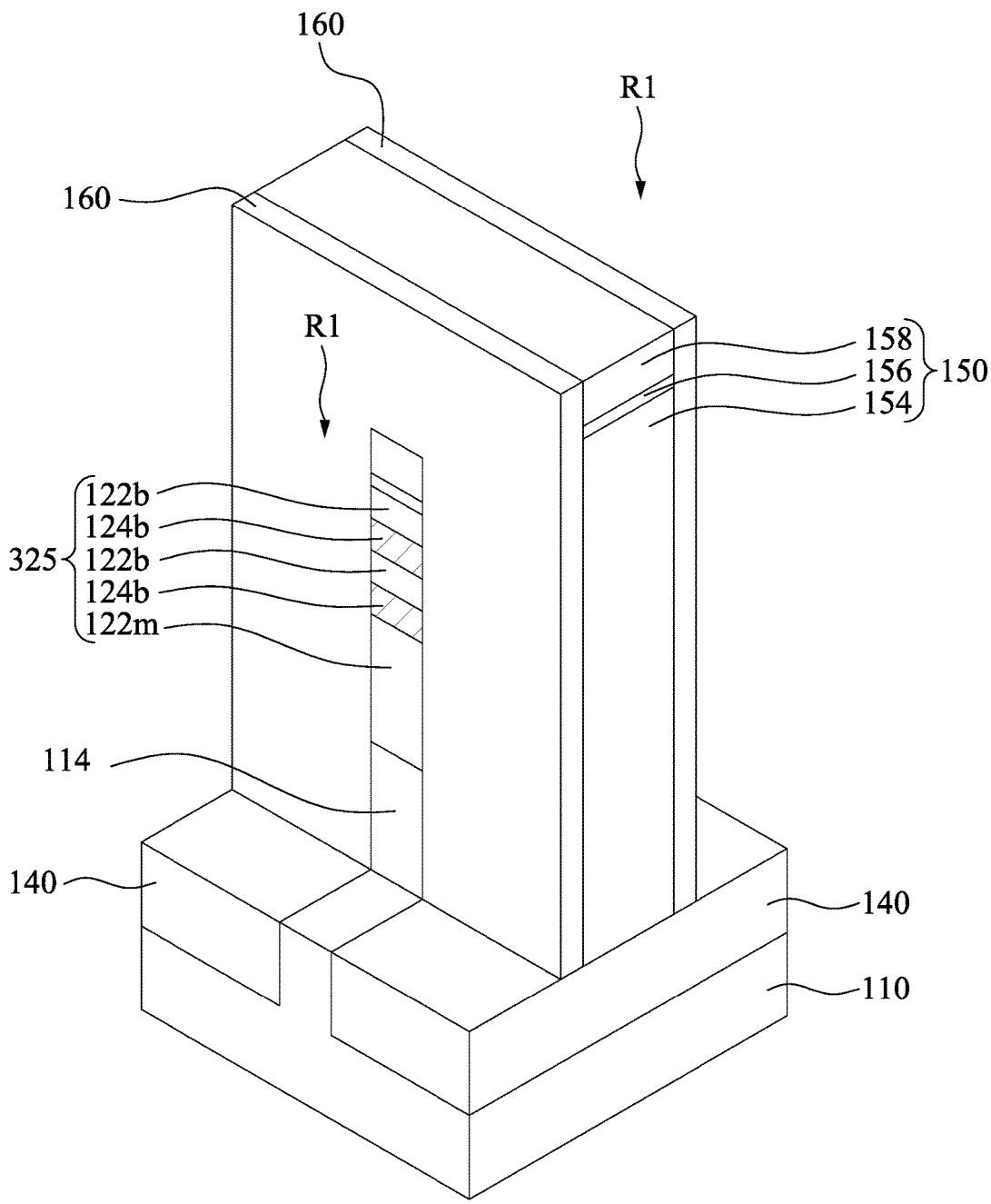

Reference is made to FIG. 28. Isolation structures 140 are formed to surround a bottom portion of the semiconductor fin 114. Materials, configurations, dimensions, processes and/or operations regarding the isolation structures 140 are similar to or the same as the isolation structures 140 of FIG. 3. At least one dummy gate structure 150 is formed over the substrate 110 and is partially disposed over the fin structure 325 and the semiconductor fin 114. The dummy gate structure 150 includes a dummy gate electrode layer 154 and a hard mask (e.g., an oxide layer 156 and a nitride layer 158). Materials, configurations, dimensions, processes and/or operations regarding the dummy gate structure 150 are similar to or the same as the dummy gate structure 150 of FIG. 4.

After formation of the dummy gate structure 150 is completed, gate spacers 160 are formed on sidewalls of the dummy gate structure 150. Materials, configurations, dimensions, processes and/or operations regarding the gate spacers 160 are similar to or the same as the gate spacers 160 of FIG. 5. Next, exposed portions of the HM layer 130, the fin structure 325, and the semiconductor fin 114 that extend laterally beyond the gate spacers 160 are etched by using, for example, an anisotropic etching process that uses the dummy gate structure 150 and the gate spacers 160 as an etch mask, resulting in recesses R1 into the fin structure 325. Dimensions, processes and/or operations regarding the etching process are similar to or the same as the etching process of FIG. 6.

Figure 29:
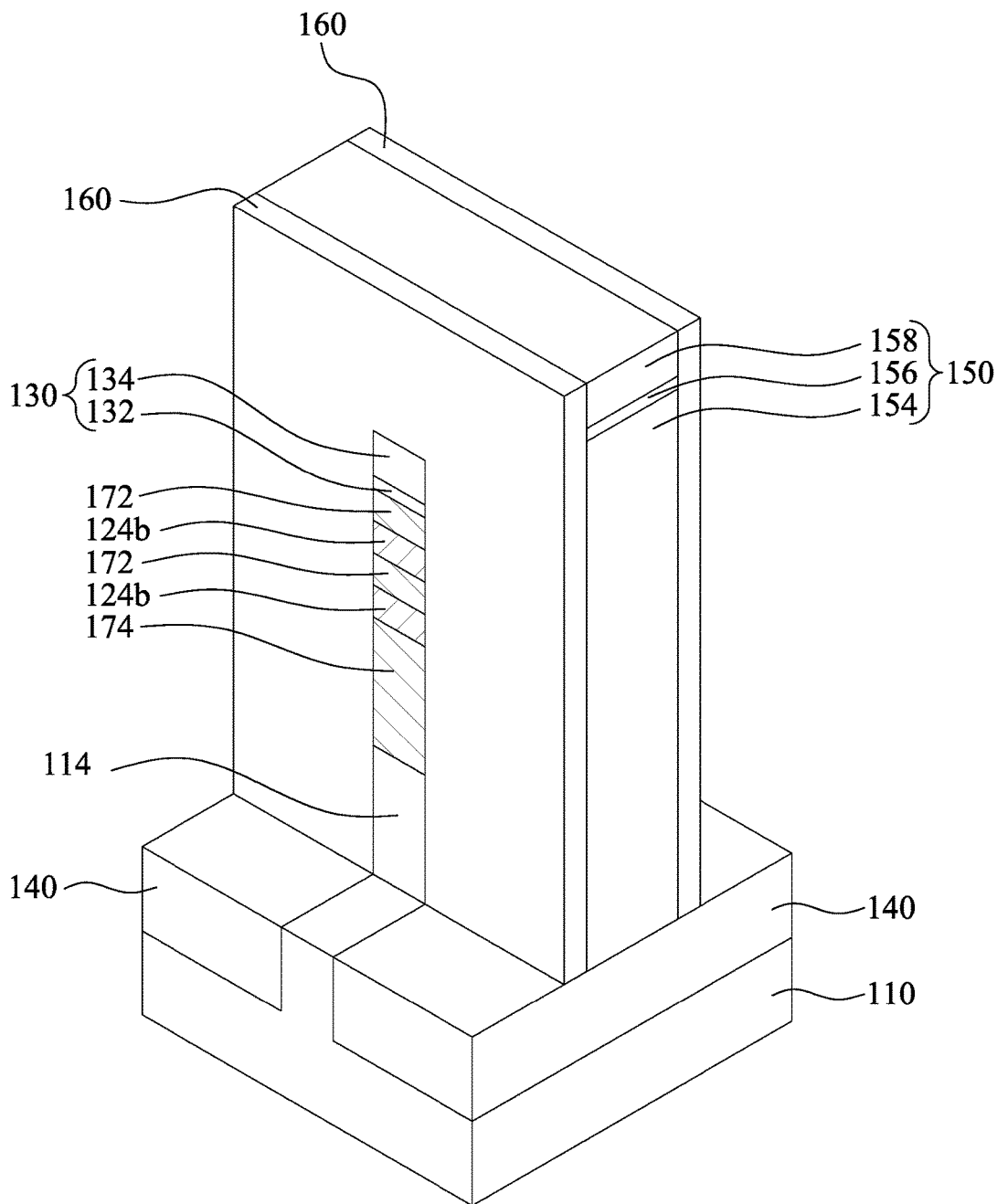

Reference is made to FIG. 29. Recesses are formed on sidewalls of the epitaxial layers 122b and 122m (see FIG. 28), and inner dielectric spacers 172 and 174 are formed in the recesses. Materials, configurations, dimensions, processes and/or operations regarding the inner dielectric spacers 172 and 174 are similar to or the same as the inner dielectric spacers 172 and 174 of FIGS. 7A-8B.

Reference is made to FIG. 30. First source/drain epitaxial structures 180, epitaxial isolation structure 190, and second source/drain epitaxial structures 185 are sequentially formed over the source/drain regions of the fin structure 325 (see FIG. 28) and the semiconductor fin 114. Materials, configurations, dimensions, processes and/or operations regarding the first source/drain epitaxial structures 180 are similar to or the same as the first source/drain epitaxial structures 180 of FIGS. 9A-9B. Materials, configurations, dimensions, processes and/or operations regarding the epitaxial isolation structure 190 are similar to or the same as the epitaxial isolation structure 190 of FIGS. 10A-13B. Materials, configurations, dimensions, processes and/or operations regarding the second source/drain epitaxial structures 185 are similar to or the same as the second source/drain epitaxial structures 185 of FIGS. 14A-15B.

Reference is made to FIGS. 31A and 31B, where FIG. 31B is a cross-sectional view taken along line B-B of FIG. 31A. An interlayer dielectric (ILD) layer 210 is formed on the substrate 110. In some embodiments, a contact etch stop layer (CESL) is also formed prior to forming the ILD layer 210. Materials, configurations, dimensions, processes and/or operations regarding the ILD layer 210 are similar to or the same as the ILD layer 210 of FIGS. 16A-16B.

After depositing the ILD layer 210, a planarization process may be performed to remove excessive materials of the ILD layer 210. In some embodiments, the CMP process also removes hard mask layers 156 and 158 (as shown in FIG. 30) and exposes the dummy gate electrode layer 154. Thereafter, the dummy gate electrode layer 154 (as shown in FIG. 30) is removed first, and then the epitaxial layers (i.e., sacrificial layers) 122b and 122m (as shown in FIG. 28) are removed to form a gate trench and openings between the epitaxial layers 124b.

A (metal) gate structure 220 is formed in the gate trench and the openings to cross the semiconductor fin 114 and surround each of the epitaxial layers 124b suspended in the gate trench and the openings. As such, the gate structure 220 is in contact with three faces (top surface and opposite sidewalls) of the semiconductor fin 114 and wraps around each of the epitaxial layers 124b. The gate structure 220 includes a gate dielectric layer 222, a work function metal layer 224 formed around the gate dielectric layer 222, and a fill metal 226. Materials, configurations, dimensions, processes and/or operations regarding the gate structure 220 are similar to or the same as the gate structure 220 of FIGS. 17A-17B.

Reference is made to FIG. 32. In some embodiments, the CFET in FIGS. 31A and 31B can be applied to an inverter circuit. Specifically, contacts 242, 244, and 246 are formed in the ILD layer 210. Further, a spacer layer 250 is formed to surround the contact 244. Materials, configurations, dimensions, processes and/or operations regarding the contacts 242, 244, and 246 and the spacer layer 250 are similar to or the same as the contacts 242, 244, and 246 and the spacer layer 250 of FIGS. 18-20.

The semiconductor device 100d includes a bottom transistor Tb, a top transistor Tt, and epitaxial isolation structures 190. The top transistor Tt is over the bottom transistor Tb. The bottom transistor Tb includes the semiconductor fin 114, the first source/drain epitaxial structures 180 on opposite sides of the semiconductor fin 114 and connected to the semiconductor fin 114, and the gate structure 220 crossing over the semiconductor fin 114. The top transistor Tt includes the channel layers 124b, the second source/drain epitaxial structures 185 on opposite sides of the channel layers 124b and connected to the channel layers 124b, and the gate structure 220 wrapping around the channel layers 124b. Each of the epitaxial isolation structures 190 is between one of the first source/drain epitaxial structures 180 and one of the second source/drain epitaxial structures 185 to electrically isolate the first source/drain epitaxial structure 180 from the second source/drain epitaxial structure 185. Other features of the integrated circuit structures 100d are similar to or the same as those of the integrated circuit structures 100b shown in FIG. 20, and therefore, a description in this regard will not be provided hereinafter.

Figure 33:
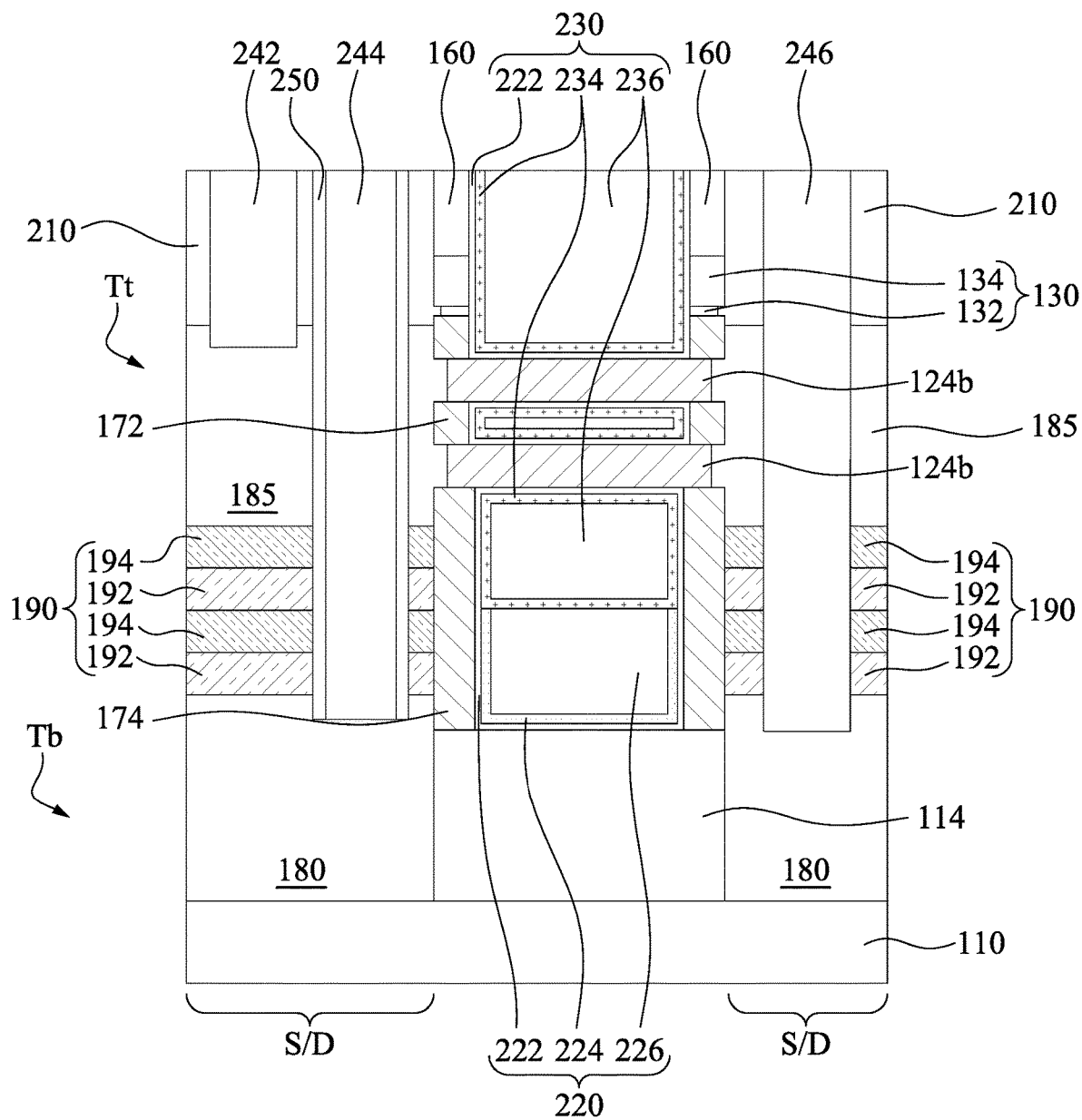
FIG. 33 is a cross-sectional view of an integrated circuit structure (or a semiconductor device) in accordance with some embodiments of the present disclosure.

FIG. 33 is a cross-sectional view of an integrated circuit structure (or a semiconductor device) 100e in accordance with some embodiments of the present disclosure. The difference between the integrated circuit structures 100e and 100d (see FIG. 32) pertains to the configuration of the gate structure. In FIG. 33, the integrated circuit structure 100e includes a bottom transistor Tb, a top transistor Tt, and epitaxial isolation structures 190. The top transistor Tt is over the bottom transistor Tb. The bottom transistor Tb includes the semiconductor fin 114, the first source/drain epitaxial structures 180 on opposite sides of the semiconductor fin 114 and connected to the semiconductor fin 114, and the gate structure 220 crossing over the semiconductor fin 114. The top transistor Tt includes the channel layers 124b, the second source/drain epitaxial structures 185 on opposite sides of the channel layers 124b and connected to the channel layers 124b, and a (metal) gate structure 230 wrapping around the channel layers 124b. The gate structure 230 includes the gate dielectric layer 222, the work function metal layer 234, and the fill metal 236. The work function metal layer 224 is P-metal, and the work function metal layer 234 is N-metal, or vise versa. Each of the epitaxial isolation structures 190 is between one of the first source/drain epitaxial structures 180 and one of the second source/drain epitaxial structures 185 to electrically isolate the first source/drain epitaxial structure 180 from the second source/drain epitaxial structure 185. Other features of the integrated circuit structures 100e are similar to or the same as those of the integrated circuit structures 100d shown in FIG. 32, and therefore, a description in this regard will not be provided hereinafter.

Figure 34:
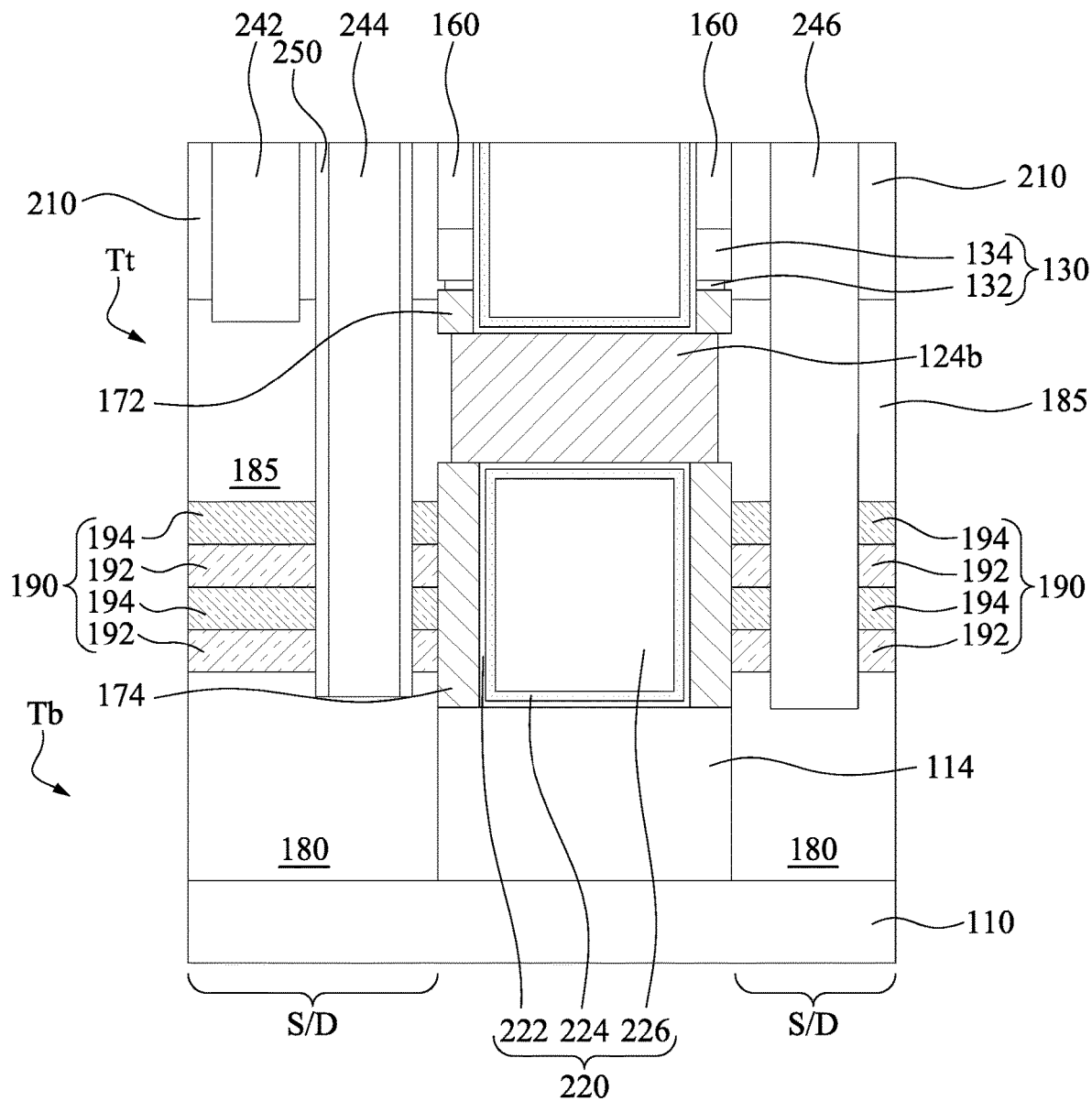
FIG. 34 is a cross-sectional view of an integrated circuit structure (or a semiconductor device) in accordance with some embodiments of the present disclosure.

FIG. 34 is a cross-sectional view of an integrated circuit structure (or a semiconductor device) 100f in accordance with some embodiments of the present disclosure. The difference between the integrated circuit structures 100f and 100d (see FIG. 32) pertains to the configuration of the channel layers. In FIG. 34, the integrated circuit structure 100e includes a bottom transistor Tb, a top transistor Tt, and epitaxial isolation structures 190. The top transistor Tt is over the bottom transistor Tb. The bottom transistor Tb includes the semiconductor fin 114, the first source/drain epitaxial structures 180 on opposite sides of the semiconductor fin 114 and connected to the semiconductor fin 114, and the gate structure 220 crossing over the semiconductor fin 114. The top transistor Tt includes the channel layer 124b, the second source/drain epitaxial structures 185 on opposite sides of the channel layer 124b and connected to the channel layer 124b, and the gate structure 220 wrapping around the channel layer 124b. Each of the epitaxial isolation structures 190 is between one of the first source/drain epitaxial structures 180 and one of the second source/drain epitaxial structures 185 to electrically isolate the first source/drain epitaxial structure 180 from the second source/drain epitaxial structure 185. Other features of the integrated circuit structures 100f are similar to or the same as those of the integrated circuit structures 100d shown in FIG. 32, and therefore, a description in this regard will not be provided hereinafter.

Figure 35:
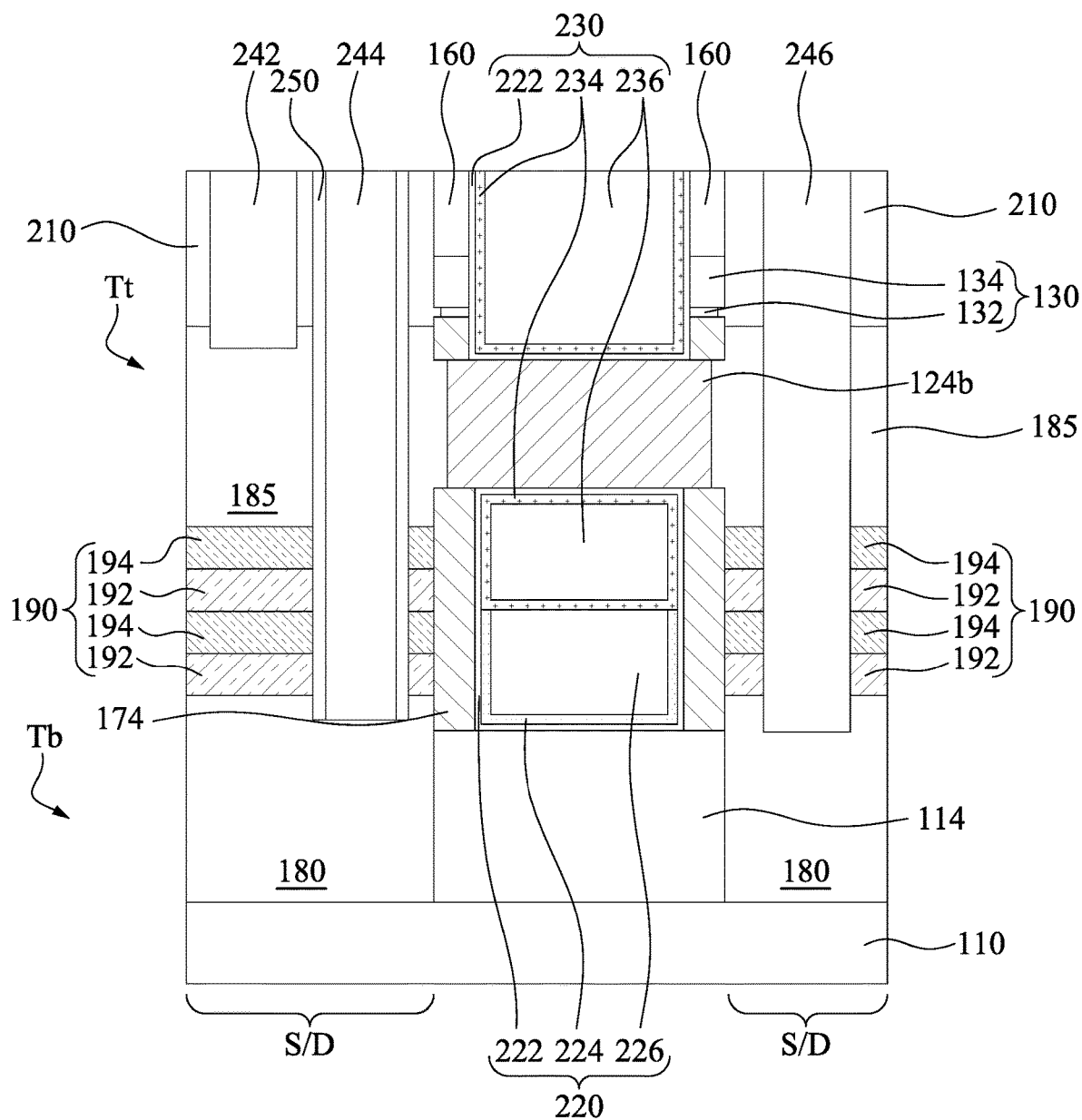
FIG. 35 is a cross-sectional view of an integrated circuit structure (or a semiconductor device) in accordance with some embodiments of the present disclosure.

FIG. 35 is a cross-sectional view of an integrated circuit structure (or a semiconductor device) 100g in accordance with some embodiments of the present disclosure. The difference between the integrated circuit structures 100g and 100f (see FIG. 34) pertains to the configuration of the gate structure. In FIG. 35, the integrated circuit structure 100e includes a bottom transistor Tb, a top transistor Tt, and epitaxial isolation structures 190. The top transistor Tt is over the bottom transistor Tb. The bottom transistor Tb includes the semiconductor fin 114, the first source/drain epitaxial structures 180 on opposite sides of the semiconductor fin 114 and connected to the semiconductor fin 114, and the gate structure 220 crossing over the semiconductor fin 114. The top transistor Tt includes the channel layer 124b, the second source/drain epitaxial structures 185 on opposite sides of the channel layer 124b and connected to the channel layer 124b, and the gate structure 230 wrapping around the channel layer 124b. The gate structure 230 includes the gate dielectric layer 222, the work function metal layer 234, and the fill metal 236. The work function metal layer 224 is P-metal, and the work function metal layer 234 is N-metal, or vise versa. Each of the epitaxial isolation structures 190 is between one of the first source/drain epitaxial structures 180 and one of the second source/drain epitaxial structures 185 to electrically isolate the first source/drain epitaxial structure 180 from the second source/drain epitaxial structure 185. Other features of the integrated circuit structures 100g are similar to or the same as those of the integrated circuit structures 100f shown in FIG. 34, and therefore, a description in this regard will not be provided hereinafter.

FIG. 36 shows current versus voltage (I-V) characteristics of p-n junction(s) according to some embodiments of the present disclosure. In FIG. 36, line 910 represents an IV curve of a p-n junction structure (made of Ge:B and Ge:P), and line 920 represents an IV curve of a p-n-p-n junction structure (made of Ge:B and Ge:P) (e.g., the epitaxial isolation structure 190 as shown in FIGS. 17A and 17B). As shown in line 920, the p-n-p-n junction structure with suppressed junction current at positive bias is observed. Also, the p-n-p-n junction structure can achieve reverse bias for isolation.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the epitaxial isolation structure can be selectively grown on the source/drain epitaxial structures, and naturally aligned of an isolation structure between the top and bottom source/drain epitaxial structures can be achieved. Another advantage is that the size of the CFET can be reduced due to the vertically stacking configuration of the transistors, and the top and bottom transistors have equal thermal budget.

According to some embodiments, a device includes a bottom transistor, a top transistor, and an epitaxial isolation structure. The bottom transistor includes a first channel layer, first source/drain epitaxial structures, and a first gate structure. The first source/drain epitaxial structures are on opposite sides of the first channel layer. The first gate structure is around the first channel layer. The top transistor is over the bottom transistor and includes a second channel layer, second source/drain epitaxial structures, and a second gate structure. The second source/drain epitaxial structures are on opposite sides of the second channel layer. The second gate structure is around the second channel layer. The epitaxial isolation structure is between and in contact with one of the first source/drain epitaxial structures and one of the second source/drain epitaxial structures, such that the one of the first source/drain epitaxial structures is electrically isolated from the one of the second source/drain epitaxial structures.

According to some embodiments, a device includes a bottom transistor, a top transistor, a first inner dielectric spacer, and a second inner dielectric spacer. The bottom transistor includes first source/drain epitaxial structures, a first channel layer, and a first gate structure. The first channel layer is connected to the first source/drain epitaxial structures. The first gate structure is across the first channel layer. The top transistor is over the bottom transistor and includes second source/drain epitaxial structures, a second channel layer, and a second gate structure. The second channel layer is connected to the second source/drain epitaxial structures. The second gate structure wraps around the second channel layer. The first inner dielectric spacer is between the first gate structure and one of the first source/drain epitaxial structures of the bottom transistor. The second inner dielectric spacer is between the second gate structure and one of the second source/drain epitaxial structures of the top transistor. The one of the second source/drain epitaxial structures is in contact with a bottom surface of the second inner dielectric spacer.

According to some embodiments, a method includes forming a fin structure over a substrate. The fin structure includes a first channel layer, a sacrificial layer over the first channel layer, and a second channel layer over the sacrificial layer. A dummy gate structure is formed across the fin structure. The fin structure is recessed by using the dummy gate structure as an etch mask. First source/drain epitaxial structures are epitaxially grown on opposite sides of the first channel layer after the fin structure is recessed. Epitaxial isolation structures are epitaxially grown on and in contact with the first source/drain epitaxial structures, respectively. Second source/drain epitaxial structures are epitaxially grown on opposite sides of the second channel layer. The second source/drain epitaxial structures are on and in contact with the epitaxial isolation structures, respectively. The dummy gate structure and the sacrificial layer are removed to form a gate trench between the first source/drain epitaxial structures and between the second source/drain epitaxial structures. A metal gate structure is formed in the gate trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a fin structure over a substrate, wherein the fin structure comprises a first channel layer, a sacrificial layer over the first channel layer, and a second channel layer over the sacrificial layer;
    forming a dummy gate structure across the fin structure;
    recessing the fin structure by using the dummy gate structure as an etch mask;
    after recessing the fin structure, epitaxially growing first source/drain epitaxial structures on opposite sides of the first channel layer;
    epitaxially growing epitaxial isolation structures on and in contact with the first source/drain epitaxial structures, respectively, wherein epitaxially growing the epitaxial isolation structures comprises:
        epitaxially growing a first epitaxial layer on and in contact with one of the first source/drain epitaxial structures;
        epitaxially growing a second epitaxial layer on and in contact with the first epitaxial layer;
        epitaxially growing a third epitaxial layer on and in contact with the second epitaxial layer; and
        epitaxially growing a fourth epitaxial layer on and in contact with the third epitaxial layer, wherein the first and third epitaxial layers are of a first conductivity type, and the second and fourth epitaxial layers are of a second conductivity type different from the first conductivity type;
    epitaxially growing second source/drain epitaxial structures on opposite sides of the second channel layer, wherein the second source/drain epitaxial structures are on and in contact with the epitaxial isolation structures, respectively;
    removing the dummy gate structure and the sacrificial layer to form a gate trench between the first source/drain epitaxial structures and between the second source/drain epitaxial structures; and
    forming a metal gate structure in the gate trench.

2. The method of claim 1, wherein each of the first, second, third, and fourth epitaxial layers has a dopant concentration in a range of about 1E15 to about 1E21 $cm^{-3}$.

3. The method of claim 1, wherein each of the first, second, third, and fourth epitaxial layers has a thickness in a range of about 5 nm to about 100 nm.

4. The method of claim 1, further comprising forming a dielectric blocking layer on a sidewall of the second channel layer prior to epitaxially growing the epitaxial isolation structures and after epitaxially growing the first source/drain epitaxial structures.

5. The method of claim 4, further comprising removing the dielectric blocking layer to expose the second channel layer prior to epitaxially growing the second source/drain epitaxial structures and after epitaxially growing the epitaxial isolation structures.

6. The method of claim 1, further comprising forming inner dielectric spacers on opposite sides of the sacrificial layer.

7. A method comprising:
    forming a fin structure over a substrate, wherein the fin structure comprises a first channel layer, a sacrificial layer over the first channel layer, and a second channel layer over the sacrificial layer;
    forming a first source/drain epitaxial structure over the substrate and connected to the first channel layer;
    epitaxially growing an epitaxial isolation structure to surround the first source/drain epitaxial structure, comprising:
        epitaxially growth a first semiconductive layer to surround the first source/drain epitaxial structure;
        epitaxially growth a second semiconductive layer to surround the first semiconductive layer, wherein the first semiconductive layer and the second semiconductive layer have opposite conductivity types;
    forming a second source/drain epitaxial structure over the epitaxial isolation structure and connected to the second channel layer; and
    replacing the sacrificial layer with a gate structure.

8. The method of claim 7, wherein epitaxially growth the epitaxial isolation structure comprises:
    epitaxially growth a third semiconductive layer to surround the second semiconductive layer; and
    epitaxially growth a fourth semiconductive layer to surround the third semiconductive layer.

9. The method of claim 8, wherein the second semiconductive layer and the third semiconductive layer have opposite conductivity types.

10. The method of claim 8, wherein the third semiconductive layer and the fourth semiconductive layer have opposite conductivity types.

11. The method of claim 8, wherein depletion regions are formed at interfaces between the first, second, third, and fourth semiconductive layers, and the depletion regions are spaced apart from each other.

12. The method of claim 7, wherein a vertical thickness of the sacrificial layer is greater than a vertical thickness of the epitaxial isolation structure.

13. The method of claim 7, further comprising forming a dielectric isolation structure over the substrate and surround the fin structure, wherein the epitaxial isolation structure is in contact with the dielectric isolation structure.

14. A method comprising:
    providing a workpiece comprising:
        a fin structure comprising a bottom channel layer over a substrate, a sacrificial layer over the bottom channel layer, and a top channel layer over the sacrificial layer; and
        a dummy gate across the fin structure;
    forming bottom source/drain epitaxial structures on opposite sides of the bottom channel layer;
    after forming the bottom source/drain epitaxial structures, forming dielectric blocking layers on opposite sides of the top channel layer;
    forming isolation structures over the bottom source/drain epitaxial structures, respectively;
    after forming the isolation structures, removing the dielectric blocking layers to expose the top channel layer, wherein after removing the dielectric blocking layers, a length of the bottom channel layer is greater than a length of the top channel layer;

forming top source/drain epitaxial structures on opposite sides of the top channel layer; and replacing the dummy gate and the sacrificial layer with a gate structure.

15. The method of claim 14, wherein forming the isolation structures comprises:

forming a first semiconductive layer over one of the bottom source/drain epitaxial structures;

forming a second semiconductive layer over the first semiconductive layer;

forming a third semiconductive layer over the second semiconductive layer; and forming a fourth semiconductive layer over the third semiconductive layer, wherein the first semiconductive layer and the second semiconductive layer have different materials.

16. The method of claim 14, further comprising:

etching the bottom source/drain epitaxial structures to form {100} top surfaces on the bottom source/drain epitaxial structures, respectively, prior to forming the isolation structures.

17. The method of claim 14, wherein each of the isolation structures has a {100} top surface.

18. The method of claim 14, further comprising:

forming an interlayer dielectric layer to cover the top source/drain epitaxial structures, wherein a bottom surface of the interlayer dielectric layer is lower than top surfaces of the isolation structures.

19. The method of claim 1, further comprising:

forming a contact extending through the first, second, third and fourth epitaxial layers to one of the first source/drain epitaxial structures.

20. The method of claim 14, wherein the dielectric blocking layers are formed by oxidizing the top channel layer.

* * * * *